(12) United States Patent
Saini et al.

(10) Patent No.: US 10,796,626 B2
(45) Date of Patent: Oct. 6, 2020

(54) EXPANDED REFRESH RATES FOR A DISPLAY SERVICE

(71) Applicant: Intel Corporation, Santa Clara, CA (US)

(72) Inventors: Ajay Saini, Hillsboro, OR (US); Yong-Joon Park, Portland, OR (US); Sravan Akepati, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 50 days.

(21) Appl. No.: 16/269,881

(22) Filed: Feb. 7, 2019

(65) Prior Publication Data

US 2019/0172388 A1 Jun. 6, 2019

(51) Int. Cl.
| | |
|---|---|
| G09G 3/22 | (2006.01) |
| G09G 5/393 | (2006.01) |
| G06F 3/041 | (2006.01) |
| H03K 19/17724 | (2020.01) |
| G06F 9/30 | (2018.01) |
| G09G 5/00 | (2006.01) |
| G09G 5/36 | (2006.01) |

(52) U.S. Cl.
CPC ............ *G09G 3/22* (2013.01); *G06F 3/0412* (2013.01); *G06F 9/30018* (2013.01); *G06F 9/30043* (2013.01); *G09G 5/005* (2013.01); *G09G 5/363* (2013.01); *G09G 5/393* (2013.01); *H03K 19/17724* (2013.01); *G09G 5/001* (2013.01); *G09G 2360/02* (2013.01); *G09G 2360/08* (2013.01); *G09G 2360/121* (2013.01); *G09G 2360/125* (2013.01)

(58) Field of Classification Search
CPC .......... G09G 3/22; G09G 5/005; G09G 5/363; G09G 5/393; G09G 5/001; G09G 2360/02; G09G 2360/08; G09G 2360/121; G09G 2360/125; G06F 3/0412; G06F 9/30018; G06F 9/30043; H03K 19/17724
See application file for complete search history.

(56) References Cited

U.S. PATENT DOCUMENTS

| | | | | |
|---|---|---|---|---|
| 8,194,065 | B1 * | 6/2012 | Walker | G09G 3/20 345/211 |
| 8,842,111 | B2 * | 9/2014 | Kambhatla | G09G 5/00 345/213 |
| 9,030,481 | B2 * | 5/2015 | Kwa | H04N 5/46 345/531 |
| 9,275,603 | B2 * | 3/2016 | Brabenac | G09G 5/005 |
| 9,858,899 | B2 * | 1/2018 | Wood | G06F 3/14 |

(Continued)

*Primary Examiner* — Peter D McLoone
(74) *Attorney, Agent, or Firm* — Trop, Pruner & Hu, P.C.

(57) ABSTRACT

In an embodiment, a computing device includes a processor and a machine-readable storage medium storing instructions. The instructions may be executable by the hardware processor to: receive a request for an expanded refresh rate that is not supported by a display device; in response to the received request, determine a native refresh rate that is supported by a display device; mask a plurality of interrupts generated by display hardware at the determined native refresh rate; and send, at the requested expanded refresh rate, a plurality of emulated interrupts to an operating system in place of the masked plurality of interrupts generated by the display hardware. Other embodiments are described and claimed.

20 Claims, 34 Drawing Sheets

(56) References Cited

U.S. PATENT DOCUMENTS

| | | | | |
|---|---|---|---|---|
| 9,984,664 B2* | 5/2018 | Glen | ............... | G09G 5/395 |
| 10,049,642 B2* | 8/2018 | Ansari | ............... | G06F 3/14 |
| 10,223,130 B2* | 3/2019 | Turnock | ............... | G06F 13/10 |
| 10,325,573 B2* | 6/2019 | Wood | ............... | G06F 3/14 |
| 10,506,138 B2* | 12/2019 | Brabenac | ............... | G09G 5/005 |
| 10,510,317 B2* | 12/2019 | Spence | ............... | H04N 7/01 |
| 2012/0068993 A1* | 3/2012 | Kambhatla | ............... | G09G 5/18 |
| | | | | 345/213 |
| 2013/0141642 A1* | 6/2013 | Wu | ............... | G09G 5/12 |
| | | | | 348/441 |
| 2013/0278590 A1* | 10/2013 | Brabenac | ............... | H04N 5/04 |
| | | | | 345/214 |
| 2014/0002739 A1* | 1/2014 | Kwa | ............... | G09G 3/2096 |
| | | | | 348/536 |
| 2014/0368519 A1* | 12/2014 | Wood | ............... | G09G 5/12 |
| | | | | 345/545 |
| 2015/0279334 A1* | 10/2015 | Kwa | ............... | G09G 3/2096 |
| | | | | 345/213 |
| 2016/0077842 A1* | 3/2016 | Turnock | ............... | G06F 9/4406 |
| | | | | 710/10 |
| 2016/0275916 A1* | 9/2016 | Glen | ............... | G09G 5/395 |
| 2016/0352978 A1* | 12/2016 | Brabenac | ............... | H04N 5/04 |
| 2017/0352322 A1* | 12/2017 | Spence | ............... | G09G 3/3618 |
| 2018/0144724 A1* | 5/2018 | Wood | ............... | G06F 3/14 |
| 2018/0174551 A1* | 6/2018 | Ansari | ............... | G09G 5/12 |
| 2018/0286004 A1* | 10/2018 | Babu | ............... | G06T 1/20 |
| 2019/0355331 A1* | 11/2019 | Wood | ............... | G09G 5/12 |
| 2019/0370928 A1* | 12/2019 | Szober | ............... | G06F 9/3877 |

\* cited by examiner

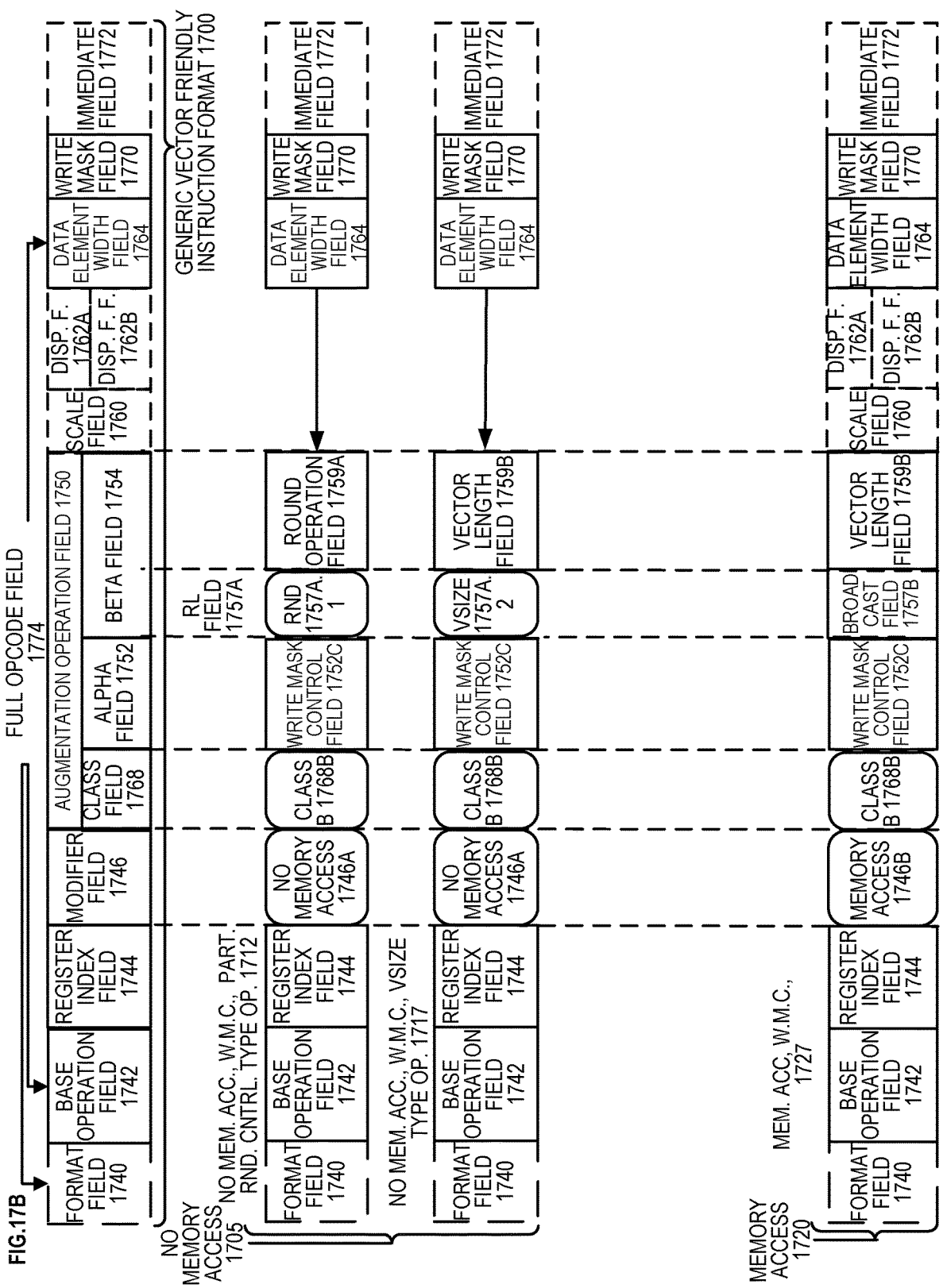

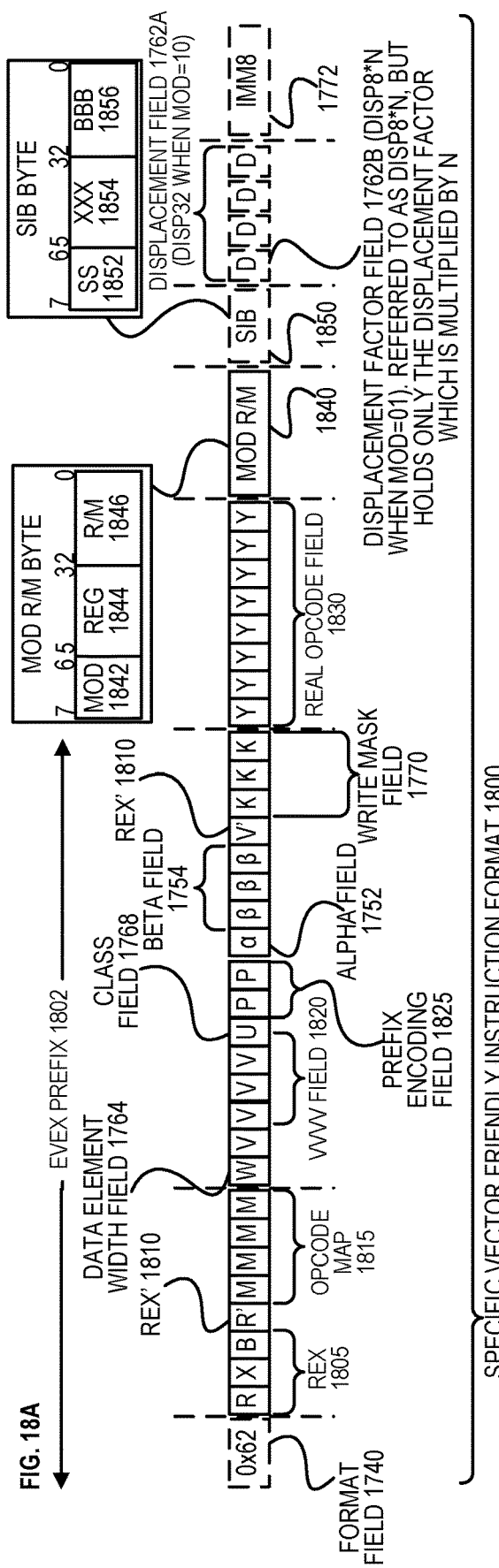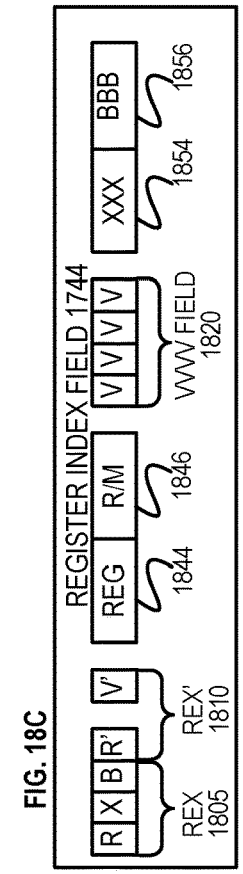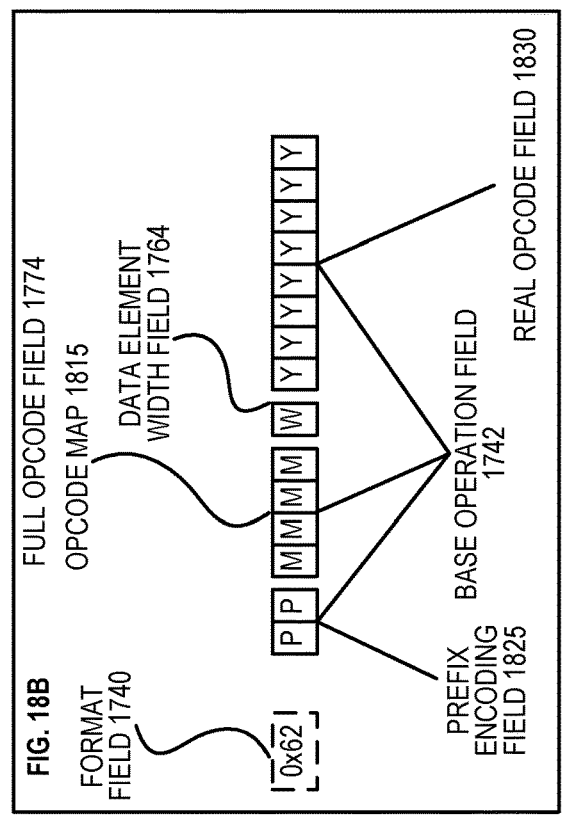

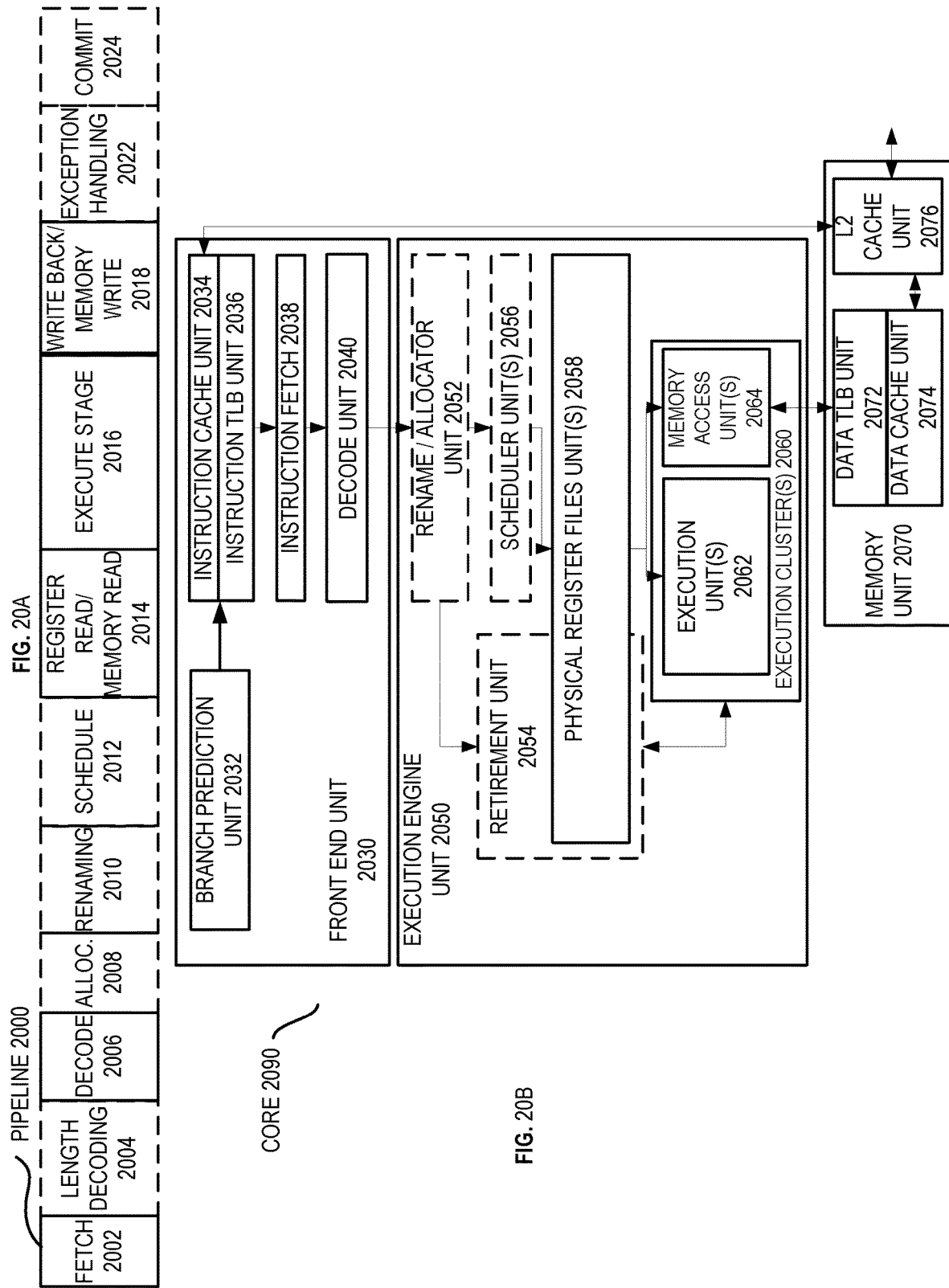

EXPANDED REFRESH RATES FOR A DISPLAY SERVICE

FIELD OF INVENTION

Embodiments relate to display devices, and more particularly to controlling refresh rates in display devices.

BACKGROUND

Advances in digital technologies have permitted the display of video images on screens associated with electronic devices. For example, a smartphone can present video images on an included screen. In another example, a desktop computer can present video images on an attached display device (e.g., a monitor). In some examples, a computing device may include a display engine to process video images displayed by the computing device.

BRIEF DESCRIPTION OF THE DRAWINGS

FIGS. 17A-17B are block diagrams illustrating a generic vector friendly instruction format and instruction templates thereof according to embodiments of the invention.

FIGS. 18A-D are block diagrams illustrating an exemplary specific vector friendly instruction format according to embodiments of the invention.

FIG. 20A is a block diagram illustrating both an exemplary in-order pipeline and an exemplary register renaming, out-of-order issue/execution pipeline according to embodiments of the invention.

FIG. 20B is a block diagram illustrating both an exemplary embodiment of an in-order architecture core and an exemplary register renaming, out-of-order issue/execution architecture core to be included in a processor according to embodiments of the invention.

DETAILED DESCRIPTION

Figure 1:
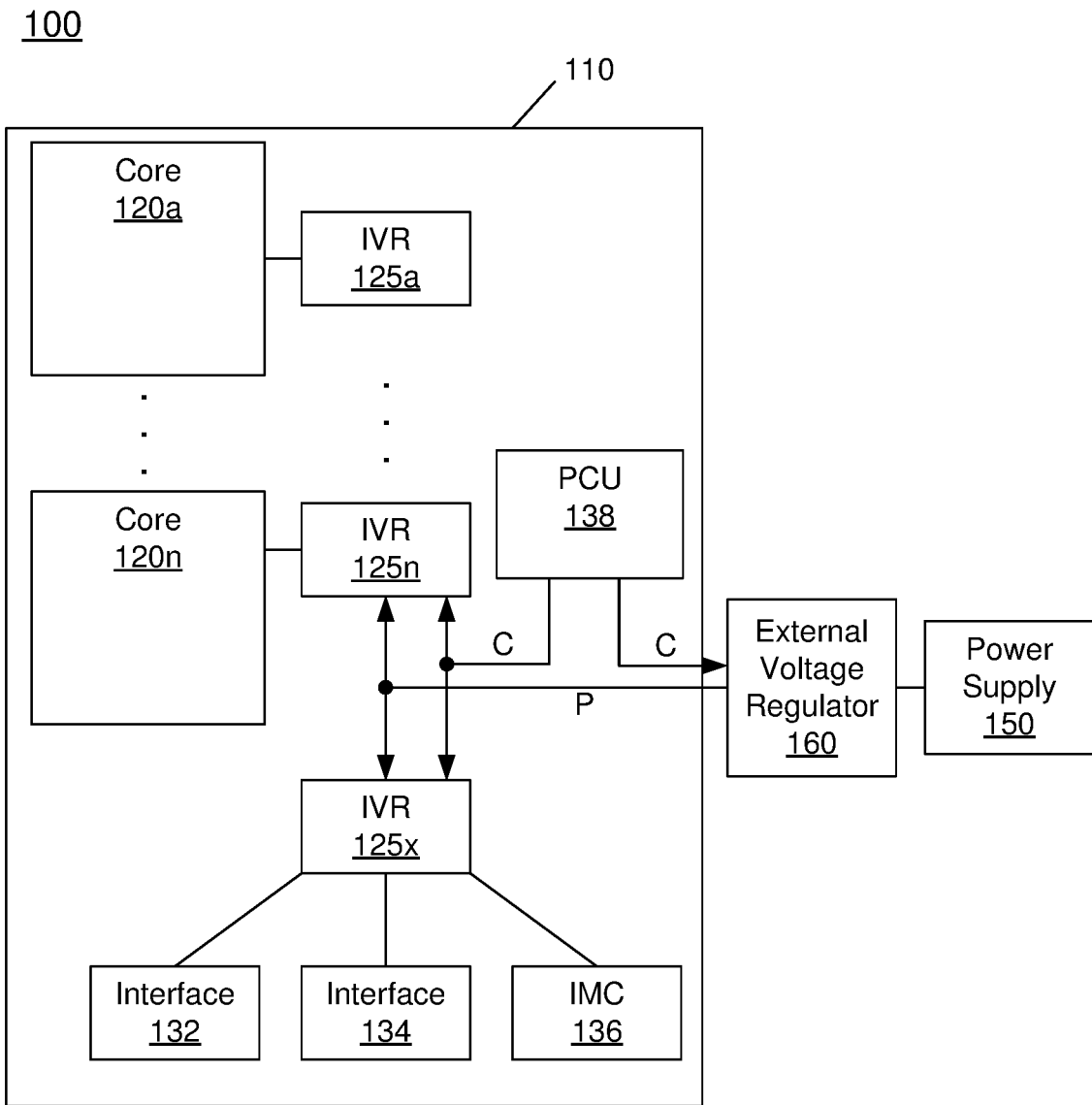
FIG. 1 is a block diagram of a portion of a system in accordance with an embodiment of the present invention.

A computer or other electronic device may use a display device to present video images. The display device may be a monitor capable of presenting video content at one or more refresh rates. A refresh rate is the frequency that separate image frames can be displayed. For example, a display device may support a refresh rate of 48 Hz, and can thus display 48 frames per second. A refresh rate that is directly supported by a display device are referred to herein as a "native refresh rate." In some situations, a video file may be associated with a refresh rate that is not natively supported by the display device. For example, a video file may be specified to be displayed at 24 frames per second (fps), and thus a display device should use a 24 Hz refresh rate (corresponding to 24 fps). However, the display device may only support a minimum refresh rate of 48 Hz. As such, additional processing may be required to display the video at 48 Hz. For example, the operating system may perform additional operations to present each frame of the video file twice, thereby providing frame information in alignment with the 48 Hz refresh rate. Such additional operations may include processing Vertical Blank Interval (VBI) interrupts that mark the end of a frame. However, such additional operations may cause an increase in the power required to display the video file, thereby reducing battery life, increasing heat load, and/or increasing costs associated with power usage.

In accordance with some embodiments, a set of native refresh rates of a display device may be determined (e.g., by a graphics driver of the computing device). Further, a set of refresh rates that can be emulated but are not natively supported by the display device (referred to herein as "expanded refresh rates") may be determined, and may be reported to software (e.g., an operating system) as available for the display device. When playing video content associated with an expanded refresh rate, the video content may be provided to the display device at a native refresh rate. Further, interrupts generated by display hardware may be masked, and emulated interrupts may be generated at the requested expanded refresh rate. In this manner, the operating system may not need to perform operations to present additional frames to match the native refresh rate. Accordingly, some embodiments may provide reduced power consumption of the computing device. Various details of some embodiments are described further below with reference to FIGS. 26-31. Further, exemplary systems and architectures are described below with reference to FIGS. 1-25.

Exemplary Systems and Architectures

Although the following embodiments are described with reference to particular implementations, embodiments are not limited in this regard. In particular, it is contemplated that similar techniques and teachings of embodiments described herein may be applied to other types of circuits, semiconductor devices, processors, systems, etc. For example, the disclosed embodiments may be implemented in any type of computer system, including server computers (e.g., tower, rack, blade, micro-server and so forth), communications systems, storage systems, desktop computers of any configuration, laptop, notebook, and tablet computers (including 2:1 tablets, phablets and so forth).

In addition, disclosed embodiments can also be used in other devices, such as handheld devices, systems on chip (SoCs), and embedded applications. Some examples of handheld devices include cellular phones such as smartphones, Internet protocol devices, digital cameras, personal digital assistants (PDAs), and handheld PCs. Embedded applications may typically include a microcontroller, a digital signal processor (DSP), network computers (NetPC), set-top boxes, network hubs, wide area network (WAN) switches, wearable devices, or any other system that can perform the functions and operations taught below. Further, embodiments may be implemented in mobile terminals having standard voice functionality such as mobile phones, smartphones and phablets, and/or in non-mobile terminals without a standard wireless voice function communication capability, such as many wearables, tablets, notebooks, desktops, micro-servers, servers and so forth.

Referring now to FIG. 1, shown is a block diagram of a portion of a system in accordance with an embodiment of the present invention. As shown in FIG. 1, system 100 may include various components, including a processor 110 which as shown is a multicore processor. Processor 110 may be coupled to a power supply 150 via an external voltage regulator 160, which may perform a first voltage conversion to provide a primary regulated voltage Vreg to processor 110.

As seen, processor 110 may be a single die processor including multiple cores 120*a*-120*n*. In addition, each core may be associated with an integrated voltage regulator (IVR) 125*a*-125*n* which receives the primary regulated voltage and generates an operating voltage to be provided to one or more agents of the processor associated with the IVR. Accordingly, an IVR implementation may be provided to allow for fine-grained control of voltage and thus power and performance of each individual core. As such, each core can operate at an independent voltage and frequency, enabling great flexibility and affording wide opportunities for balancing power consumption with performance. In some embodiments, the use of multiple IVRs enables the grouping of components into separate power planes, such that power is regulated and supplied by the IVR to only those components in the group. During power management, a given power plane of one IVR may be powered down or off when the processor is placed into a certain low power state, while another power plane of another IVR remains active, or fully powered. Similarly, cores 120 may include or be associated with independent clock generation circuitry such as one or more phase lock loops (PLLs) to control operating frequency of each core 120 independently.

Still referring to FIG. 1, additional components may be present within the processor including an input/output interface (IF) 132, another interface 134, and an integrated memory controller (IMC) 136. As seen, each of these components may be powered by another integrated voltage regulator $125_x$. In one embodiment, interface 132 may enable operation for an Intel® Quick Path Interconnect (QPI) interconnect, which provides for point-to-point (PtP) links in a cache coherent protocol that includes multiple layers including a physical layer, a link layer and a protocol layer. In turn, interface 134 may communicate via a Peripheral Component Interconnect Express (PCIe™) protocol.

Also shown is a power control unit (PCU) 138, which may include circuitry including hardware, software and/or firmware to perform power management operations with regard to processor 110. As seen, PCU 138 provides control information to external voltage regulator 160 via a digital interface 162 to cause the voltage regulator to generate the appropriate regulated voltage. PCU 138 also provides control information to IVRs 125 via another digital interface 163 to control the operating voltage generated (or to cause a corresponding IVR to be disabled in a low power mode). In various embodiments, PCU 138 may include a variety of power management logic units to perform hardware-based power management. Such power management may be wholly processor controlled (e.g., by various processor hardware, and which may be triggered by workload and/or power, thermal or other processor constraints) and/or the power management may be performed responsive to external sources (such as a platform or power management source or system software).

In FIG. 1, PCU 138 is illustrated as being present as a separate logic of the processor. In other cases, PCU 138 may execute on a given one or more of cores 120. In some cases, PCU 138 may be implemented as a microcontroller (dedicated or general-purpose) or other control logic configured to execute its own dedicated power management code, sometimes referred to as P-code. In yet other embodiments, power management operations to be performed by PCU 138 may be implemented externally to a processor, such as by way of a separate power management integrated circuit (PMIC) or another component external to the processor. In yet other embodiments, power management operations to be performed by PCU 138 may be implemented within BIOS or other system software.

Embodiments may be particularly suitable for a multicore processor in which each of multiple cores can operate at an independent voltage and frequency point. As used herein the term "domain" is used to mean a collection of hardware and/or logic that operates at the same voltage and frequency point. In addition, a multicore processor can further include other non-core processing engines such as fixed function units, graphics engines, and so forth. Such processor can include independent domains other than the cores, such as one or more domains associated with a graphics engine (referred to herein as a graphics domain) and one or more domains associated with non-core circuitry, referred to herein as a system agent. Although many implementations of a multi-domain processor can be formed on a single semiconductor die, other implementations can be realized by a multi-chip package in which different domains can be present on different semiconductor die of a single package.

While not shown for ease of illustration, understand that additional components may be present within processor 110 such as non-core logic, and other components such as internal memories, e.g., one or more levels of a cache memory hierarchy and so forth. Furthermore, while shown in the implementation of FIG. 1 with an integrated voltage regulator, embodiments are not so limited. For example, other regulated voltages may be provided to on-chip resources from external voltage regulator 160 or one or more additional external sources of regulated voltages.

Note that the power management techniques described herein may be independent of and complementary to an operating system (OS)-based power management (OSPM) mechanism. According to one example OSPM technique, a processor can operate at various performance states or levels, so-called P-states, namely from P0 to PN. In general, the P1 performance state may correspond to the highest guaranteed performance state that can be requested by an OS. In addition to this P1 state, the OS can further request a higher performance state, namely a P0 state. This P0 state may thus be an opportunistic, overclocking, or turbo mode state in which, when power and/or thermal budget is available, processor hardware can configure the processor or at least portions thereof to operate at a higher than guaranteed frequency. In many implementations, a processor can include multiple so-called bin frequencies above the P1 guaranteed maximum frequency, exceeding to a maximum peak frequency of the particular processor, as fused or otherwise written into the processor during manufacture. In addition, according to one OSPM mechanism, a processor can operate at various power states or levels. With regard to power states, an OSPM mechanism may specify different power consumption states, generally referred to as C-states, C0, C1 to Cn states. When a core is active, it runs at a C0 state, and when the core is idle it may be placed in a core low power state, also called a core non-zero C-state (e.g., C1-C6 states), with each C-state being at a lower power consumption level (such that C6 is a deeper low power state than C1, and so forth).

Understand that many different types of power management techniques may be used individually or in combination in different embodiments. As representative examples, a power controller may control the processor to be power managed by some form of dynamic voltage frequency scaling (DVFS) in which an operating voltage and/or operating frequency of one or more cores or other processor logic may be dynamically controlled to reduce power consumption in certain situations. In an example, DVFS may be performed using Enhanced Intel SpeedStep™ technology available from Intel Corporation, Santa Clara, Calif., to provide optimal performance at a lowest power consumption level. In another example, DVFS may be performed using Intel TurboBoost™ technology to enable one or more cores or other compute engines to operate at a higher than guaranteed operating frequency based on conditions (e.g., workload and availability).

Another power management technique that may be used in certain examples is dynamic swapping of workloads between different compute engines. For example, the processor may include asymmetric cores or other processing engines that operate at different power consumption levels, such that in a power constrained situation, one or more workloads can be dynamically switched to execute on a lower power core or other compute engine. Another exemplary power management technique is hardware duty cycling (HDC), which may cause cores and/or other compute engines to be periodically enabled and disabled according to a duty cycle, such that one or more cores may be made inactive during an inactive period of the duty cycle and made active during an active period of the duty cycle.

Power management techniques also may be used when constraints exist in an operating environment. For example, when a power and/or thermal constraint is encountered, power may be reduced by reducing operating frequency and/or voltage. Other power management techniques include throttling instruction execution rate or limiting scheduling of instructions. Still further, it is possible for instructions of a given instruction set architecture to include express or implicit direction as to power management operations. Although described with these particular examples, understand that many other power management techniques may be used in particular embodiments.

Figure 2:
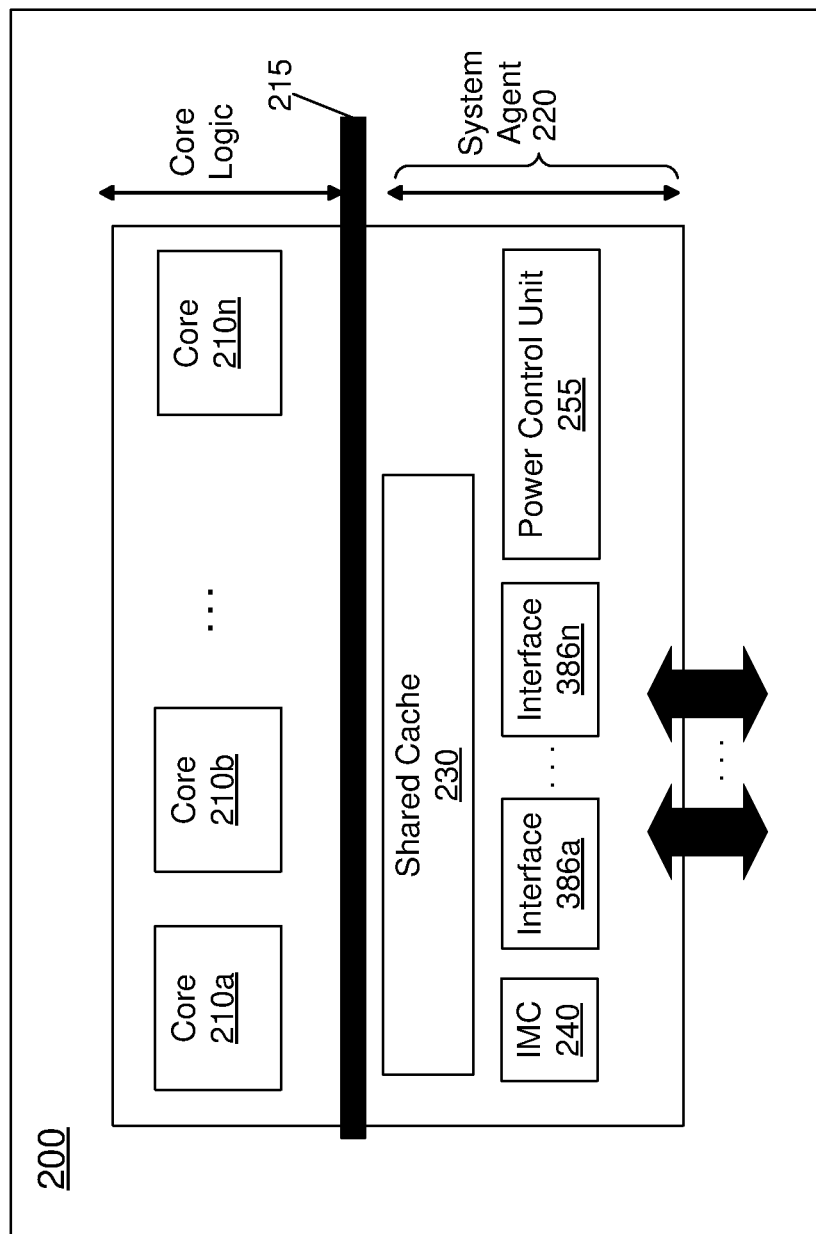
FIG. 2 is a block diagram of a processor in accordance with an embodiment of the present invention.

Embodiments can be implemented in processors for various markets including server processors, desktop processors, mobile processors and so forth. Referring now to FIG. 2, shown is a block diagram of a processor in accordance with an embodiment of the present invention. As shown in FIG. 2, processor 200 may be a multicore processor including a plurality of cores 210$_a$-210$_n$. In one embodiment, each such core may be of an independent power domain and can be configured to enter and exit active states and/or maximum performance states based on workload. One or more cores 210 may be heterogeneous to the other cores, e.g., having different micro-architectures, instruction set architectures, pipeline depths, power and performance capabilities. The various cores may be coupled via an interconnect 215 to a system agent 220 that includes various components. As seen, the system agent 220 may include a shared cache 230 which may be a last level cache. In addition, the system agent may include an integrated memory controller 240 to communicate with a system memory (not shown in FIG. 2), e.g., via a memory bus. The system agent 220 also includes various interfaces 250 and a power control unit 255, which may include logic to perform the power management techniques described herein.

In addition, by interfaces 250a-250n, connection can be made to various off-chip components such as peripheral devices, mass storage and so forth. While shown with this particular implementation in the embodiment of FIG. 2, the scope of the present invention is not limited in this regard.

Figure 3:
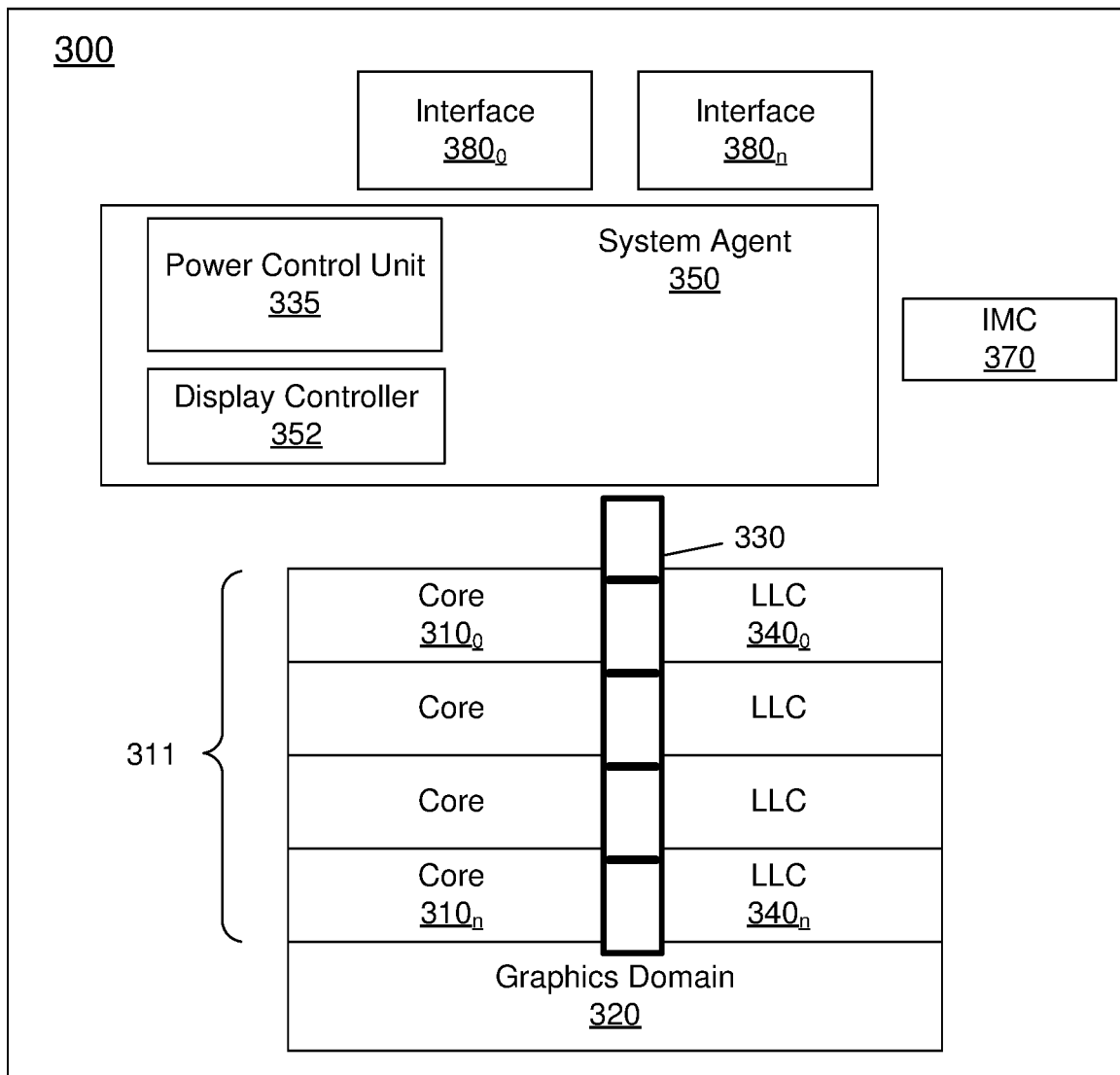
FIG. 3 is a block diagram of a multi-domain processor in accordance with another embodiment of the present invention.

Referring now to FIG. 3, shown is a block diagram of a multi-domain processor in accordance with another embodiment of the present invention. As shown in the embodiment of FIG. 3, processor 300 includes multiple domains. Specifically, a core domain 310 can include a plurality of cores 310a-310n, a graphics domain 320 can include one or more graphics engines, and a system agent domain 350 may further be present. In some embodiments, system agent domain 350 may execute at an independent frequency than the core domain and may remain powered on at all times to handle power control events and power management such that domains 310 and 320 can be controlled to dynamically enter into and exit high power and low power states. Each of domains 310 and 320 may operate at different voltage and/or power. Note that while only shown with three domains, understand the scope of the present invention is not limited in this regard and additional domains can be present in other embodiments. For example, multiple core domains may be present each including at least one core.

In general, each of the cores 310a-310n may further include low level caches in addition to various execution units and additional processing elements. In turn, the various cores may be coupled to each other and to a shared cache memory formed of a plurality of units of a last level cache (LLC) 340a-340n. In various embodiments, LLC 340 may be shared amongst the cores and the graphics engine, as well as various media processing circuitry. As seen, a ring interconnect 330 thus couples the cores together, and provides interconnection between the cores, graphics domain 320 and system agent domain 350. In one embodiment, interconnect 330 can be part of the core domain. However, in other embodiments the ring interconnect can be of its own domain.

As further seen, system agent domain 350 may include display controller 352 which may provide control of and an interface to an associated display. As further seen, system agent domain 350 may include a power control unit 355 which can include logic to perform the power management techniques described herein.

As further seen in FIG. 3, processor 300 can further include an integrated memory controller (IMC) 370 that can provide for an interface to a system memory, such as a dynamic random access memory (DRAM). Multiple interfaces 380a-380n may be present to enable interconnection between the processor and other circuitry. For example, in one embodiment at least one direct media interface (DMI) interface may be provided as well as one or more PCIe™ interfaces. Still further, to provide for communications between other agents such as additional processors or other circuitry, one or more QPI interfaces may also be provided. Although shown at this high level in the embodiment of FIG. 3, understand the scope of the present invention is not limited in this regard.

Figure 4:
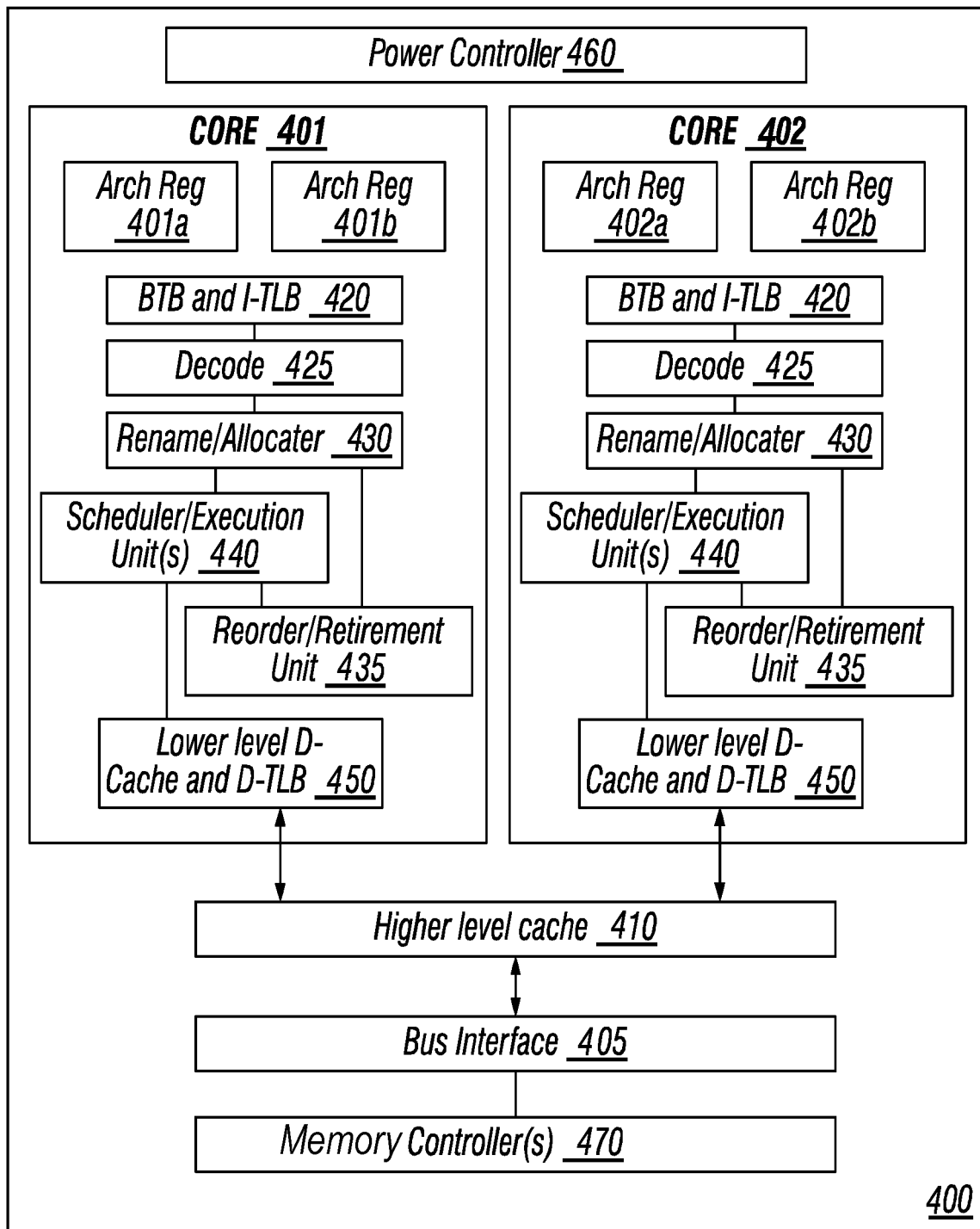
FIG. 4 is an embodiment of a processor including multiple cores.

Referring to FIG. 4, an embodiment of a processor including multiple cores is illustrated. Processor 400 includes any processor or processing device, such as a microprocessor, an embedded processor, a digital signal processor (DSP), a network processor, a handheld processor, an application processor, a co-processor, a system on a chip (SoC), or other device to execute code. Processor 400, in one embodiment, includes at least two cores—cores 401 and 402, which may include asymmetric cores or symmetric cores (the illustrated embodiment). However, processor 400 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 400, as illustrated in FIG. 4, includes two cores, cores 401 and 402. Here, cores 401 and 402 are considered symmetric cores, i.e., cores with the same configurations, functional units, and/or logic. In another embodiment, core 401 includes an out-of-order processor core, while core 402 includes an in-order processor core. However, cores 401 and 402 may be individually selected from any type of core, such as a native core, a software managed core, a core adapted to execute a native instruction set architecture (ISA), a core adapted to execute a translated ISA, a co-designed core, or other known core. Yet to further the discussion, the functional units illustrated in core 401 are described in further detail below, as the units in core 402 operate in a similar manner.

As depicted, core 401 includes two architectural state registers 401a and 401b, which may be associated with two hardware threads (also referred to as hardware thread slots). Therefore, software entities, such as an operating system, in one embodiment potentially view processor 400 as four separate processors, i.e., four logical processors or processing elements capable of executing four software threads concurrently. As alluded to above, a first thread is associated with architecture state registers 401a, a second thread is associated with architecture state registers 401b, a third thread may be associated with architecture state registers 402a, and a fourth thread may be associated with architecture state registers 402b. Here, the architecture state registers (401a, 401b, 402a, and 402b) may be associated with processing elements, thread slots, or thread units, as described above. As illustrated, architecture state registers 401a are replicated in architecture state registers 401b, so individual architecture states/contexts are capable of being stored for logical processor 401a and logical processor 401b. In core 401, other smaller resources, such as instruction pointers and renaming logic in allocator and renamer block 430 may also be replicated for threads 401a and 401b. Some resources, such as re-order buffers in reorder/retirement unit 435, branch target buffer and instruction translation lookaside buffer (BTB and I-TLB) 420, load/store buffers, and queues may be shared through partitioning. Other resources, such as general purpose internal registers, page-table base register(s), low-level data-cache and data-TLB 450, execution unit(s) 440, and portions of reorder/retirement unit 435 are potentially fully shared.

Processor 400 often includes other resources, which may be fully shared, shared through partitioning, or dedicated by/to processing elements. In FIG. 4, an embodiment of a purely exemplary processor with illustrative logical units/resources of a processor is illustrated. Note that a processor may include, or omit, any of these functional units, as well as include any other known functional units, logic, or firmware not depicted. As illustrated, core 401 includes a simplified, representative out-of-order (OOO) processor core. But an in-order processor may be utilized in different embodiments.

Core 401 further includes decode module 425 coupled to a fetch unit to decode fetched elements. Fetch logic, in one embodiment, includes individual sequencers associated with thread slots 401*a*, 401*b*, respectively. Usually core 401 is associated with a first ISA, which defines/specifies instructions executable on processor 400. Often machine code instructions that are part of the first ISA include a portion of the instruction (referred to as an opcode), which references/specifies an instruction or operation to be performed. Decode module 425 includes circuitry that recognizes these instructions from their opcodes and passes the decoded instructions on in the pipeline for processing as defined by the first ISA. For example, decoder module 425, in one embodiment, includes logic designed or adapted to recognize specific instructions, such as transactional instructions. As a result of the recognition by the decoder module 425, the architecture or core 401 takes specific, predefined actions to perform tasks associated with the appropriate instruction. It is important to note that any of the tasks, blocks, operations, and methods described herein may be performed in response to a single or multiple instructions; some of which may be new or old instructions.

In one example, allocator and renamer block 430 includes an allocator to reserve resources, such as register files to store instruction processing results. However, threads 401*a* and 401*b* are potentially capable of out-of-order execution, where allocator and renamer block 430 also reserves other resources, such as reorder buffers to track instruction results. The renamer block 430 may also include a register renamer to rename program/instruction reference registers to other registers internal to processor 400. Reorder/retirement unit 435 includes components, such as the reorder buffers mentioned above, load buffers, and store buffers, to support out-of-order execution and later in-order retirement of instructions executed out-of-order.

Scheduler and execution unit(s) block 440, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation lookaside buffer (D-TLB) 450 are coupled to execution unit(s) 440. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 401 and 402 share access to higher-level or further-out cache 410, which is to cache recently fetched elements. Note that higher-level or further-out refers to cache levels increasing or getting further away from the execution unit(s). In one embodiment, higher-level cache 410 is a last-level data cache—last cache in the memory hierarchy on processor 400—such as a second or third level data cache. However, higher level cache 410 is not so limited, as it may be associated with or includes an instruction cache. A trace cache—a type of instruction cache—instead may be coupled after decoder module 425 to store recently decoded traces.

In the depicted configuration, processor 400 also includes bus interface 405 and a power control unit 460, which may perform power management in accordance with an embodiment of the present invention. In this scenario, bus interface 405 is to communicate with devices external to processor 400, such as system memory and other components.

A memory controller 470 may interface with other devices such as one or many memories. In an example, bus interface 405 includes a ring interconnect with a memory controller for interfacing with a memory and a graphics controller for interfacing with a graphics processor. In an SoC environment, even more devices, such as a network interface, coprocessors, memory, graphics processor, and any other known computer devices/interface may be integrated on a single die or integrated circuit to provide small form factor with high functionality and low power consumption.

Figure 5:
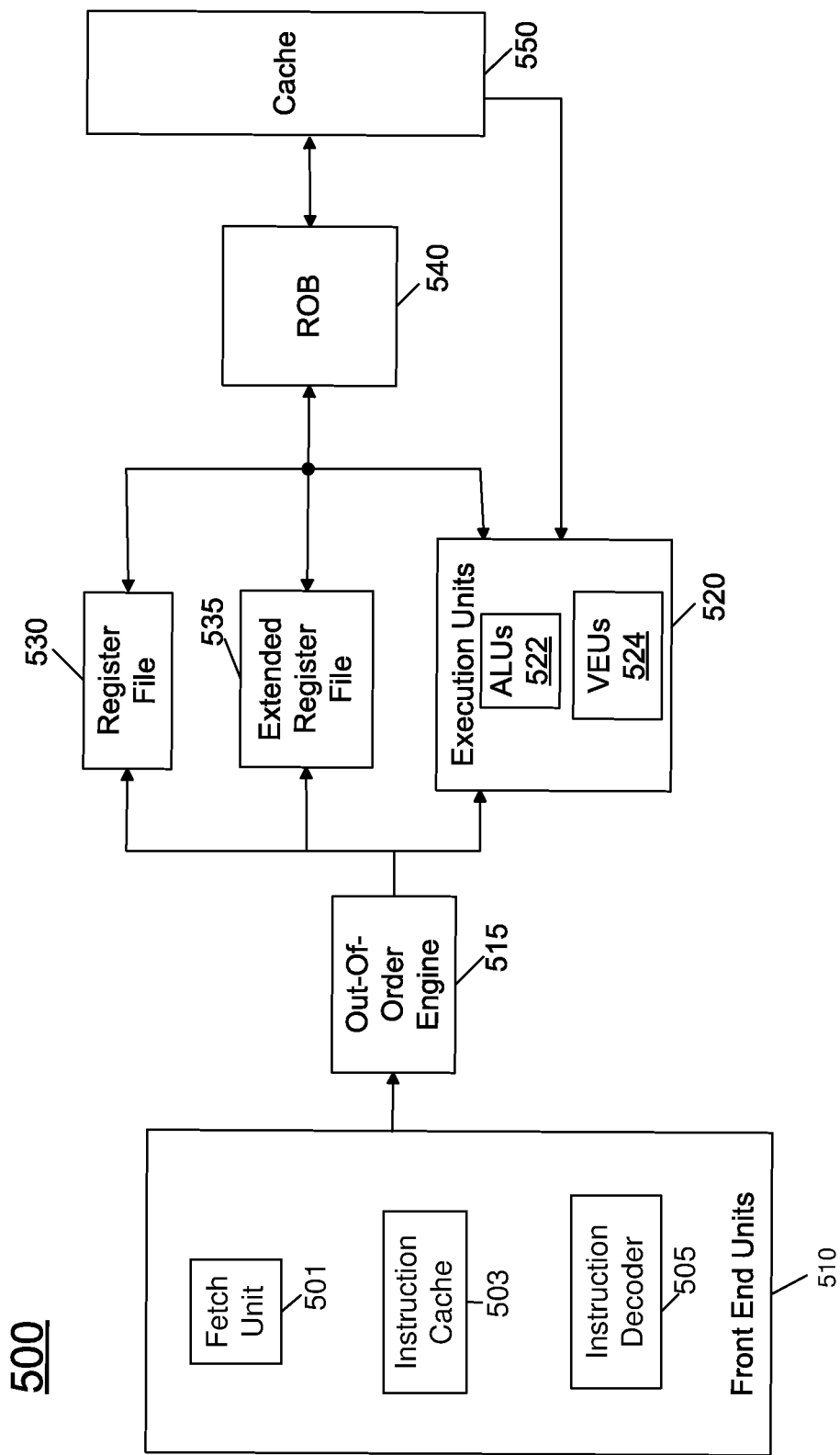
FIG. 5 is a block diagram of a micro-architecture of a processor core in accordance with one embodiment of the present invention.

Referring now to FIG. 5, shown is a block diagram of a micro-architecture of a processor core in accordance with one embodiment of the present invention. As shown in FIG. 5, processor core 500 may be a multi-stage pipelined out-of-order processor. Core 500 may operate at various voltages based on a received operating voltage, which may be received from an integrated voltage regulator or external voltage regulator.

As seen in FIG. 5, core 500 includes front end units 510, which may be used to fetch instructions to be executed and prepare them for use later in the processor pipeline. For example, front end units 510 may include a fetch unit 501, an instruction cache 503, and an instruction decoder 505. In some implementations, front end units 510 may further include a trace cache, along with microcode storage as well as a micro-operation storage. Fetch unit 501 may fetch macro-instructions, e.g., from memory or instruction cache 503, and feed them to instruction decoder 505 to decode them into primitives, i.e., micro-operations for execution by the processor.

Coupled between front end units 510 and execution units 520 is an out-of-order (OOO) engine 515 that may be used to receive the micro-instructions and prepare them for execution. More specifically OOO engine 515 may include various buffers to re-order micro-instruction flow and allocate various resources needed for execution, as well as to provide renaming of logical registers onto storage locations within various register files such as register file 530 and extended register file 535. Register file 530 may include separate register files for integer and floating point operations. For purposes of configuration, control, and additional operations, a set of machine specific registers (MSRs) 538 may also be present and accessible to various logic within core 500 (and external to the core).

Various resources may be present in execution units 520, including, for example, various integer, floating point, and single instruction multiple data (SIMD) logic units, among other specialized hardware. For example, such execution units may include one or more arithmetic logic units (ALUs) 522 and one or more vector execution units 524, among other such execution units.

Results from the execution units may be provided to retirement logic, namely a reorder buffer (ROB) 540. More specifically, ROB 540 may include various arrays and logic to receive information associated with instructions that are executed. This information is then examined by ROB 540 to determine whether the instructions can be validly retired and result data committed to the architectural state of the processor, or whether one or more exceptions occurred that prevent a proper retirement of the instructions. Of course, ROB 540 may handle other operations associated with retirement.

As shown in FIG. 5, ROB 540 is coupled to a cache 550 which, in one embodiment may be a low level cache (e.g., an L1 cache) although the scope of the present invention is not limited in this regard. Also, execution units 520 can be directly coupled to cache 550. From cache 550, data communication may occur with higher level caches, system memory and so forth. While shown with this high level in the embodiment of FIG. 5, understand the scope of the present invention is not limited in this regard. For example, while the implementation of FIG. 5 is with regard to an out-of-order machine such as of an Intel® x86 instruction set architecture (ISA), the scope of the present invention is not limited in this regard. That is, other embodiments may be implemented in an in-order processor, a reduced instruction set computing (RISC) processor such as an ARM-based processor, or a processor of another type of ISA that can emulate instructions and operations of a different ISA via an emulation engine and associated logic circuitry.

Figure 6:
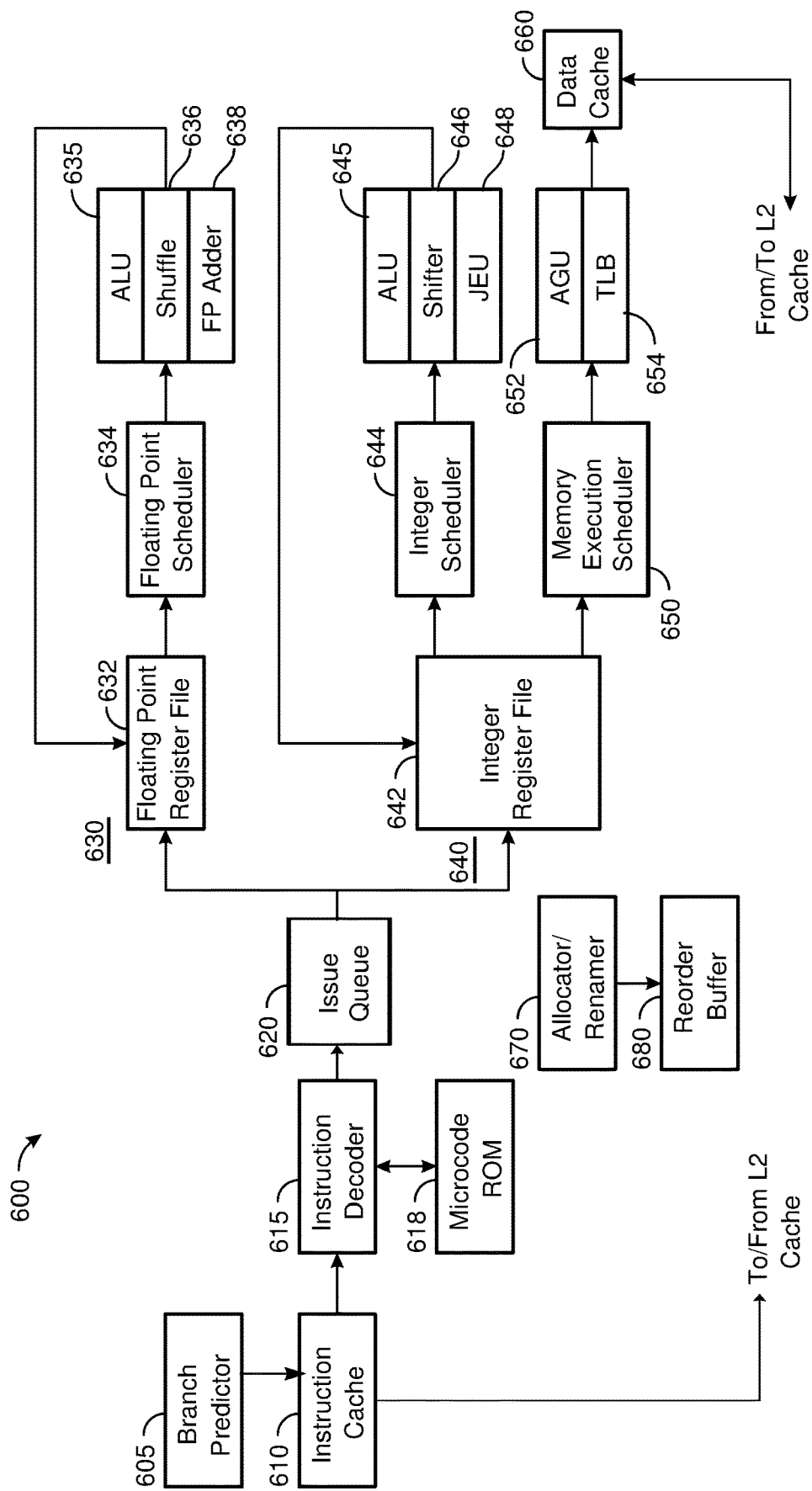
FIG. 6 is a block diagram of a micro-architecture of a processor core in accordance with another embodiment.

Referring now to FIG. 6, shown is a block diagram of a micro-architecture of a processor core in accordance with another embodiment. In the embodiment of FIG. 6, core 600 may be a low power core of a different micro-architecture, such as an Intel® Atom™-based processor having a relatively limited pipeline depth designed to reduce power consumption. As seen, core 600 includes an instruction cache 610 coupled to provide instructions to an instruction decoder 615. A branch predictor 605 may be coupled to instruction cache 610. Note that instruction cache 610 may further be coupled to another level of a cache memory, such as an L2 cache (not shown for ease of illustration in FIG. 6). In turn, instruction decoder 615 provides decoded instructions to an issue queue (IQ) 620 for storage and delivery to a given execution pipeline. A microcode ROM 618 is coupled to instruction decoder 615.

A floating point pipeline 630 includes a floating point (FP) register file 632 which may include a plurality of architectural registers of a given bit width such as 128, 256 or 512 bits. Pipeline 630 includes a floating point scheduler 634 to schedule instructions for execution on one of multiple execution units of the pipeline. In the embodiment shown, such execution units include an arithmetic logic unit (ALU) 635, a shuffle unit 636, and a floating point (FP) adder 638. In turn, results generated in these execution units may be provided back to buffers and/or registers of register file 632. Of course understand while shown with these few example execution units, additional or different floating point execution units may be present in another embodiment.

An integer pipeline 640 also may be provided. In the embodiment shown, pipeline 640 includes an integer (INT) register file 642 which may include a plurality of architectural registers of a given bit width such as 128 or 256 bits. Pipeline 640 includes an integer execution (IE) scheduler 644 to schedule instructions for execution on one of multiple execution units of the pipeline. In the embodiment shown, such execution units include an ALU 645, a shifter unit 646, and a jump execution unit (JEU) 648. In turn, results generated in these execution units may be provided back to buffers and/or registers of register file 642. Of course, understand while shown with these few example execution units, additional or different integer execution units may be present in another embodiment.

A memory execution (ME) scheduler 650 may schedule memory operations for execution in an address generation unit (AGU) 652, which is also coupled to a TLB 654. As seen, these structures may couple to a data cache 660, which may be a L0 and/or L1 data cache that in turn couples to additional levels of a cache memory hierarchy, including an L2 cache memory.

To provide support for out-of-order execution, an allocator/renamer 670 may be provided, in addition to a reorder buffer 680, which is configured to reorder instructions executed out of order for retirement in order. Although shown with this particular pipeline architecture in the illustration of FIG. 6, understand that many variations and alternatives are possible.

Note that in a processor having asymmetric cores, such as in accordance with the micro-architectures of FIGS. 5 and 6, workloads may be dynamically swapped between the cores for power management reasons, as these cores, although having different pipeline designs and depths, may be of the same or related ISA. Such dynamic core swapping may be performed in a manner transparent to a user application (and possibly kernel also).

Figure 7:
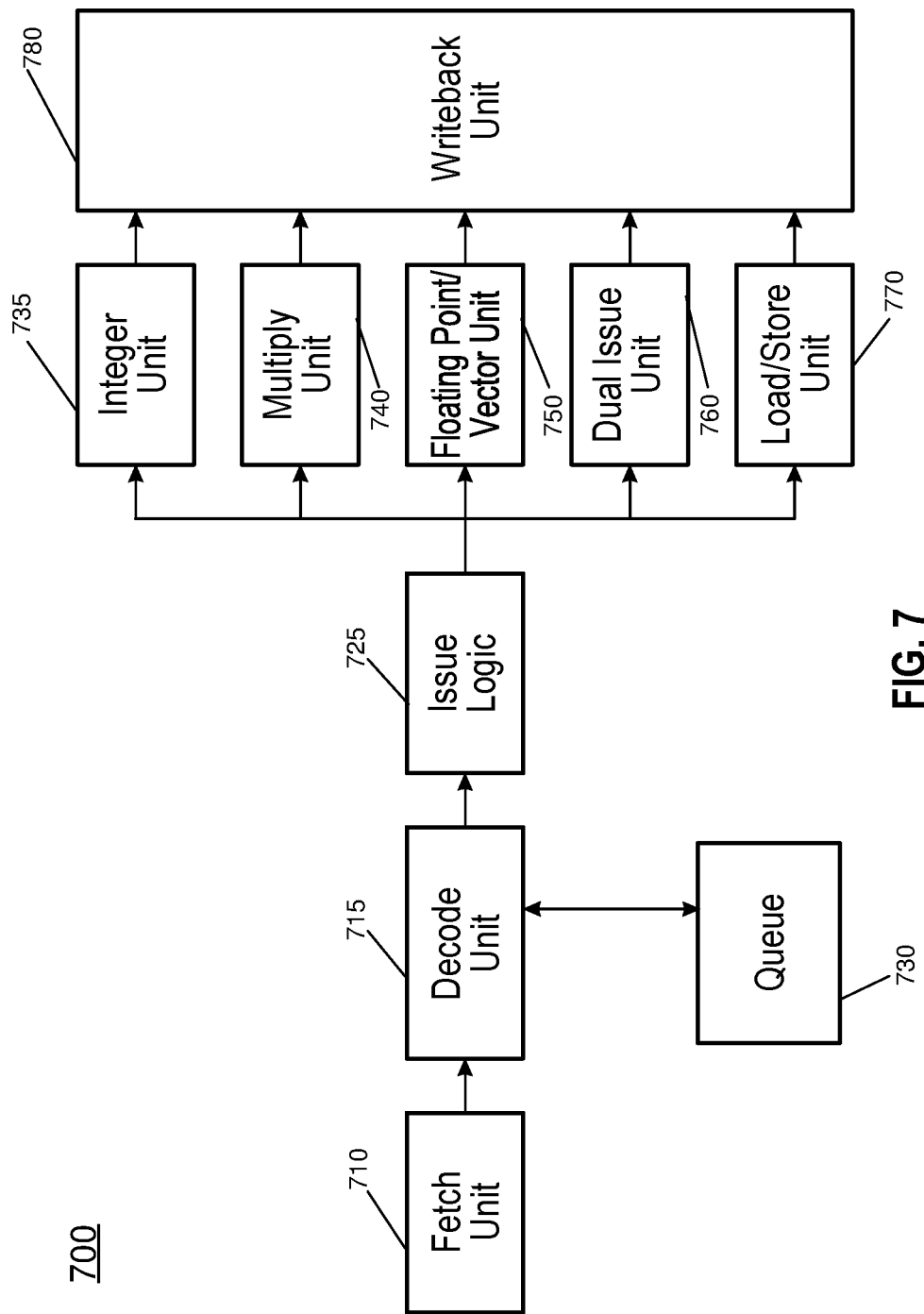
FIG. 7 is a block diagram of a micro-architecture of a processor core in accordance with yet another embodiment.

Referring to FIG. 7, shown is a block diagram of a micro-architecture of a processor core in accordance with yet another embodiment. As illustrated in FIG. 7, a core 700 may include a multi-staged in-order pipeline to execute at very low power consumption levels. As one such example, core 700 may have a micro-architecture in accordance with an ARM Cortex A53 design available from ARM Holdings, LTD., Sunnyvale, Calif. In an implementation, an 8-stage pipeline may be provided that is configured to execute both 32-bit and 64-bit code. Core 700 includes a fetch unit 710 that is configured to fetch instructions and provide them to a decode unit 715, which may decode the instructions, e.g., macro-instructions of a given ISA such as an ARMv8 ISA. Note further that a queue 730 may couple to decode unit 715 to store decoded instructions. Decoded instructions are provided to an issue logic 725, where the decoded instructions may be issued to a given one of multiple execution units.

With further reference to FIG. 7, issue logic 725 may issue instructions to one of multiple execution units. In the embodiment shown, these execution units include an integer unit 735, a multiply unit 740, a floating point/vector unit 750, a dual issue unit 760, and a load/store unit 770. The results of these different execution units may be provided to a writeback (WB) unit 780. Understand that while a single writeback unit is shown for ease of illustration, in some implementations separate writeback units may be associated with each of the execution units. Furthermore, understand that while each of the units and logic shown in FIG. 7 is represented at a high level, a particular implementation may include more or different structures. A processor designed using one or more cores having a pipeline as in FIG. 7 may be implemented in many different end products, extending from mobile devices to server systems.

Figure 8:
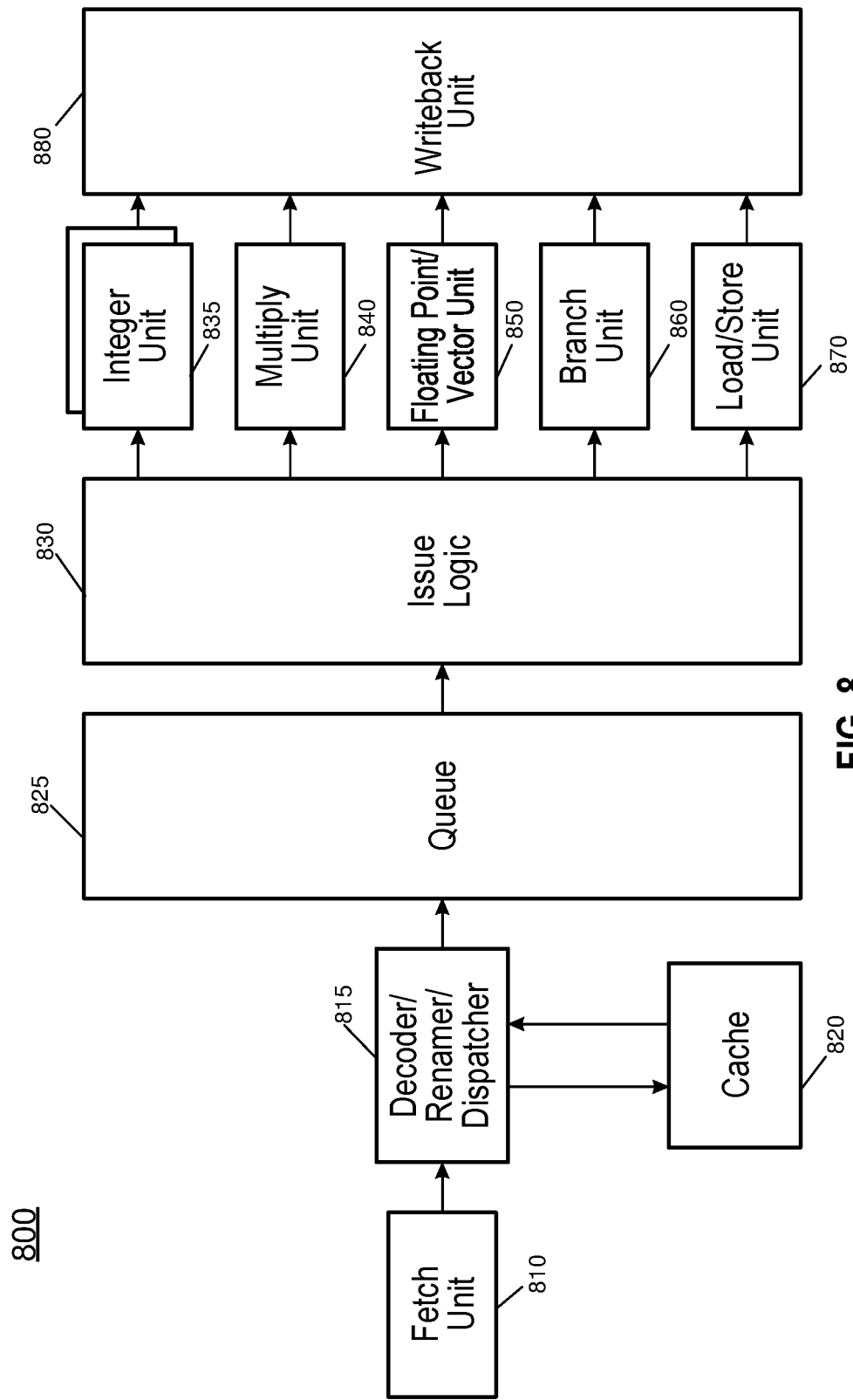
FIG. 8 is a block diagram of a micro-architecture of a processor core in accordance with a still further embodiment.

Referring to FIG. 8, shown is a block diagram of a micro-architecture of a processor core in accordance with a still further embodiment. As illustrated in FIG. 8, a core 800 may include a multi-stage multi-issue out-of-order pipeline to execute at very high performance levels (which may occur at higher power consumption levels than core 700 of FIG. 7). As one such example, processor 800 may have a microarchitecture in accordance with an ARM Cortex A57 design. In an implementation, a 15 (or greater)-stage pipeline may be provided that is configured to execute both 32-bit and 64-bit code. In addition, the pipeline may provide for 3 (or greater)-wide and 3 (or greater)-issue operation. Core 800 includes a fetch unit 810 that is configured to fetch instructions and provide them to a decoder/renamer/dispatcher unit 815 coupled to a cache 820. Unit 815 may decode the instructions, e.g., macro-instructions of an ARMv8 instruction set architecture, rename register references within the instructions, and dispatch the instructions (eventually) to a selected execution unit. Decoded instructions may be stored in a queue 825. Note that while a single queue structure is shown for ease of illustration in FIG. 8, understand that separate queues may be provided for each of the multiple different types of execution units.

Also shown in FIG. 8 is an issue logic 830 from which decoded instructions stored in queue 825 may be issued to a selected execution unit. Issue logic 830 also may be implemented in a particular embodiment with a separate issue logic for each of the multiple different types of execution units to which issue logic 830 couples.

Decoded instructions may be issued to a given one of multiple execution units. In the embodiment shown, these execution units include one or more integer units 835, a multiply unit 840, a floating point/vector unit 850, a branch unit 860, and a load/store unit 870. In an embodiment, floating point/vector unit 850 may be configured to handle SIMD or vector data of 128 or 256 bits. Still further, floating point/vector execution unit 850 may perform IEEE-754 double precision floating-point operations. The results of these different execution units may be provided to a writeback unit 880. Note that in some implementations separate writeback units may be associated with each of the execution units. Furthermore, understand that while each of the units and logic shown in FIG. 8 is represented at a high level, a particular implementation may include more or different structures.

Note that in a processor having asymmetric cores, such as in accordance with the micro-architectures of FIGS. 7 and 8, workloads may be dynamically swapped for power management reasons, as these cores, although having different pipeline designs and depths, may be of the same or related ISA. Such dynamic core swapping may be performed in a manner transparent to a user application (and possibly kernel also).

Figure 9:
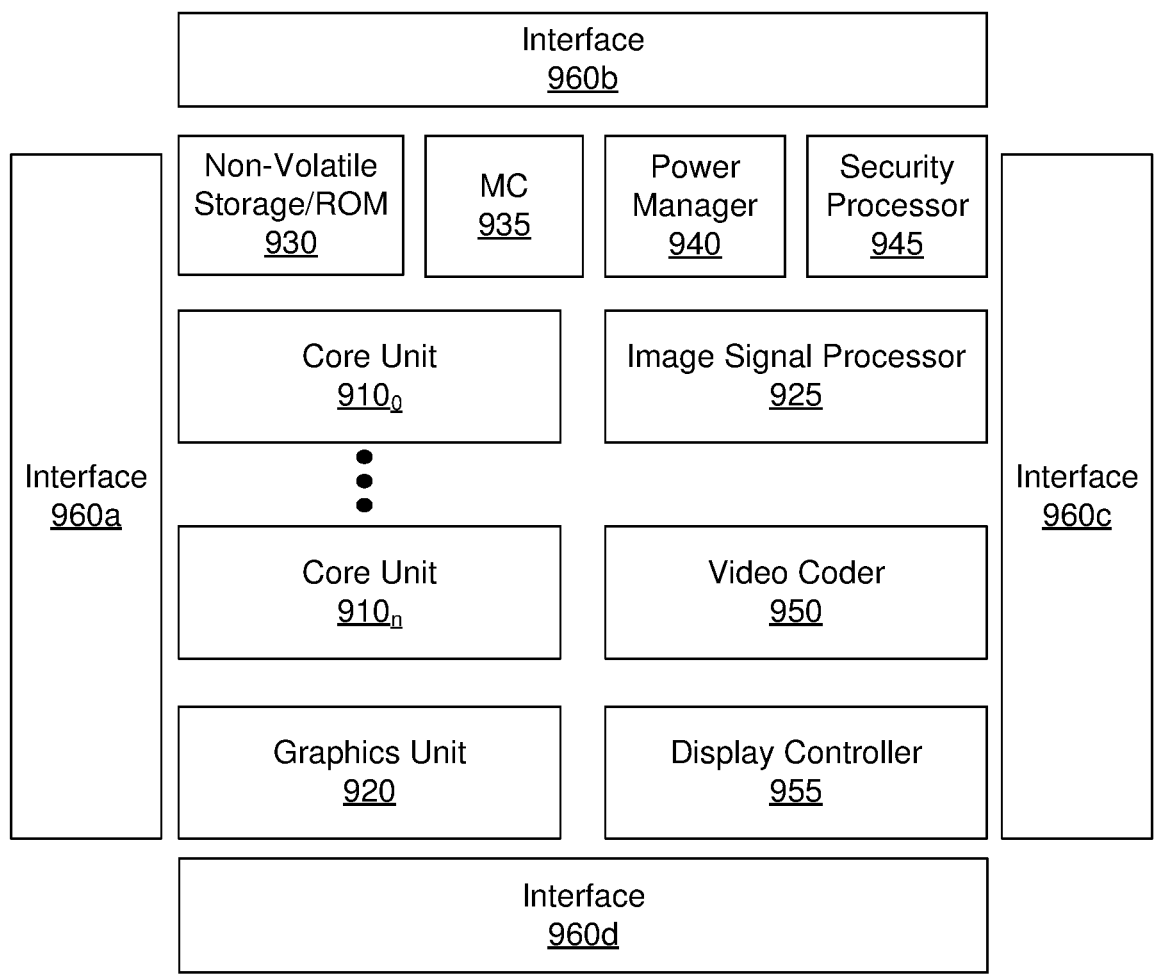
FIG. 9 is a block diagram of a processor in accordance with another embodiment of the present invention.

A processor designed using one or more cores having pipelines as in any one or more of FIGS. 5-8 may be implemented in many different end products, extending from mobile devices to server systems. Referring now to FIG. 9, shown is a block diagram of a processor in accordance with another embodiment of the present invention. In the embodiment of FIG. 9, processor 900 may be a SoC including multiple domains, each of which may be controlled to operate at an independent operating voltage and operating frequency. As a specific illustrative example, processor 900 may be an Intel® Architecture Core™-based processor such as an i3, i5, i7 or another such processor available from Intel Corporation. However, other low power processors such as available from Advanced Micro Devices, Inc. (AMD) of Sunnyvale, Calif., an ARM-based design from ARM Holdings, Ltd. or licensee thereof or a MIPS-based design from MIPS Technologies, Inc. of Sunnyvale, Calif., or their licensees or adopters may instead be present in other embodiments such as an Apple A7 processor, a Qualcomm Snapdragon processor, or Texas Instruments OMAP processor. Such SoC may be used in a low power system such as a smartphone, tablet computer, phablet computer, Ultrabook™ computer or other portable computing device, which may incorporate a heterogeneous system architecture having a heterogeneous system architecture-based processor design.

In the high level view shown in FIG. 9, processor 900 includes a plurality of core units 910*a*-910*n*. Each core unit may include one or more processor cores, one or more cache memories and other circuitry. Each core unit 910 may support one or more instruction sets (e.g., an x86 instruction set (with some extensions that have been added with newer versions); a MIPS instruction set; an ARM instruction set (with optional additional extensions such as NEON)) or other instruction set or combinations thereof. Note that some of the core units may be heterogeneous resources (e.g., of a different design). In addition, each such core may be coupled to a cache memory (not shown) which in an embodiment may be a shared level two (L2) cache memory. A non-volatile storage 930 may be used to store various program and other data. For example, this storage may be used to store at least portions of microcode, boot information such as a BIOS, other system software or so forth.

Each core unit 910 may also include an interface such as a bus interface unit to enable interconnection to additional circuitry of the processor. In an embodiment, each core unit 910 couples to a coherent fabric that may act as a primary cache coherent on-die interconnect that in turn couples to a memory controller 935. In turn, memory controller 935 controls communications with a memory such as a DRAM (not shown for ease of illustration in FIG. 9).

In addition to core units, additional processing engines are present within the processor, including at least one graphics unit 920 which may include one or more graphics processing units (GPUs) to perform graphics processing as well as to possibly execute general purpose operations on the graphics processor (so-called GPGPU operation). In addition, at least one image signal processor 925 may be present. Signal processor 925 may be configured to process incoming image data received from one or more capture devices, either internal to the SoC or off-chip.

Other accelerators also may be present. In the illustration of FIG. 9, a video coder 950 may perform coding operations including encoding and decoding for video information, e.g., providing hardware acceleration support for high definition video content. A display controller 955 further may be provided to accelerate display operations including providing support for internal and external displays of a system. In addition, a security processor 945 may be present to perform security operations such as secure boot operations, various cryptography operations and so forth.

Each of the units may have its power consumption controlled via a power manager 940, which may include control logic to perform the various power management techniques described herein.

In some embodiments, processor 900 may further include a non-coherent fabric coupled to the coherent fabric to which various peripheral devices may couple. One or more interfaces 960*a*-960*d* enable communication with one or more off-chip devices. Such communications may be via a variety of communication protocols such as PCIe™, GPIO, USB, I²C, UART, MIPI, SDIO, DDR, SPI, HDMI, among other types of communication protocols. Although shown at this high level in the embodiment of FIG. 9, understand the scope of the present invention is not limited in this regard.

Figure 10:
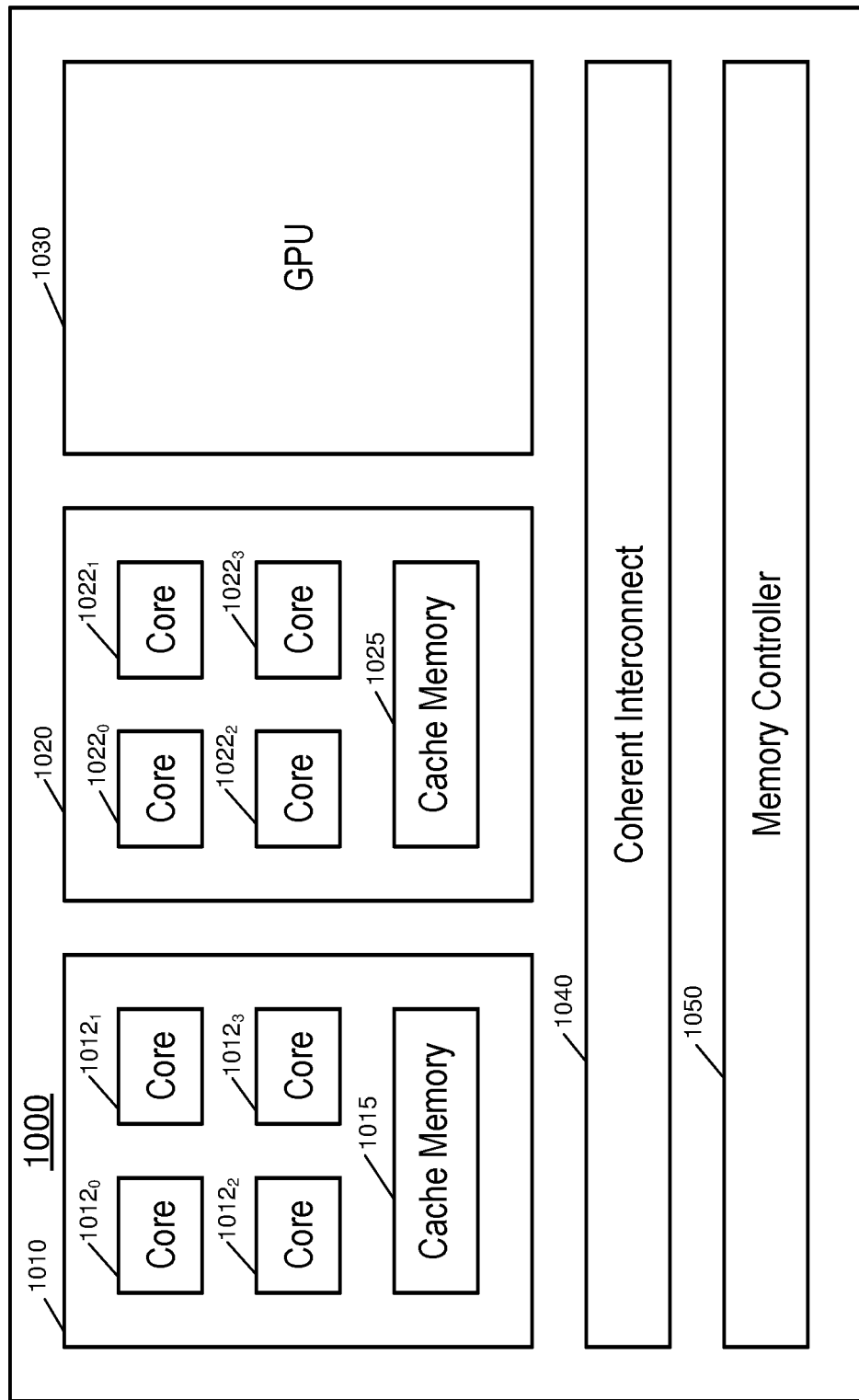
FIG. 10 is a block diagram of a representative SoC in accordance with an embodiment of the present invention.

Referring now to FIG. 10, shown is a block diagram of a representative SoC. In the embodiment shown, SoC 1000 may be a multi-core SoC configured for low power operation to be optimized for incorporation into a smartphone or other low power device such as a tablet computer or other portable computing device. As an example, SoC 1000 may be implemented using asymmetric or different types of cores, such as combinations of higher power and/or low power cores, e.g., out-of-order cores and in-order cores. In different embodiments, these cores may be based on an Intel® Architecture™ core design or an ARM architecture design. In yet other embodiments, a mix of Intel and ARM cores may be implemented in a given SoC.

As seen in FIG. 10, SoC 1000 includes a first core domain 1010 having a plurality of first cores 1012a-1012d. In an example, these cores may be low power cores such as in-order cores. In one embodiment, these first cores may be implemented as ARM Cortex A53 cores. In turn, these cores couple to a cache memory 1015 of core domain 1010. In addition, SoC 1000 includes a second core domain 1020. In the illustration of FIG. 10, second core domain 1020 has a plurality of second cores 1022a-1022d. In an example, these cores may be higher power-consuming cores than first cores 1012. In an embodiment, the second cores may be out-of-order cores, which may be implemented as ARM Cortex A57 cores. In turn, these cores couple to a cache memory 1025 of core domain 1020. Note that while the example shown in FIG. 10 includes 4 cores in each domain, understand that more or fewer cores may be present in a given domain in other examples.

With further reference to FIG. 10, a graphics domain 1030 also is provided, which may include one or more graphics processing units (GPUs) configured to independently execute graphics workloads, e.g., provided by one or more cores of core domains 1010 and 1020. As an example, GPU domain 1030 may be used to provide display support for a variety of screen sizes, in addition to providing graphics and display rendering operations.

As seen, the various domains couple to a coherent interconnect 1040, which in an embodiment may be a cache coherent interconnect fabric that in turn couples to an integrated memory controller 1050. Coherent interconnect 1040 may include a shared cache memory, such as an L3 cache, in some examples. In an embodiment, memory controller 1050 may be a direct memory controller to provide for multiple channels of communication with an off-chip memory, such as multiple channels of a DRAM (not shown for ease of illustration in FIG. 10).

In different examples, the number of the core domains may vary. For example, for a low power SoC suitable for incorporation into a mobile computing device, a limited number of core domains such as shown in FIG. 10 may be present. Still further, in such low power SoCs, core domain 1020 including higher power cores may have fewer numbers of such cores. For example, in one implementation two cores 1022 may be provided to enable operation at reduced power consumption levels. In addition, the different core domains may also be coupled to an interrupt controller to enable dynamic swapping of workloads between the different domains.

In yet other embodiments, a greater number of core domains, as well as additional optional IP logic may be present, in that an SoC can be scaled to higher performance (and power) levels for incorporation into other computing devices, such as desktops, servers, high performance computing systems, base stations forth. As one such example, 4 core domains each having a given number of out-of-order cores may be provided. Still further, in addition to optional GPU support (which as an example may take the form of a GPGPU), one or more accelerators to provide optimized hardware support for particular functions (e.g. web serving, network processing, switching or so forth) also may be provided. In addition, an input/output interface may be present to couple such accelerators to off-chip components.

Figure 11:
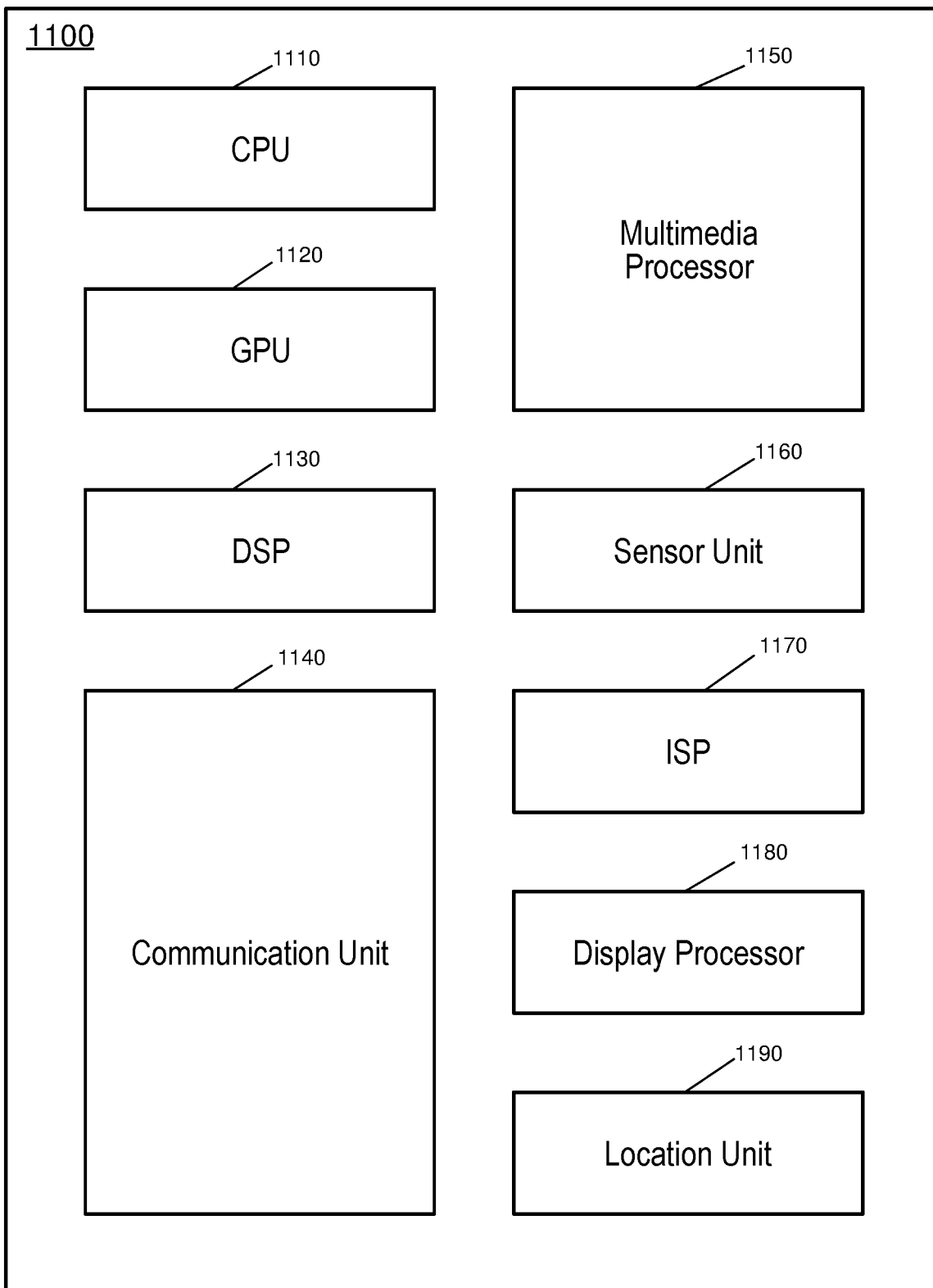
FIG. 11 is a block diagram of another example SoC in accordance with an embodiment of the present invention.

Referring now to FIG. 11, shown is a block diagram of another example SoC. In the embodiment of FIG. 11, SoC 1100 may include various circuitry to enable high performance for multimedia applications, communications and other functions. As such, SoC 1100 is suitable for incorporation into a wide variety of portable and other devices, such as smartphones, tablet computers, smart TVs and so forth. In the example shown, SoC 1100 includes a central processor unit (CPU) domain 1110. In an embodiment, a plurality of individual processor cores may be present in CPU domain 1110. As one example, CPU domain 1110 may be a quad core processor having 4 multithreaded cores. Such processors may be homogeneous or heterogeneous processors, e.g., a mix of low power and high power processor cores.

In turn, a GPU domain 1120 is provided to perform advanced graphics processing in one or more GPUs to handle graphics and compute APIs. A DSP unit 1130 may provide one or more low power DSPs for handling low-power multimedia applications such as music playback, audio/video and so forth, in addition to advanced calculations that may occur during execution of multimedia instructions. In turn, a communication unit 1140 may include various components to provide connectivity via various wireless protocols, such as cellular communications (including 3G/4G LTE), wireless local area protocols such as Bluetooth™ IEEE 802.11, and so forth.

Still further, a multimedia processor 1150 may be used to perform capture and playback of high definition video and audio content, including processing of user gestures. A sensor unit 1160 may include a plurality of sensors and/or a sensor controller to interface to various off-chip sensors present in a given platform. An image signal processor (ISP) 1170 may perform image processing with regard to captured content from one or more cameras of a platform, including still and video cameras.

A display processor 1180 may provide support for connection to a high definition display of a given pixel density, including the ability to wirelessly communicate content for playback on such display. Still further, a location unit 1190 may include a Global Positioning System (GPS) receiver with support for multiple GPS constellations to provide applications highly accurate positioning information obtained using as such GPS receiver. Understand that while shown with this particular set of components in the example of FIG. 11, many variations and alternatives are possible.

Figure 12:
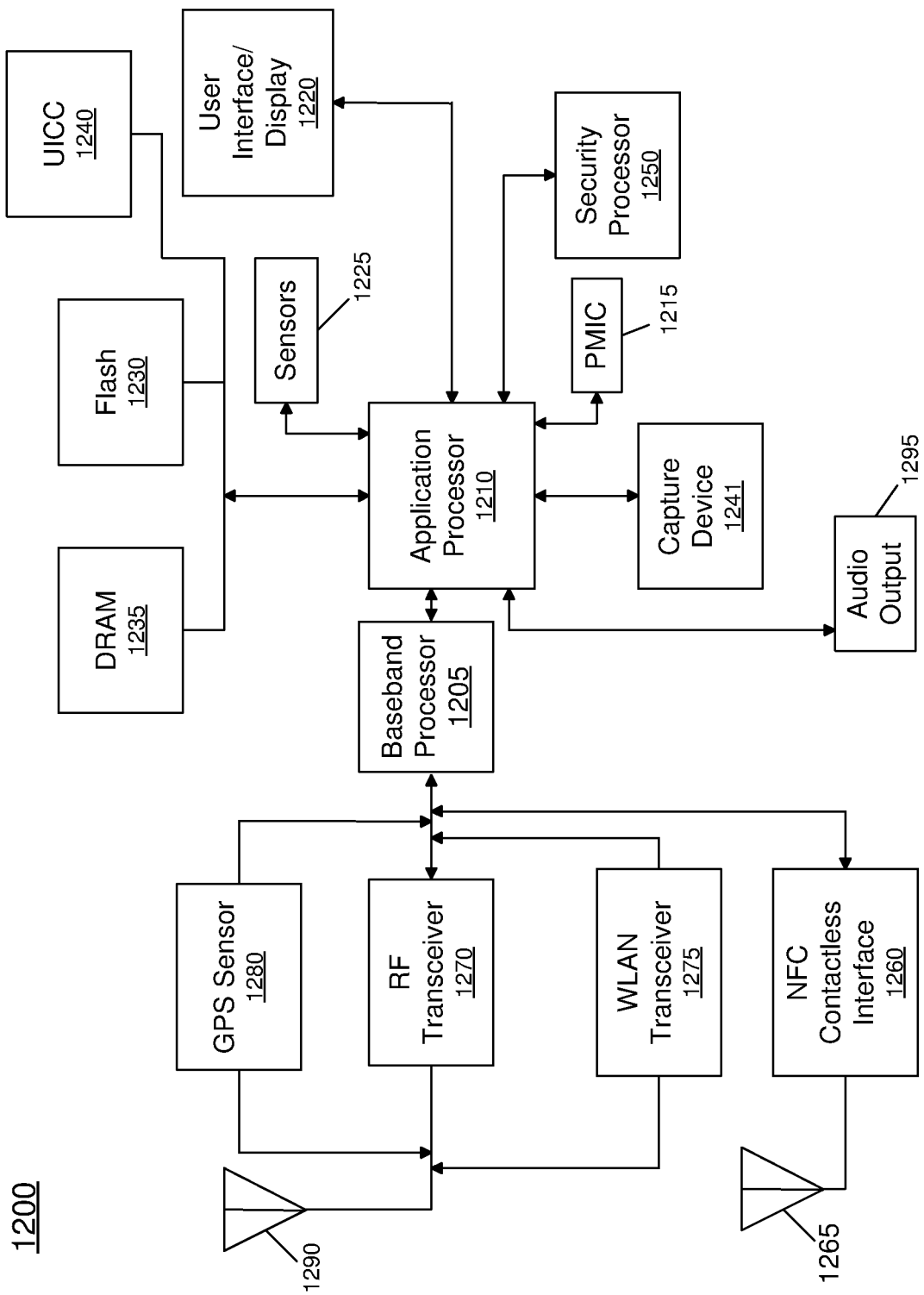
FIG. 12 is a block diagram of an example system with which embodiments can be used.

Referring now to FIG. 12, shown is a block diagram of an example system with which embodiments can be used. As seen, system 1200 may be a smartphone or other wireless communicator. A baseband processor 1205 is configured to perform various signal processing with regard to communication signals to be transmitted from or received by the system. In turn, baseband processor 1205 is coupled to an application processor 1210, which may be a main CPU of the system to execute an OS and other system software, in addition to user applications such as many well-known social media and multimedia apps. Application processor 1210 may further be configured to perform a variety of other computing operations for the device.

In turn, application processor 1210 can couple to a user interface/display 1220, e.g., a touch screen display. In addition, application processor 1210 may couple to a memory system including a non-volatile memory, namely a flash memory 1230 and a system memory, namely a dynamic random access memory (DRAM) 1235. As further seen, application processor 1210 further couples to a capture device 1241 such as one or more image capture devices that can record video and/or still images.

Still referring to FIG. 12, a universal integrated circuit card (UICC) 1246 comprising a subscriber identity module and possibly a secure storage and cryptoprocessor is also coupled to application processor 1210. System 1200 may further include a security processor 1250 that may couple to application processor 1210. A plurality of sensors 1225 may couple to application processor 1210 to enable input of a variety of sensed information such as accelerometer and other environmental information. An audio output device 1295 may provide an interface to output sound, e.g., in the form of voice communications, played or streaming audio data and so forth.

As further illustrated, a near field communication (NFC) contactless interface 1260 is provided that communicates in a NFC near field via an NFC antenna 1265. While separate antennae are shown in FIG. 12, understand that in some implementations one antenna or a different set of antennae may be provided to enable various wireless functionality.

A power management integrated circuit (PMIC) 1215 couples to application processor 1210 to perform platform level power management. To this end, PMIC 1215 may issue power management requests to application processor 1210 to enter certain low power states as desired. Furthermore, based on platform constraints, PMIC 1215 may also control the power level of other components of system 1200.

To enable communications to be transmitted and received, various circuitry may be coupled between baseband processor 1205 and an antenna 1290. Specifically, a radio frequency (RF) transceiver 1270 and a wireless local area network (WLAN) transceiver 1275 may be present. In general, RF transceiver 1270 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 1280 may be present. Other wireless communications such as receipt or transmission of radio signals, e.g., AM/FM and other signals may also be provided. In addition, via WLAN transceiver 1275, local wireless communications can also be realized.

Figure 13:
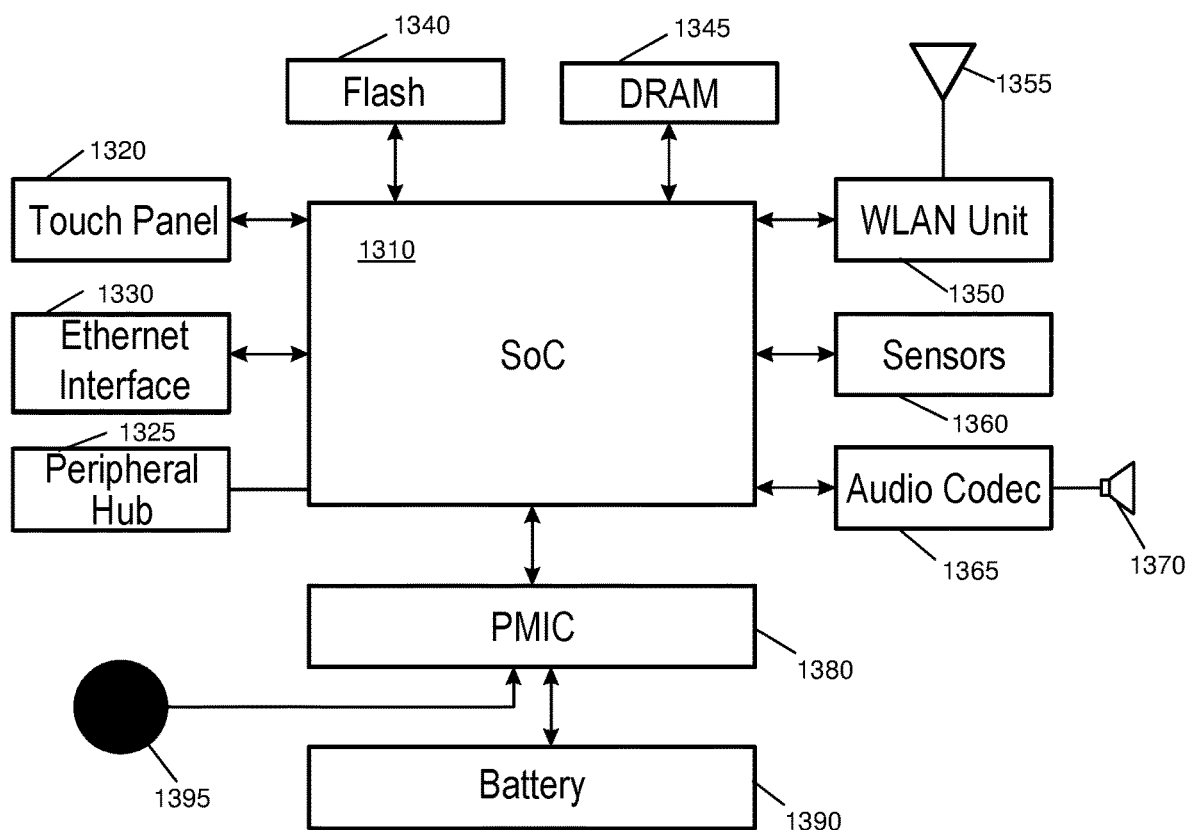
FIG. 13 is a block diagram of another example system with which embodiments may be used.

Referring now to FIG. 13, shown is a block diagram of another example system with which embodiments may be used. In the illustration of FIG. 13, system 1300 may be mobile low-power system such as a tablet computer, 2:1 tablet, phablet or other convertible or standalone tablet system. As illustrated, a SoC 1310 is present and may be configured to operate as an application processor for the device.

A variety of devices may couple to SoC 1310. In the illustration shown, a memory subsystem includes a flash memory 1340 and a DRAM 1345 coupled to SoC 1310. In addition, a touch panel 1320 is coupled to the SoC 1310 to provide display capability and user input via touch, including provision of a virtual keyboard on a display of touch panel 1320. To provide wired network connectivity, SoC 1310 couples to an Ethernet interface 1330. A peripheral hub 1325 is coupled to SoC 1310 to enable interfacing with various peripheral devices, such as may be coupled to system 1300 by any of various ports or other connectors.

In addition to internal power management circuitry and functionality within SoC 1310, a PMIC 1380 is coupled to SoC 1310 to provide platform-based power management, e.g., based on whether the system is powered by a battery 1390 or AC power via an AC adapter 1395. In addition to this power source-based power management, PMIC 1380 may further perform platform power management activities based on environmental and usage conditions. Still further, PMIC 1380 may communicate control and status information to SoC 1310 to cause various power management actions within SoC 1310.

Still referring to FIG. 13, to provide for wireless capabilities, a WLAN unit 1350 is coupled to SoC 1310 and in turn to an antenna 1355. In various implementations, WLAN unit 1350 may provide for communication according to one or more wireless protocols.

As further illustrated, a plurality of sensors 1360 may couple to SoC 1310. These sensors may include various accelerometer, environmental and other sensors, including user gesture sensors. Finally, an audio codec 1365 is coupled to SoC 1310 to provide an interface to an audio output device 1370. Of course understand that while shown with this particular implementation in FIG. 13, many variations and alternatives are possible.

Figure 14:
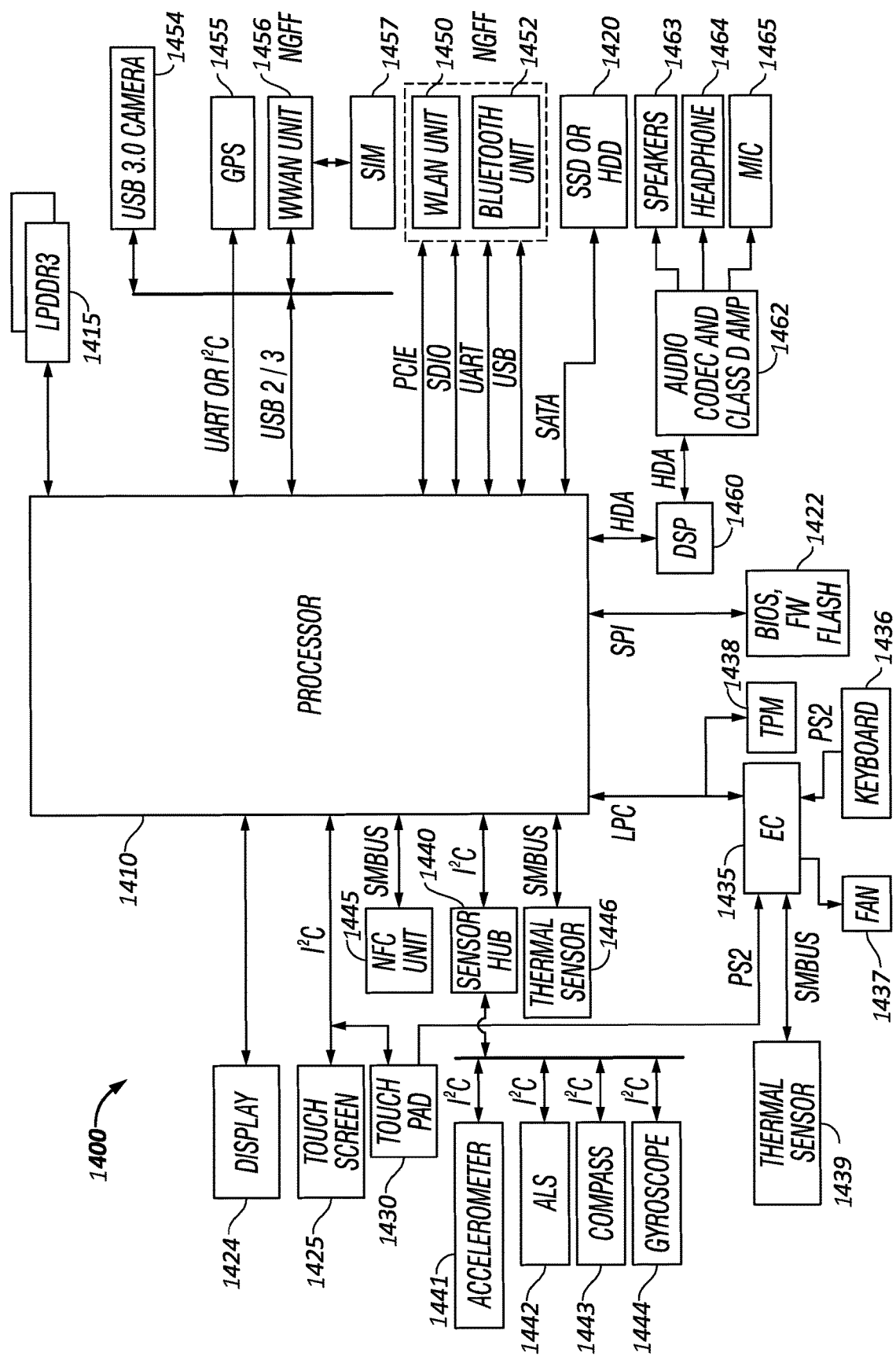
FIG. 14 is a block diagram of a representative computer system.

Referring now to FIG. 14, shown is a block diagram of a representative computer system 1400 such as notebook, Ultrabook™ or other small form factor system. A processor 1410, in one embodiment, includes a microprocessor, multi-core processor, multithreaded processor, an ultra low voltage processor, an embedded processor, or other known processing element. In the illustrated implementation, processor 1410 acts as a main processing unit and central hub for communication with many of the various components of the system 1400, and may include power management circuitry as described herein. As one example, processor 1410 is implemented as a SoC.

Processor 1410, in one embodiment, communicates with a system memory 1415. As an illustrative example, the system memory 1415 is implemented via multiple memory devices or modules to provide for a given amount of system memory.

To provide for persistent storage of information such as data, applications, one or more operating systems and so forth, a mass storage 1420 may also couple to processor 1410. In various embodiments, to enable a thinner and lighter system design as well as to improve system responsiveness, this mass storage may be implemented via a SSD or the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also shown in FIG. 14, a flash device 1422 may be coupled to processor 1410, e.g., via a serial peripheral interface (SPI). This flash device may provide for non-volatile storage of system software, including a basic input/output software (BIOS) as well as other firmware of the system.

Various input/output (I/O) devices may be present within system 1400. Specifically shown in the embodiment of FIG. 14 is a display 1424 which may be a high definition LCD or LED panel that further provides for a touch screen 1425. In one embodiment, display 1424 may be coupled to processor 1410 via a display interconnect that can be implemented as a high performance graphics interconnect. Touch screen 1425 may be coupled to processor 1410 via another interconnect, which in an embodiment can be an I$^2$C interconnect. As further shown in FIG. 14, in addition to touch screen 1425, user input by way of touch can also occur via a touch pad 1430 which may be configured within the chassis and may also be coupled to the same I$^2$C interconnect as touch screen 1425.

For perceptual computing and other purposes, various sensors may be present within the system and may be coupled to processor 1410 in different manners. Certain inertial and environmental sensors may couple to processor 1410 through a sensor hub 1440, e.g., via an I$^2$C interconnect. In the embodiment shown in FIG. 14, these sensors may include an accelerometer 1441, an ambient light sensor (ALS) 1442, a compass 1443 and a gyroscope 1444. Other environmental sensors may include one or more thermal sensors 1446 which in some embodiments couple to processor 1410 via a system management bus (SMBus) bus.

As also seen in FIG. 14, various peripheral devices may couple to processor 1410 via a low pin count (LPC) interconnect. In the embodiment shown, various components can be coupled through an embedded controller 1435. Such components can include a keyboard 1436 (e.g., coupled via a PS2 interface), a fan 1437, and a thermal sensor 1439. In some embodiments, touch pad 1430 may also couple to EC 1435 via a PS2 interface. In addition, a security processor such as a trusted platform module (TPM) 1438 may also couple to processor 1410 via this LPC interconnect.

System 1400 can communicate with external devices in a variety of manners, including wirelessly. In the embodiment shown in FIG. 14, various wireless modules, each of which can correspond to a radio configured for a particular wireless communication protocol, are present. One manner for wireless communication in a short range such as a near field may be via a NFC unit 1445 which may communicate, in one embodiment with processor 1410 via an SMBus. Note that via this NFC unit 1445, devices in close proximity to each other can communicate.

As further seen in FIG. 14, additional wireless units can include other short range wireless engines including a WLAN unit 1450 and a Bluetooth™ unit 1452. Using WLAN unit 1450, Wi-Fi™ communications can be realized, while via Bluetooth™ unit 1452, short range Bluetooth™ communications can occur. These units may communicate with processor 1410 via a given link.

In addition, wireless wide area communications, e.g., according to a cellular or other wireless wide area protocol, can occur via a WWAN unit 1456 which in turn may couple to a subscriber identity module (SIM) 1457. In addition, to enable receipt and use of location information, a GPS module 1455 may also be present. Note that in the embodiment shown in FIG. 14, WWAN unit 1456 and an integrated capture device such as a camera module 1454 may communicate via a given link.

To provide for audio inputs and outputs, an audio processor can be implemented via a digital signal processor (DSP) 1460, which may couple to processor 1410 via a high definition audio (HDA) link. Similarly, DSP 1460 may communicate with an integrated coder/decoder (CODEC) and amplifier 1462 that in turn may couple to output speakers 1463 which may be implemented within the chassis. Similarly, amplifier and CODEC 1462 can be coupled to receive audio inputs from a microphone 1465 which in an embodiment can be implemented via dual array microphones (such as a digital microphone array) to provide for high quality audio inputs to enable voice-activated control of various operations within the system. Note also that audio outputs can be provided from amplifier/CODEC 1462 to a headphone jack 1464. Although shown with these particular components in the embodiment of FIG. 14, understand the scope of the present invention is not limited in this regard.

Figure 15A:
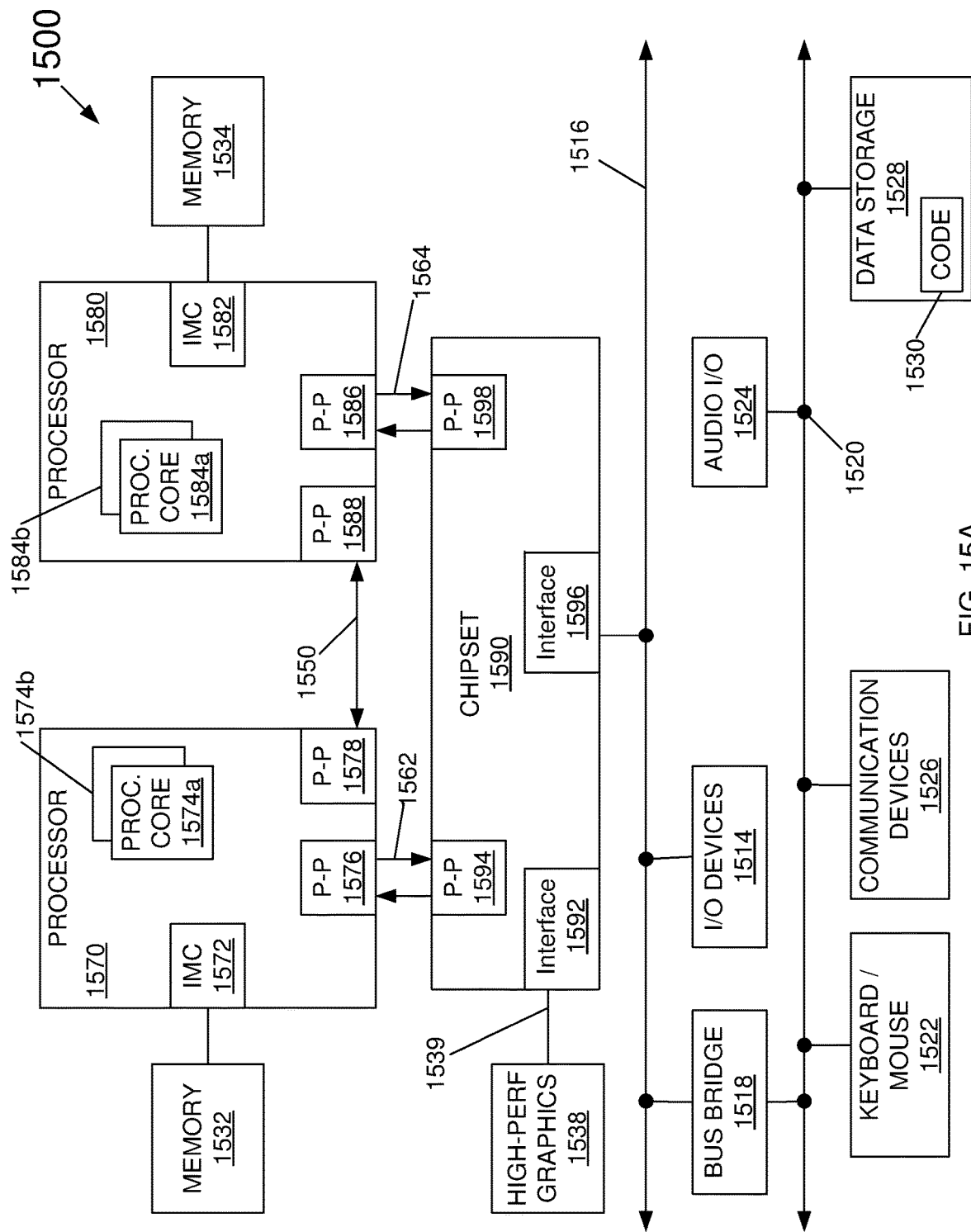
FIGS. 15A-15B are block diagrams of systems in accordance with embodiments of the present invention.

Embodiments may be implemented in many different system types. Referring now to FIG. 15A, shown is a block diagram of a system in accordance with an embodiment of the present invention. As shown in FIG. 15A, multiprocessor system 1500 is a point-to-point interconnect system, and includes a first processor 1570 and a second processor 1580 coupled via a point-to-point interconnect 1550. As shown in FIG. 15A, each of processors 1570 and 1580 may be multicore processors, including first and second processor cores (i.e., processor cores 1574a and 1574b and processor cores 1584a and 1584b), although potentially many more cores may be present in the processors. Each of the processors can include a PCU or other power management logic to perform processor-based power management as described herein.

Still referring to FIG. 15A, first processor 1570 further includes an integrated memory controller (IMC) 1572 and point-to-point (P-P) interfaces 1576 and 1578. Similarly, second processor 1580 includes an IMC 1582 and P-P interfaces 1586 and 1588. As shown in FIG. 15, IMCs 1572 and 1582 couple the processors to respective memories, namely a memory 1532 and a memory 1534, which may be portions of system memory (e.g., DRAM) locally attached to the respective processors. First processor 1570 and second processor 1580 may be coupled to a chipset 1590 via P-P interconnects 1562 and 1564, respectively. As shown in FIG. 15A, chipset 1590 includes P-P interfaces 1594 and 1598.

Furthermore, chipset 1590 includes an interface 1592 to couple chipset 1590 with a high-performance graphics engine 1538, by a P-P interconnect 1539. In turn, chipset 1590 may be coupled to a first bus 1516 via an interface 1596. As shown in FIG. 15A, various input/output (I/O) devices 1514 may be coupled to first bus 1516, along with a bus bridge 1518 which couples first bus 1516 to a second bus 1520. Various devices may be coupled to second bus 1520 including, for example, a keyboard/mouse 1522, communication devices 1526 and a data storage unit 1528 such as a disk drive or other mass storage device which may include code 1530, in one embodiment. Further, an audio I/O 1524 may be coupled to second bus 1520. Embodiments can be incorporated into other types of systems including mobile devices such as a smart cellular telephone, tablet computer, netbook, Ultrabook™, or so forth.

Figure 15B:
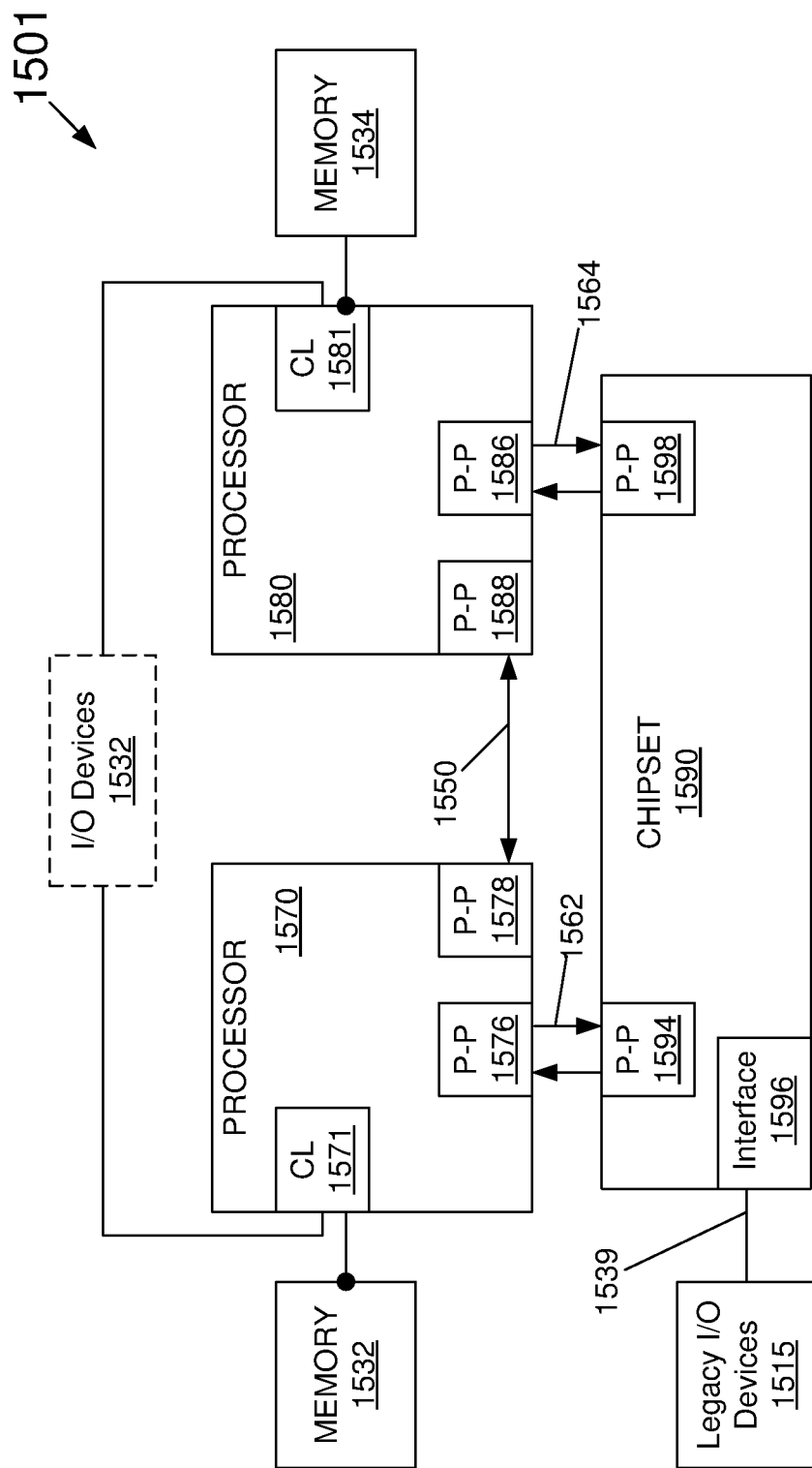

Referring now to FIG. 15B, shown is a block diagram of a second more specific exemplary system 1501 in accordance with an embodiment of the present invention. Like elements in FIG. 15A and FIG. 15B bear like reference numerals, and certain aspects of FIG. 15A have been omitted from FIG. 15B in order to avoid obscuring other aspects of FIG. 15B.

FIG. 15B illustrates that the processors 1570, 1580 may include integrated memory and I/O control logic ("CL") 1571 and 1581, respectively. Thus, the control logic 1571 and 1581 include integrated memory controller units and include I/O control logic. FIG. 15N illustrates that not only are the memories 1532, 1534 coupled to the control logic 1571 and 1581, but also that I/O devices 1513 are also coupled to the control logic 1571 and 1581. Legacy I/O devices 1515 are coupled to the chipset 1590.

One or more aspects of at least one embodiment may be implemented by representative code stored on a machine-readable medium which represents and/or defines logic within an integrated circuit such as a processor. For example, the machine-readable medium may include instructions which represent various logic within the processor. When read by a machine, the instructions may cause the machine to fabricate the logic to perform the techniques described herein. Such representations, known as "IP cores," are reusable units of logic for an integrated circuit that may be stored on a tangible, machine-readable medium as a hardware model that describes the structure of the integrated circuit. The hardware model may be supplied to various customers or manufacturing facilities, which load the hardware model on fabrication machines that manufacture the integrated circuit. The integrated circuit may be fabricated such that the circuit performs operations described in association with any of the embodiments described herein.

Figure 16:
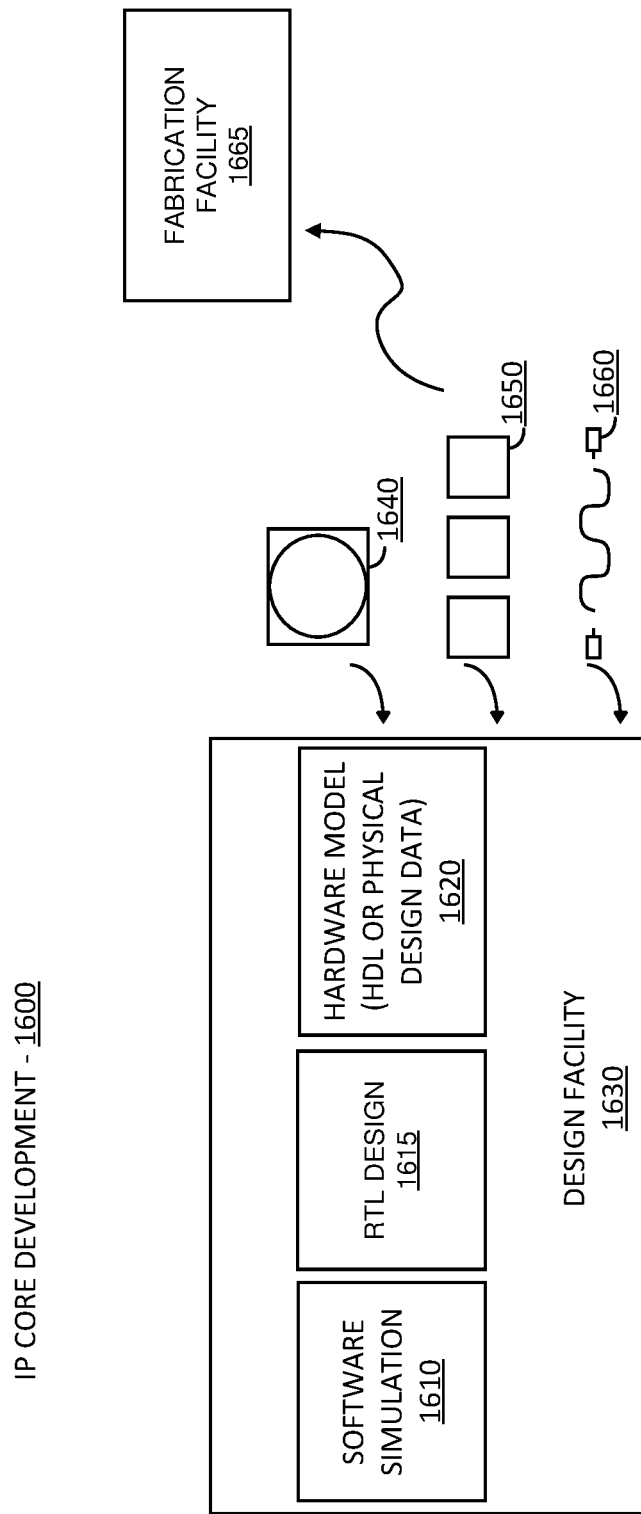
FIG. 16 is a block diagram illustrating an IP core development system used to manufacture an integrated circuit to perform operations according to an embodiment.

FIG. 16 is a block diagram illustrating an IP core development system 1600 that may be used to manufacture an integrated circuit to perform operations according to an embodiment. The IP core development system 1600 may be used to generate modular, reusable designs that can be incorporated into a larger design or used to construct an entire integrated circuit (e.g., an SoC integrated circuit). A design facility 1630 can generate a software simulation 1610 of an IP core design in a high-level programming language (e.g., C/C++). The software simulation 1610 can be used to design, test, and verify the behavior of the IP core. A register transfer level (RTL) design can then be created or synthesized from the simulation model. The RTL design 1615 is an abstraction of the behavior of the integrated circuit that models the flow of digital signals between hardware registers, including the associated logic performed using the modeled digital signals. In addition to an RTL design 1615, lower-level designs at the logic level or transistor level may also be created, designed, or synthesized. Thus, the particular details of the initial design and simulation may vary.

The RTL design 1615 or equivalent may be further synthesized by the design facility into a hardware model 1620, which may be in a hardware description language (HDL), or some other representation of physical design data. The HDL may be further simulated or tested to verify the IP core design. The IP core design can be stored for delivery to a third-party fabrication facility 1665 using non-volatile memory 1640 (e.g., hard disk, flash memory, or any non-volatile storage medium). Alternately, the IP core design may be transmitted (e.g., via the Internet) over a wired connection 1650 or wireless connection 1660. The fabrication facility 1665 may then fabricate an integrated circuit that is based at least in part on the IP core design. The fabricated integrated circuit can be configured to perform operations in accordance with the components and/or processes described herein.

FIGS. 17A-25 described below detail exemplary architectures and systems to implement embodiments of the components and/or processes described herein. In some embodiments, one or more hardware components and/or instructions described herein are emulated as detailed below, or are implemented as software modules.

Embodiments of the instruction(s) detailed above are embodied may be embodied in a "generic vector friendly instruction format" which is detailed below. In other embodiments, such a format is not utilized and another instruction format is used, however, the description below of the writemask registers, various data transformations (swizzle, broadcast, etc.), addressing, etc. is generally applicable to the description of the embodiments of the instruction(s) above. Additionally, exemplary systems, architectures, and pipelines are detailed below. Embodiments of the instruction(s) above may be executed on such systems, architectures, and pipelines, but are not limited to those detailed.

An instruction set may include one or more instruction formats. A given instruction format may define various fields (e.g., number of bits, location of bits) to specify, among other things, the operation to be performed (e.g., opcode) and the operand(s) on which that operation is to be performed and/or other data field(s) (e.g., mask). Some instruction formats are further broken down though the definition of instruction templates (or subformats). For example, the instruction templates of a given instruction format may be defined to have different subsets of the instruction format's fields (the included fields are typically in the same order, but at least some have different bit positions because there are less fields included) and/or defined to have a given field interpreted differently. Thus, each instruction of an ISA is expressed using a given instruction format (and, if defined, in a given one of the instruction templates of that instruction format) and includes fields for specifying the operation and the operands. For example, an exemplary ADD instruction has a specific opcode and an instruction format that includes an opcode field to specify that opcode and operand fields to select operands (source1/destination and source2); and an occurrence of this ADD instruction in an instruction stream will have specific contents in the operand fields that select specific operands. A set of SIMD extensions referred to as the Advanced Vector Extensions (AVX) (AVX1 and AVX2) and using the Vector Extensions (VEX) coding scheme has been released and/or published (e.g., see Intel® 64 and IA-32 Architectures Software Developer's Manual, September 2014; and see Intel® Advanced Vector Extensions Programming Reference, October 2014).

Exemplary Instruction Formats

Embodiments of the instruction(s) described herein may be embodied in different formats. Additionally, exemplary systems, architectures, and pipelines are detailed below. Embodiments of the instruction(s) may be executed on such systems, architectures, and pipelines, but are not limited to those detailed.

Generic Vector Friendly Instruction Format

A vector friendly instruction format is an instruction format that is suited for vector instructions (e.g., there are certain fields specific to vector operations). While embodiments are described in which both vector and scalar operations are supported through the vector friendly instruction format, alternative embodiments use only vector operations the vector friendly instruction format.

Figure 17A:
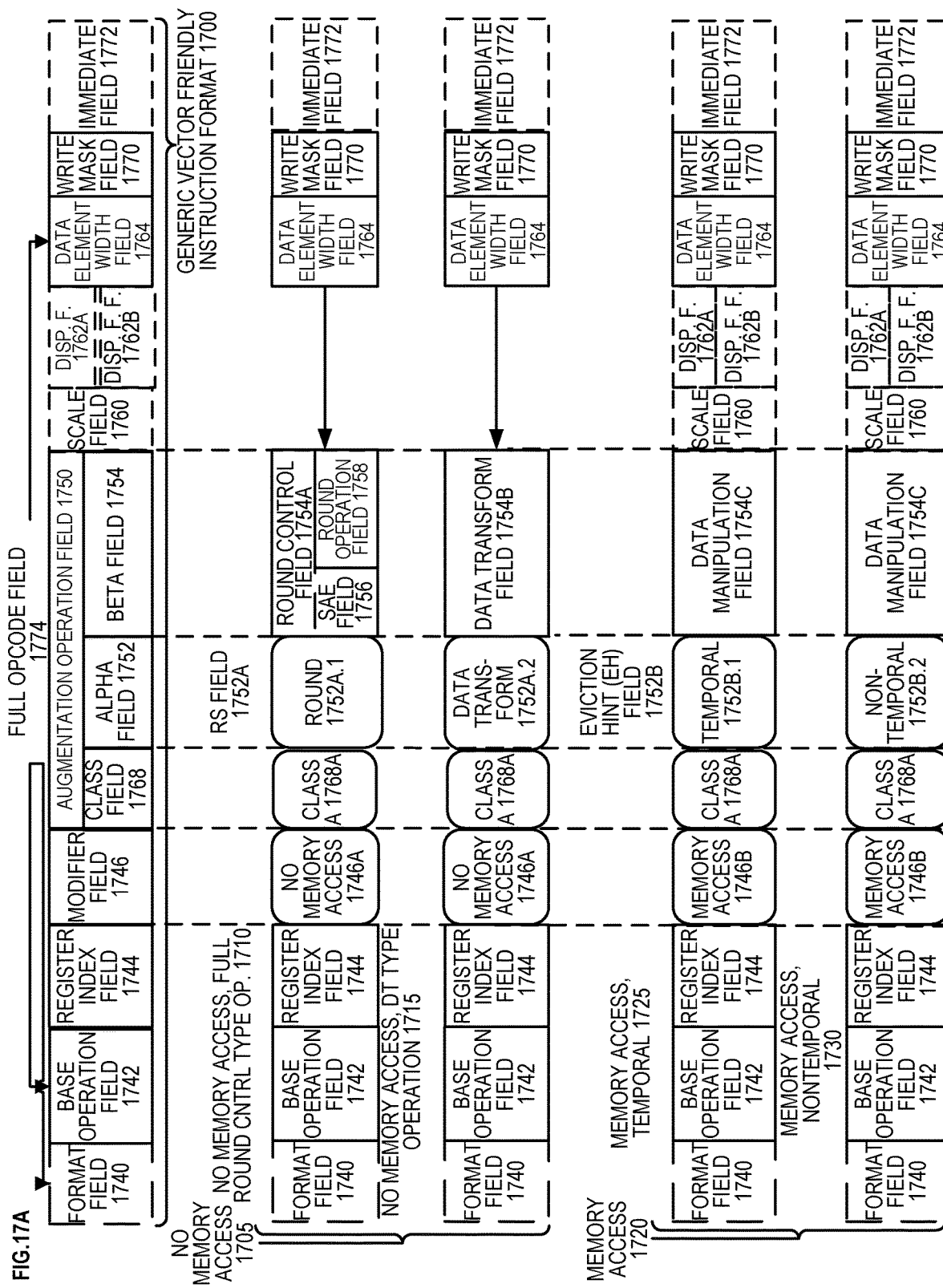

FIGS. 17A-17B are block diagrams illustrating a generic vector friendly instruction format and instruction templates thereof according to embodiments of the invention. FIG. 17A is a block diagram illustrating a generic vector friendly instruction format and class A instruction templates thereof according to embodiments of the invention; while FIG. 17B is a block diagram illustrating the generic vector friendly instruction format and class B instruction templates thereof according to embodiments of the invention. Specifically, a generic vector friendly instruction format 1700 for which are defined class A and class B instruction templates, both of which include no memory access 1705 instruction templates and memory access 1720 instruction templates. The term generic in the context of the vector friendly instruction format refers to the instruction format not being tied to any specific instruction set.

While embodiments of the invention will be described in which the vector friendly instruction format supports the following: a 64 byte vector operand length (or size) with 32 bit (4 byte) or 64 bit (8 byte) data element widths (or sizes) (and thus, a 64 byte vector consists of either 16 doubleword-size elements or alternatively, 8 quadword-size elements); a 64 byte vector operand length (or size) with 16 bit (2 byte) or 8 bit (1 byte) data element widths (or sizes); a 32 byte vector operand length (or size) with 32 bit (4 byte), 64 bit (8 byte), 16 bit (2 byte), or 8 bit (1 byte) data element widths (or sizes); and a 16 byte vector operand length (or size) with 32 bit (4 byte), 64 bit (8 byte), 16 bit (2 byte), or 8 bit (1 byte) data element widths (or sizes); alternative embodiments may support more, less and/or different vector operand sizes (e.g., 256 byte vector operands) with more, less, or different data element widths (e.g., 128 bit (16 byte) data element widths).

The class A instruction templates in FIG. 17A include: 1) within the no memory access 1705 instruction templates there is shown a no memory access, full round control type operation 1710 instruction template and a no memory access, data transform type operation 1715 instruction template; and 2) within the memory access 1720 instruction templates there is shown a memory access, temporal 1725 instruction template and a memory access, non-temporal 1730 instruction template. The class B instruction templates in FIG. 17B include: 1) within the no memory access 1705 instruction templates there is shown a no memory access, write mask control, partial round control type operation 1712 instruction template and a no memory access, write mask control, vsize type operation 1717 instruction template; and 2) within the memory access 1720 instruction templates there is shown a memory access, write mask control 1727 instruction template.

The generic vector friendly instruction format 1700 includes the following fields listed below in the order illustrated in FIGS. 17A-17B.

Format field 1740—a specific value (an instruction format identifier value) in this field uniquely identifies the vector friendly instruction format, and thus occurrences of instructions in the vector friendly instruction format in instruction streams. As such, this field is optional in the sense that it is not needed for an instruction set that has only the generic vector friendly instruction format.

Base operation field 1742—its content distinguishes different base operations.

Register index field 1744—its content, directly or through address generation, specifies the locations of the source and destination operands, be they in registers or in memory. These include a sufficient number of bits to select N registers from a P×Q (e.g. 32×512, 16×128, 32×1024, 64×1024) register file. While in one embodiment N may be up to three sources and one destination register, alternative embodiments may support more or less sources and destination registers (e.g., may support up to two sources where one of these sources also acts as the destination, may support up to three sources where one of these sources also acts as the destination, may support up to two sources and one destination).

Modifier field 1746—its content distinguishes occurrences of instructions in the generic vector instruction format that specify memory access from those that do not; that is, between no memory access 1705 instruction templates and memory access 1720 instruction templates. Memory access operations read and/or write to the memory hierarchy (in some cases specifying the source and/or destination addresses using values in registers), while non-memory access operations do not (e.g., the source and destinations are registers). While in one embodiment this field also selects between three different ways to perform memory address calculations, alternative embodiments may support more, less, or different ways to perform memory address calculations.

Augmentation operation field 1750—its content distinguishes which one of a variety of different operations to be performed in addition to the base operation. This field is context specific. In one embodiment of the invention, this field is divided into a class field 1768, an alpha field 1752, and a beta field 1754. The augmentation operation field 1750 allows common groups of operations to be performed in a single instruction rather than 2, 3, or 4 instructions.

Scale field 1760—its content allows for the scaling of the index field's content for memory address generation (e.g., for address generation that uses $2^{scale}*\text{index}+\text{base}$).

Displacement Field 1762A—its content is used as part of memory address generation (e.g., for address generation that uses $2^{scale}*\text{index}+\text{base}+\text{displacement}$).

Displacement Factor Field 1762B (note that the juxtaposition of displacement field 1762A directly over displacement factor field 1762B indicates one or the other is used)—its content is used as part of address generation; it specifies a displacement factor that is to be scaled by the size of a memory access (N)—where N is the number of bytes in the memory access (e.g., for address generation that uses $2^{scale}*\text{index}+\text{base}+\text{scaled displacement}$). Redundant low-order bits are ignored and hence, the displacement factor field's content is multiplied by the memory operands total size (N) in order to generate the final displacement to be used in calculating an effective address. The value of N is determined by the processor hardware at runtime based on the full opcode field 1774 (described later herein) and the data manipulation field 1754C. The displacement field 1762A and the displacement factor field 1762B are optional in the sense that they are not used for the no memory access 1705 instruction templates and/or different embodiments may implement only one or none of the two.

Data element width field 1764—its content distinguishes which one of a number of data element widths is to be used (in some embodiments for all instructions; in other embodiments for only some of the instructions). This field is optional in the sense that it is not needed if only one data element width is supported and/or data element widths are supported using some aspect of the opcodes.

Write mask field 1770—its content controls, on a per data element position basis, whether that data element position in the destination vector operand reflects the result of the base operation and augmentation operation. Class A instruction templates support merging-writemasking, while class B instruction templates support both merging- and zeroing-writemasking. When merging, vector masks allow any set of elements in the destination to be protected from updates during the execution of any operation (specified by the base operation and the augmentation operation); in other one embodiment, preserving the old value of each element of the destination where the corresponding mask bit has a 0. In contrast, when zeroing vector masks allow any set of elements in the destination to be zeroed during the execution of any operation (specified by the base operation and the augmentation operation); in one embodiment, an element of the destination is set to 0 when the corresponding mask bit has a 0 value. A subset of this functionality is the ability to control the vector length of the operation being performed (that is, the span of elements being modified, from the first to the last one); however, it is not necessary that the elements that are modified be consecutive. Thus, the write mask field 1770 allows for partial vector operations, including loads, stores, arithmetic, logical, etc. While embodiments of the invention are described in which the write mask field's 1770 content selects one of a number of write mask registers that contains the write mask to be used (and thus the write mask field's 1770 content indirectly identifies that masking to be performed), alternative embodiments instead or additional allow the mask write field's 1770 content to directly specify the masking to be performed.

Immediate field 1772—its content allows for the specification of an immediate. This field is optional in the sense that is it not present in an implementation of the generic vector friendly format that does not support immediate and it is not present in instructions that do not use an immediate.

Class field 1768—its content distinguishes between different classes of instructions. With reference to FIGS. 17A-B, the contents of this field select between class A and class B instructions. In FIGS. 17A-B, rounded corner squares are used to indicate a specific value is present in a field (e.g., class A 1768A and class B 1768B for the class field 1768 respectively in FIGS. 17A-B).

Instruction Templates of Class A

In the case of the non-memory access 1705 instruction templates of class A, the alpha field 1752 is interpreted as an RS field 1752A, whose content distinguishes which one of the different augmentation operation types are to be performed (e.g., round 1752A.1 and data transform 1752A.2 are respectively specified for the no memory access, round type operation 1710 and the no memory access, data transform type operation 1715 instruction templates), while the beta field 1754 distinguishes which of the operations of the specified type is to be performed. In the no memory access 1705 instruction templates, the scale field 1760, the displacement field 1762A, and the displacement scale field 1762B are not present.

No-Memory Access Instruction Templates—Full Round Control Type Operation

In the no memory access full round control type operation 1710 instruction template, the beta field 1754 is interpreted as a round control field 1754A, whose content(s) provide static rounding. While in the described embodiments of the invention the round control field 1754A includes a suppress all floating point exceptions (SAE) field 1756 and a round operation control field 1758, alternative embodiments may support may encode both these concepts into the same field or only have one or the other of these concepts/fields (e.g., may have only the round operation control field 1758).

SAE field 1756—its content distinguishes whether or not to disable the exception event reporting; when the SAE field's 1756 content indicates suppression is enabled, a given instruction does not report any kind of floating-point exception flag and does not raise any floating point exception handler.

Round operation control field 1758—its content distinguishes which one of a group of rounding operations to perform (e.g., Round-up, Round-down, Round-towards-zero and Round-to-nearest). Thus, the round operation control field 1758 allows for the changing of the rounding mode on a per instruction basis. In one embodiment of the invention where a processor includes a control register for specifying rounding modes, the round operation control field's 1750 content overrides that register value.

No Memory Access Instruction Templates—Data Transform Type Operation

In the no memory access data transform type operation 1715 instruction template, the beta field 1754 is interpreted as a data transform field 1754B, whose content distinguishes which one of a number of data transforms is to be performed (e.g., no data transform, swizzle, broadcast).

In the case of a memory access 1720 instruction template of class A, the alpha field 1752 is interpreted as an eviction hint field 1752B, whose content distinguishes which one of the eviction hints is to be used (in FIG. 17A, temporal 1752B.1 and non-temporal 1752B.2 are respectively specified for the memory access, temporal 1725 instruction template and the memory access, non-temporal 1730 instruction template), while the beta field 1754 is interpreted as a data manipulation field 1754C, whose content distinguishes which one of a number of data manipulation operations (also known as primitives) is to be performed (e.g., no manipulation; broadcast; up conversion of a source; and down conversion of a destination). The memory access 1720 instruction templates include the scale field 1760, and optionally the displacement field 1762A or the displacement scale field 1762B.

Vector memory instructions perform vector loads from and vector stores to memory, with conversion support. As with regular vector instructions, vector memory instructions transfer data from/to memory in a data element-wise fashion, with the elements that are actually transferred is dictated by the contents of the vector mask that is selected as the write mask.

Memory Access Instruction Templates—Temporal

Temporal data is data likely to be reused soon enough to benefit from caching. This is, however, a hint, and different processors may implement it in different ways, including ignoring the hint entirely.

Memory Access Instruction Templates—Non-Temporal

Non-temporal data is data unlikely to be reused soon enough to benefit from caching in the 1st-level cache and should be given priority for eviction. This is, however, a hint, and different processors may implement it in different ways, including ignoring the hint entirely.

Instruction Templates of Class B

In the case of the instruction templates of class B, the alpha field 1752 is interpreted as a write mask control (Z) field 1752C, whose content distinguishes whether the write masking controlled by the write mask field 1770 should be a merging or a zeroing.

In the case of the non-memory access 1705 instruction templates of class B, part of the beta field 1754 is interpreted as an RL field 1757A, whose content distinguishes which one of the different augmentation operation types are to be performed (e.g., round 1757A.1 and vector length (VSIZE) 1757A.2 are respectively specified for the no memory access, write mask control, partial round control type operation 1712 instruction template and the no memory access, write mask control, VSIZE type operation 1717 instruction template), while the rest of the beta field 1754 distinguishes which of the operations of the specified type is to be performed. In the no memory access 1705 instruction templates, the scale field 1760, the displacement field 1762A, and the displacement scale field 1762B are not present.

In the no memory access, write mask control, partial round control type operation 1710 instruction template, the rest of the beta field 1754 is interpreted as a round operation field 1759A and exception event reporting is disabled (a given instruction does not report any kind of floating-point exception flag and does not raise any floating point exception handler).

Round operation control field 1759A—just as round operation control field 1758, its content distinguishes which one of a group of rounding operations to perform (e.g., Round-up, Round-down, Round-towards-zero and Round-to-nearest). Thus, the round operation control field 1759A allows for the changing of the rounding mode on a per instruction basis. In one embodiment of the invention where a processor includes a control register for specifying rounding modes, the round operation control field's 1750 content overrides that register value.

In the no memory access, write mask control, VSIZE type operation 1717 instruction template, the rest of the beta field 1754 is interpreted as a vector length field 1759B, whose content distinguishes which one of a number of data vector lengths is to be performed on (e.g., 128, 256, or 512 byte).

In the case of a memory access 1720 instruction template of class B, part of the beta field 1754 is interpreted as a broadcast field 1757B, whose content distinguishes whether or not the broadcast type data manipulation operation is to be performed, while the rest of the beta field 1754 is interpreted the vector length field 1759B. The memory access 1720 instruction templates include the scale field 1760, and optionally the displacement field 1762A or the displacement scale field 1762B.

With regard to the generic vector friendly instruction format 1700, a full opcode field 1774 is shown including the format field 1740, the base operation field 1742, and the data element width field 1764. While one embodiment is shown where the full opcode field 1774 includes all of these fields, the full opcode field 1774 includes less than all of these fields in embodiments that do not support all of them. The full opcode field 1774 provides the operation code (opcode).

The augmentation operation field 1750, the data element width field 1764, and the write mask field 1770 allow these features to be specified on a per instruction basis in the generic vector friendly instruction format.

The combination of write mask field and data element width field create typed instructions in that they allow the mask to be applied based on different data element widths.

The various instruction templates found within class A and class B are beneficial in different situations. In some embodiments of the invention, different processors or different cores within a processor may support only class A, only class B, or both classes. For instance, a high performance general purpose out-of-order core intended for general-purpose computing may support only class B, a core intended primarily for graphics and/or scientific (throughput) computing may support only class A, and a core intended for both may support both (of course, a core that has some mix of templates and instructions from both classes but not all templates and instructions from both classes is within the purview of the invention). Also, a single processor may include multiple cores, all of which support the same class or in which different cores support different class. For instance, in a processor with separate graphics and general purpose cores, one of the graphics cores intended primarily for graphics and/or scientific computing may support only class A, while one or more of the general purpose cores may be high performance general purpose cores with out of order execution and register renaming intended for general-purpose computing that support only class B. Another processor that does not have a separate graphics core, may include one more general purpose in-order or out-of-order cores that support both class A and class B. Of course, features from one class may also be implement in the other class in different embodiments of the invention. Programs written in a high level language would be put (e.g., just in time compiled or statically compiled) into an variety of different executable forms, including: 1) a form having only instructions of the class(es) supported by the target processor for execution; or 2) a form having alternative routines written using different combinations of the instructions of all classes and having control flow code that selects the routines to execute based on the instructions supported by the processor which is currently executing the code.

Exemplary Specific Vector Friendly Instruction Format

FIG. 18A-18C are block diagrams illustrating an exemplary specific vector friendly instruction format according to embodiments of the invention. FIG. 18A shows a specific vector friendly instruction format 1800 that is specific in the sense that it specifies the location, size, interpretation, and order of the fields, as well as values for some of those fields. The specific vector friendly instruction format 1800 may be used to extend the x86 instruction set, and thus some of the fields are similar or the same as those used in the existing x86 instruction set and extension thereof (e.g., AVX). This format remains consistent with the prefix encoding field, real opcode byte field, MOD R/M field, SIB field, displacement field, and immediate fields of the existing x86 instruction set with extensions. The fields from FIGS. 17A-17B into which the fields from FIGS. 18A-18C map are illustrated.

It should be understood that, although embodiments of the invention are described with reference to the specific vector friendly instruction format 1800 in the context of the generic vector friendly instruction format 1700 for illustrative purposes, the invention is not limited to the specific vector friendly instruction format 1800 except where claimed. For example, the generic vector friendly instruction format 1700 contemplates a variety of possible sizes for the various fields, while the specific vector friendly instruction format 1800 is shown as having fields of specific sizes. By way of specific example, while the data element width field 1764 is illustrated as a one bit field in the specific vector friendly instruction format 1800, the invention is not so limited (that is, the generic vector friendly instruction format 1700 contemplates other sizes of the data element width field 1764).

The generic vector friendly instruction format 1700 includes the following fields listed below in the order illustrated in FIG. 18A.

EVEX Prefix (Bytes 0-3) 1802—is encoded in a four-byte form.

Format Field 1740 (EVEX Byte 0, bits [7:0])—the first byte (EVEX Byte 0) is the format field 1740 and it contains 0x62 (the unique value used for distinguishing the vector friendly instruction format in one embodiment of the invention).

The second-fourth bytes (EVEX Bytes 1-3) include a number of bit fields providing specific capability.

REX field 1805 (EVEX Byte 1, bits [7-5])—consists of a EVEX.R bit field (EVEX Byte 1, bit [7]—R), EVEX.X bit field (EVEX byte 1, bit [6]—X), and EVEX.B byte 1, bit[5]—B). The EVEX.R, EVEX.X, and EVEX.B bit fields provide the same functionality as the corresponding VEX bit fields, and are encoded using 1s complement form, i.e. ZMM0 is encoded as 1111B, ZMM15 is encoded as 0000B. Other fields of the instructions encode the lower three bits of the register indexes as is known in the art (rrr, xxx, and bbb), so that Rrrr, Xxxx, and Bbbb may be formed by adding EVEX.R, EVEX.X, and EVEX.B.

REX' field 1810—this is the first part of the REX' field 1810 and is the EVEX.R' bit field (EVEX Byte 1, bit [4]—R') that is used to encode either the upper 16 or lower 16 of the extended 32 register set. In one embodiment of the invention, this bit, along with others as indicated below, is stored in bit inverted format to distinguish (in the well-known x86 32-bit mode) from the BOUND instruction, whose real opcode byte is 62, but does not accept in the MOD R/M field (described below) the value of 11 in the MOD field; alternative embodiments of the invention do not store this and the other indicated bits below in the inverted format. A value of 1 is used to encode the lower 16 registers. In other words, R'Rrrr is formed by combining EVEX.R', EVEX.R, and the other RRR from other fields.

Opcode map field 1815 (EVEX byte 1, bits [3:0]—mmmm)—its content encodes an implied leading opcode byte (0F, 0F 38, or 0F 3).

Data element width field 1764 (EVEX byte 2, bit [7]—W)—is represented by the notation EVEX.W. EVEX.W is used to define the granularity (size) of the datatype (either 32-bit data elements or 64-bit data elements).

EVEX.vvvv 1820 (EVEX Byte 2, bits [6:3]—vvvv)—the role of EVEX.vvvv may include the following: 1) EVEX.vvvv encodes the first source register operand, specified in inverted (1s complement) form and is valid for instructions with 2 or more source operands; 2) EVEX.vvvv encodes the destination register operand, specified in 1s complement form for certain vector shifts; or 3) EVEX.vvvv does not encode any operand, the field is reserved and should contain 1111b. Thus, EVEX.vvvv field 1820 encodes the 4 low-order bits of the first source register specifier stored in inverted (1s complement) form. Depending on the instruction, an extra different EVEX bit field is used to extend the specifier size to 32 registers.

EVEX.U 1768 Class field (EVEX byte 2, bit [2]—U)—If EVEX.U=0, it indicates class A or EVEX.U0; if EVEX.U=1, it indicates class B or EVEX.U1.

Prefix encoding field 1825 (EVEX byte 2, bits [1:0]—pp)—provides additional bits for the base operation field. In addition to providing support for the legacy SSE instructions in the EVEX prefix format, this also has the benefit of compacting the SIMD prefix (rather than requiring a byte to express the SIMD prefix, the EVEX prefix requires only 2 bits). In one embodiment, to support legacy SSE instructions that use a SIMD prefix (66H, F2H, F3H) in both the legacy format and in the EVEX prefix format, these legacy SIMD prefixes are encoded into the SIMD prefix encoding field; and at runtime are expanded into the legacy SIMD prefix prior to being provided to the decoder's PLA (so the PLA can execute both the legacy and EVEX format of these legacy instructions without modification). Although newer instructions could use the EVEX prefix encoding field's content directly as an opcode extension, certain embodiments expand in a similar fashion for consistency but allow for different meanings to be specified by these legacy SIMD prefixes. An alternative embodiment may redesign the PLA to support the 2 bit SIMD prefix encodings, and thus not require the expansion.

Alpha field 1752 (EVEX byte 3, bit [7]—EH; also known as EVEX.EH, EVEX.rs, EVEX.RL, EVEX.write mask control, and EVEX.N; also illustrated with α)—as previously described, this field is context specific.

Beta field 1754 (EVEX byte 3, bits [6:4]—SSS, also known as EVEX.$s_{2-0}$, EVEX.$r_{2-0}$, EVEX.rr1, EVEX.LL0, EVEX.LLB; also illustrated with βββ)—as previously described, this field is context specific.

REX' field 1810—this is the remainder of the REX' field and is the EVEX.V' bit field (EVEX Byte 3, bit [3]—V') that may be used to encode either the upper 16 or lower 16 of the extended 32 register set. This bit is stored in bit inverted format. A value of 1 is used to encode the lower 16 registers. In other words, V'VVVV is formed by combining EVEX.V', EVEX.vvvv.

Write mask field 1770 (EVEX byte 3, bits [2:0]—kkk)—its content specifies the index of a register in the write mask registers as previously described. In one embodiment of the invention, the specific value EVEX kkk=000 has a special behavior implying no write mask is used for the particular instruction (this may be implemented in a variety of ways including the use of a write mask hardwired to all ones or hardware that bypasses the masking hardware).

Real Opcode Field 1830 (Byte 4) is also known as the opcode byte. Part of the opcode is specified in this field.

MOD R/M Field 1840 (Byte 5) includes MOD field 1842, Reg field 1844, and R/M field 1846. As previously described, the MOD field's 1842 content distinguishes between memory access and non-memory access operations. The role of Reg field 1844 can be summarized to two situations: encoding either the destination register operand or a source register operand, or be treated as an opcode extension and not used to encode any instruction operand. The role of R/M field 1846 may include the following: encoding the instruction operand that references a memory address, or encoding either the destination register operand or a source register operand.

Scale, Index, Base (SIB) Byte (Byte 6)—As previously described, the scale field's 1850 content is used for memory address generation. SIB.xxx 1854 and SIB.bbb 1856—the contents of these fields have been previously referred to with regard to the register indexes Xxxx and Bbbb.

Displacement field 1762A (Bytes 7-10)—when MOD field 1842 contains 10, bytes 7-10 are the displacement field 1762A, and it works the same as the legacy 32-bit displacement (disp32) and works at byte granularity.

Displacement factor field 1762B (Byte 7)—when MOD field 1842 contains 01, byte 7 is the displacement factor field 1762B. The location of this field is that same as that of the legacy x86 instruction set 8-bit displacement (disp8), which works at byte granularity. Since disp8 is sign extended, it can only address between −128 and 127 bytes offsets; in terms of 64 byte cache lines, disp8 uses 8 bits that can be set to only four really useful values −128, −64, 0, and 64; since a greater range is often needed, disp32 is used; however, disp32 requires 4 bytes. In contrast to disp8 and disp32, the displacement factor field 1762B is a reinterpretation of disp8; when using displacement factor field 1762B, the actual displacement is determined by the content of the displacement factor field multiplied by the size of the memory operand access (N). This type of displacement is referred to as disp8*N. This reduces the average instruction length (a single byte of used for the displacement but with a much greater range). Such compressed displacement is based on the assumption that the effective displacement is multiple of the granularity of the memory access, and hence, the redundant low-order bits of the address offset do not need to be encoded. In other words, the displacement factor field 1762B substitutes the legacy x86 instruction set 8-bit displacement. Thus, the displacement factor field 1762B is encoded the same way as an x86 instruction set 8-bit displacement (so no changes in the ModRM/SIB encoding rules) with the only exception that disp8 is overloaded to disp8*N. In other words, there are no changes in the encoding rules or encoding lengths but only in the interpretation of the displacement value by hardware (which needs to scale the displacement by the size of the memory operand to obtain a byte-wise address offset). Immediate field 1772 operates as previously described.

Full Opcode Field

FIG. 18B is a block diagram illustrating the fields of the specific vector friendly instruction format 1800 that make up the full opcode field 1774 according to one embodiment of the invention. Specifically, the full opcode field 1774 includes the format field 1740, the base operation field 1742, and the data element width (W) field 1764. The base operation field 1742 includes the prefix encoding field 1825, the opcode map field 1815, and the real opcode field 1830.

Register Index Field

FIG. 18C is a block diagram illustrating the fields of the specific vector friendly instruction format 1800 that make up the register index field 1744 according to one embodiment of the invention. Specifically, the register index field 1744 includes the REX field 1805, the REX' field 1810, the MODR/M.reg field 1844, the MODR/M.r/m field 1846, the VVVV field 1820, xxx field 1854, and the bbb field 1856.

Augmentation Operation Field

Figure 18D:
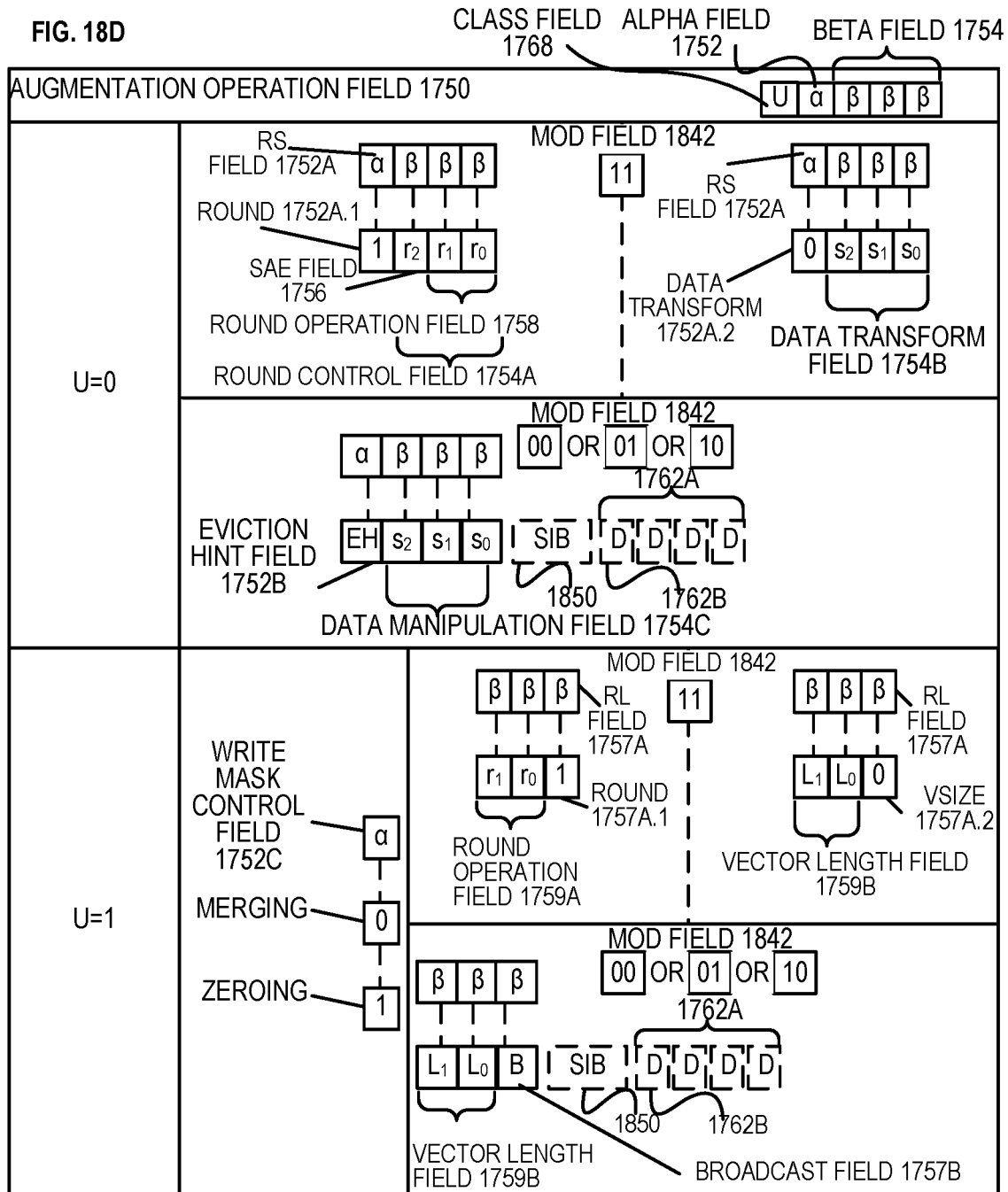

FIG. 18D is a block diagram illustrating the fields of the specific vector friendly instruction format 1800 that make up the augmentation operation field 1750 according to one embodiment of the invention. When the class (U) field 1768 contains 0, it signifies EVEX.U0 (class A 1768A); when it contains 1, it signifies EVEX.U1 (class B 1768B). When U=0 and the MOD field 1842 contains 11 (signifying a no memory access operation), the alpha field 1752 (EVEX byte 3, bit [7]—EH) is interpreted as the rs field 1752A. When the rs field 1752A contains a 1 (round 1752A.1), the beta field 1754 (EVEX byte 3, bits [6:4]—SSS) is interpreted as the round control field 1754A. The round control field 1754A includes a one bit SAE field 1756 and a two bit round operation field 1758. When the rs field 1752A contains a 0 (data transform 1752A.2), the beta field 1754 (EVEX byte 3, bits [6:4]—SSS) is interpreted as a three bit data transform field 1754B. When U=0 and the MOD field 1842 contains 00, 01, or 10 (signifying a memory access operation), the alpha field 1752 (EVEX byte 3, bit [7]—EH) is interpreted as the eviction hint (EH) field 1752B and the beta field 1754 (EVEX byte 3, bits [6:4]—SSS) is interpreted as a three bit data manipulation field 1754C.

When U=1, the alpha field 1752 (EVEX byte 3, bit [7]—EH) is interpreted as the write mask control (Z) field 1752C. When U=1 and the MOD field 1842 contains 11 (signifying a no memory access operation), part of the beta field 1754 (EVEX byte 3, bit [4]—$S_0$) is interpreted as the RL field 1757A; when it contains a 1 (round 1757A.1) the rest of the beta field 1754 (EVEX byte 3, bit [6-5]—$S_{2-1}$) is interpreted as the round operation field 1759A, while when the RL field 1757A contains a 0 (VSIZE 1757.A2) the rest of the beta field 1754 (EVEX byte 3, bit [6-5]—$S_{2-1}$) is interpreted as the vector length field 1759B (EVEX byte 3, bit [6-5]—$L_{1-0}$). When U=1 and the MOD field 1842 contains 00, 01, or 10 (signifying a memory access operation), the beta field 1754 (EVEX byte 3, bits [6:4]—SSS) is interpreted as the vector length field 1759B (EVEX byte 3, bit [6-5]—$L_{1-0}$) and the broadcast field 1757B (EVEX byte 3, bit [4]—B).

Exemplary Register Architecture

Figure 19:
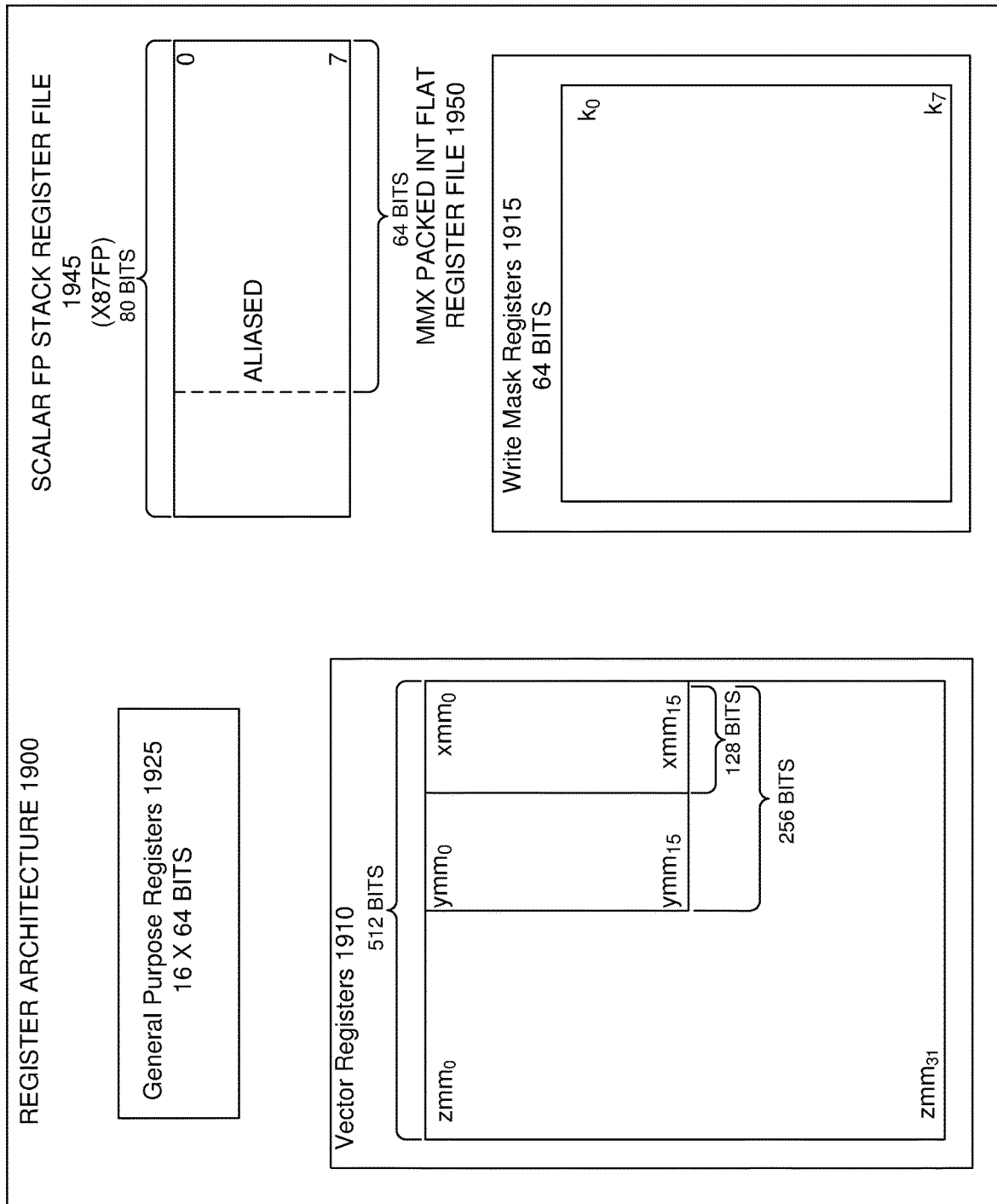
FIG. 19 is a block diagram of a register architecture according to one embodiment of the invention.

FIG. 19 is a block diagram of a register architecture 1900 according to one embodiment of the invention. In the embodiment illustrated, there are 32 vector registers 1910 that are 512 bits wide; these registers are referenced as zmm0 through zmm31. The lower order 256 bits of the lower 16 zmm registers are overlaid on registers ymm0-16. The lower order 128 bits of the lower 16 zmm registers (the lower order 128 bits of the ymm registers) are overlaid on registers xmm0-15. The specific vector friendly instruction format 1800 operates on these overlaid register file as illustrated in the below tables.

In other words, the vector length field 1759B selects between a maximum length and one or more other shorter lengths, where each such shorter length is half the length of the preceding length; and instructions templates without the vector length field 1759B operate on the maximum vector length. Further, in one embodiment, the class B instruction templates of the specific vector friendly instruction format 1800 operate on packed or scalar single/double-precision floating point data and packed or scalar integer data. Scalar operations are operations performed on the lowest order data element position in an zmm/ymm/xmm register; the higher order data element positions are either left the same as they were prior to the instruction or zeroed depending on the embodiment.

Write mask registers 1915—in the embodiment illustrated, there are 8 write mask registers (k0 through k7), each 64 bits in size. In an alternate embodiment, the write mask registers 1915 are 16 bits in size. As previously described, in one embodiment of the invention, the vector mask register k0 cannot be used as a write mask; when the encoding that would normally indicate k0 is used for a write mask, it selects a hardwired write mask of 0xFFFF, effectively disabling write masking for that instruction.

General-purpose registers 1925—in the embodiment illustrated, there are sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

Scalar floating point stack register file (x87 stack) 1945, on which is aliased the MMX packed integer flat register file 1950—in the embodiment illustrated, the x87 stack is an eight-element stack used to perform scalar floating-point operations on 32/64/80-bit floating point data using the x87 instruction set extension; while the MMX registers are used to perform operations on 64-bit packed integer data, as well as to hold operands for some operations performed between the MMX and XMM registers.

Alternative embodiments of the invention may use wider or narrower registers. Additionally, alternative embodiments of the invention may use more, less, or different register files and registers.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-

| Adjustable Vector Length | Class | Operations | Registers |
|---|---|---|---|
| Instruction Templates that do not include the vector length field 1759B | A (FIG. 17A; U = 0) | 1710, 1715, 1725, 1730 | zmm registers (the vector length is 64 byte) |
| | B (FIG. 17B; U = 1) | 1712 | zmm registers (the vector length is 64 byte) |
| Instruction templates that do include the vector length field 1759B | B (FIG. 17B; U = 1) | 1717, 1727 | zmm, ymm, or xmm registers (the vector length is 64 byte, 32 byte, or 16 byte) depending on the vector length field 1759B | purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-of-Order Core Block Diagram

FIG. 20A is a block diagram illustrating both an exemplary in-order pipeline and an exemplary register renaming, out-of-order issue/execution pipeline according to embodiments of the invention. FIG. 20B is a block diagram illustrating both an exemplary embodiment of an in-order architecture core and an exemplary register renaming, out-of-order issue/execution architecture core to be included in a processor according to embodiments of the invention. The solid lined boxes in FIGS. 20A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 20A, a processor pipeline 2000 includes a fetch stage 2002, a length decode stage 2004, a decode stage 2006, an allocation stage 2008, a renaming stage 2010, a scheduling (also known as a dispatch or issue) stage 2012, a register read/memory read stage 2014, an execute stage 2016, a write back/memory write stage 2018, an exception handling stage 2022, and a commit stage 2024.

FIG. 20B shows processor core 2090 including a front end unit 2030 coupled to an execution engine unit 2050, and both are coupled to a memory unit 2070. The core 2090 may be a reduced instruction set computing (RISC) core, a complex instruction set computing (CISC) core, a very long instruction word (VLIW) core, or a hybrid or alternative core type. As yet another option, the core 2090 may be a special-purpose core, such as, for example, a network or communication core, compression engine, coprocessor core, general purpose computing graphics processing unit (GPGPU) core, graphics core, or the like.

The front end unit 2030 includes a branch prediction unit 2032 coupled to an instruction cache unit 2034, which is coupled to an instruction translation lookaside buffer (TLB) 2036, which is coupled to an instruction fetch unit 2038, which is coupled to a decode unit 2040. The decode unit 2040 (or decoder) may decode instructions, and generate as an output one or more micro-operations, micro-code entry points, microinstructions, other instructions, or other control signals, which are decoded from, or which otherwise reflect, or are derived from, the original instructions. The decode unit 2040 may be implemented using various different mechanisms. Examples of suitable mechanisms include, but are not limited to, look-up tables, hardware implementations, programmable logic arrays (PLAs), microcode read only memories (ROMs), etc. In one embodiment, the core 2090 includes a microcode ROM or other medium that stores microcode for certain macroinstructions (e.g., in decode unit 2040 or otherwise within the front end unit 2030). The decode unit 2040 is coupled to a rename/allocator unit 2052 in the execution engine unit 2050.

The execution engine unit 2050 includes the rename/allocator unit 2052 coupled to a retirement unit 2054 and a set of one or more scheduler unit(s) 2056. The scheduler unit(s) 2056 represents any number of different schedulers, including reservations stations, central instruction window, etc. The scheduler unit(s) 2056 is coupled to the physical register file(s) unit(s) 2058. Each of the physical register file(s) units 2058 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 2058 comprises a vector registers unit, a write mask registers unit, and a scalar registers unit. These register units may provide architectural vector registers, vector mask registers, and general purpose registers. The physical register file(s) unit(s) 2058 is overlapped by the retirement unit 2054 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 2054 and the physical register file(s) unit(s) 2058 are coupled to the execution cluster(s) 2060. The execution cluster(s) 2060 includes a set of one or more execution units 2062 and a set of one or more memory access units 2064. The execution units 2062 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 2056, physical register file(s) unit(s) 2058, and execution cluster(s) 2060 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 2064). It should also be understood that where separate pipelines are used, one or more of these pipelines may be out-of-order issue/execution and the rest in-order.

The set of memory access units 2064 is coupled to the memory unit 2070, which includes a data TLB unit 2072 coupled to a data cache unit 2074 coupled to a level 2 (L2) cache unit 2076. In one exemplary embodiment, the memory access units 2064 may include a load unit, a store address unit, and a store data unit, each of which is coupled to the data TLB unit 2072 in the memory unit 2070. The instruction cache unit 2034 is further coupled to a level 2 (L2) cache unit 2076 in the memory unit 2070. The L2 cache unit 2076 is coupled to one or more other levels of cache and eventually to a main memory.

By way of example, the exemplary register renaming, out-of-order issue/execution core architecture may implement the pipeline 2000 as follows: 1) the instruction fetch 2038 performs the fetch and length decoding stages 2002 and 2004; 2) the decode unit 2040 performs the decode stage 2006; 3) the rename/allocator unit 2052 performs the allocation stage 2008 and renaming stage 2010; 4) the scheduler unit(s) 2056 performs the schedule stage 2012; 5) the physical register file(s) unit(s) 2058 and the memory unit 2070 perform the register read/memory read stage 2014; the execution cluster 2060 perform the execute stage 2016; 6) the memory unit 2070 and the physical register file(s) unit(s) 2058 perform the write back/memory write stage 2018; 7) various units may be involved in the exception handling stage 2022; and 8) the retirement unit 2054 and the physical register file(s) unit(s) 2058 perform the commit stage 2024.

The core 2090 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 2090 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 2034/2074 and a shared L2 cache unit 2076, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary in-Order Core Architecture

Figure 21B:
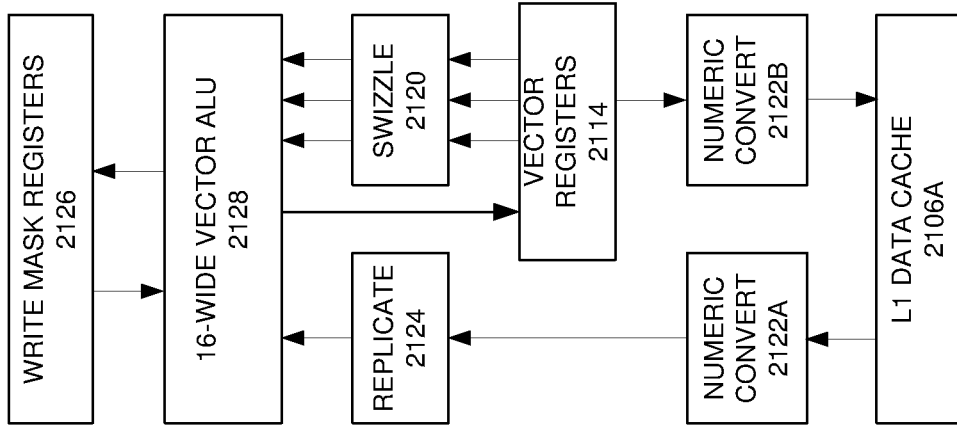
FIGS. 21A-B illustrate a block diagram of a more specific exemplary in-order core architecture, which core would be one of several logic blocks (including other cores of the same type and/or different types) in a chip.
Figure 21A:
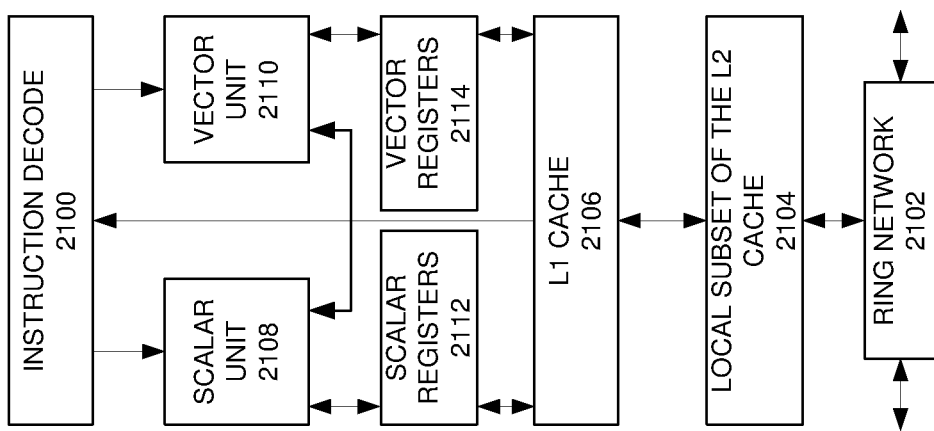

FIGS. 21A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 21A is a block diagram of a single processor core, along with its connection to the on-die interconnect network 2102 and with its local subset of the Level 2 (L2) cache 2104, according to embodiments of the invention. In one embodiment, an instruction decoder 2100 supports the x86 instruction set with a packed data instruction set extension. An L1 cache 2106 allows low-latency accesses to cache memory into the scalar and vector units. While in one embodiment (to simplify the design), a scalar unit 2108 and a vector unit 2110 use separate register sets (respectively, scalar registers 2112 and vector registers 2114) and data transferred between them is written to memory and then read back in from a level 1 (L1) cache 2106, alternative embodiments of the invention may use a different approach (e.g., use a single register set or include a communication path that allow data to be transferred between the two register files without being written and read back).

The local subset of the L2 cache 2104 is part of a global L2 cache that is divided into separate local subsets, one per processor core. Each processor core has a direct access path to its own local subset of the L2 cache 2104. Data read by a processor core is stored in its L2 cache subset 2104 and can be accessed quickly, in parallel with other processor cores accessing their own local L2 cache subsets. Data written by a processor core is stored in its own L2 cache subset 2104 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 21B is an expanded view of part of the processor core in FIG. 21A according to embodiments of the invention. FIG. 21B includes an L1 data cache 2106A part of the L1 cache 2104, as well as more detail regarding the vector unit 2110 and the vector registers 2114. Specifically, the vector unit 2110 is a 16-wide vector processing unit (VPU) (see the 16-wide ALU 2128), which executes one or more of integer, single-precision float, and double-precision float instructions. The VPU supports swizzling the register inputs with swizzle unit 2120, numeric conversion with numeric convert units 2122A-B, and replication with replication unit 2124 on the memory input. Write mask registers 2126 allow predicating resulting vector writes.

Figure 22:
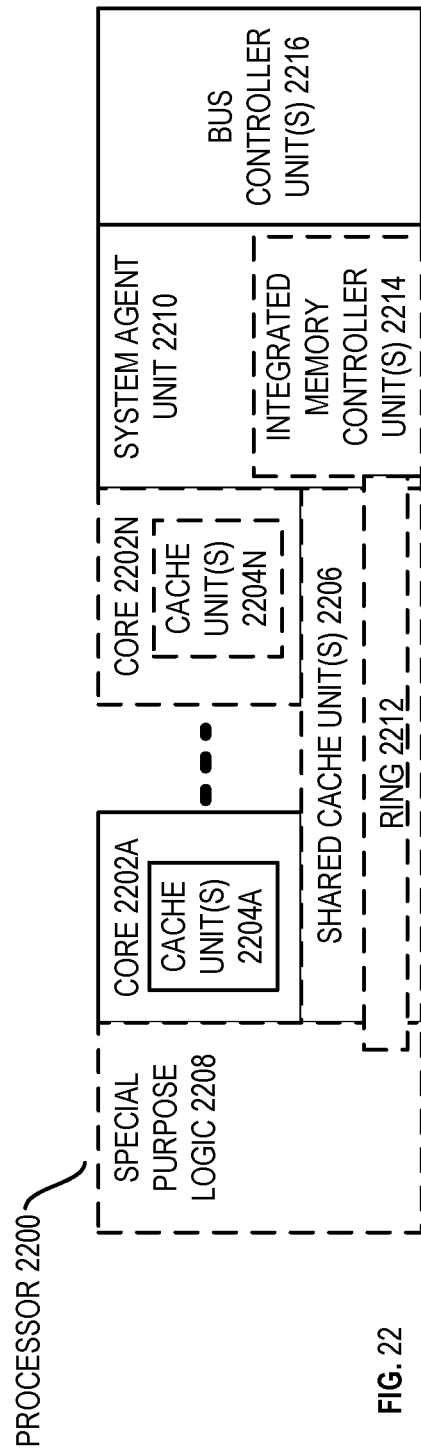
FIG. 22 is a block diagram of a processor that may have more than one core, may have an integrated memory controller, and may have integrated graphics according to embodiments of the invention.

FIG. 22 is a block diagram of a processor 2200 that may have more than one core, may have an integrated memory controller, and may have integrated graphics according to embodiments of the invention. The solid lined boxes in FIG. 22 illustrate a processor 2200 with a single core 2202A, a system agent 2210, a set of one or more bus controller units 2216, while the optional addition of the dashed lined boxes illustrates an alternative processor 2200 with multiple cores 2202A-N, a set of one or more integrated memory controller unit(s) 2214 in the system agent unit 2210, and special purpose logic 2208.

Thus, different implementations of the processor 2200 may include: 1) a CPU with the special purpose logic 2208 being integrated graphics and/or scientific (throughput) logic (which may include one or more cores), and the cores 2202A-N being one or more general purpose cores (e.g., general purpose in-order cores, general purpose out-of-order cores, a combination of the two); 2) a coprocessor with the cores 2202A-N being a large number of special purpose cores intended primarily for graphics and/or scientific (throughput); and 3) a coprocessor with the cores 2202A-N being a large number of general purpose in-order cores. Thus, the processor 2200 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 2200 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 2206, and external memory (not shown) coupled to the set of integrated memory controller units 2214. The set of shared cache units 2206 may include one or more mid-level caches, such as level 2 (L2), level 3 (L3), level 4 (L4), or other levels of cache, a last level cache (LLC), and/or combinations thereof. While in one embodiment a ring based interconnect unit 2212 interconnects the integrated graphics logic 2208, the set of shared cache units 2206, and the system agent unit 2210/integrated memory controller unit(s) 2214, alternative embodiments may use any number of well-known techniques for interconnecting such units. In one embodiment, coherency is maintained between one or more cache units 2206 and cores 2202-A-N.

In some embodiments, one or more of the cores 2202A-N are capable of multi-threading. The system agent 2210 includes those components coordinating and operating cores 2202A-N. The system agent unit 2210 may include for example a power control unit (PCU) and a display unit. The PCU may be or include logic and components needed for regulating the power state of the cores 2202A-N and the integrated graphics logic 2208. The display unit is for driving one or more externally connected displays.

The cores 2202A-N may be homogenous or heterogeneous in terms of architecture instruction set; that is, two or more of the cores 2202A-N may be capable of execution the same instruction set, while others may be capable of executing only a subset of that instruction set or a different instruction set.

Exemplary Computer Architectures

Figure 23:
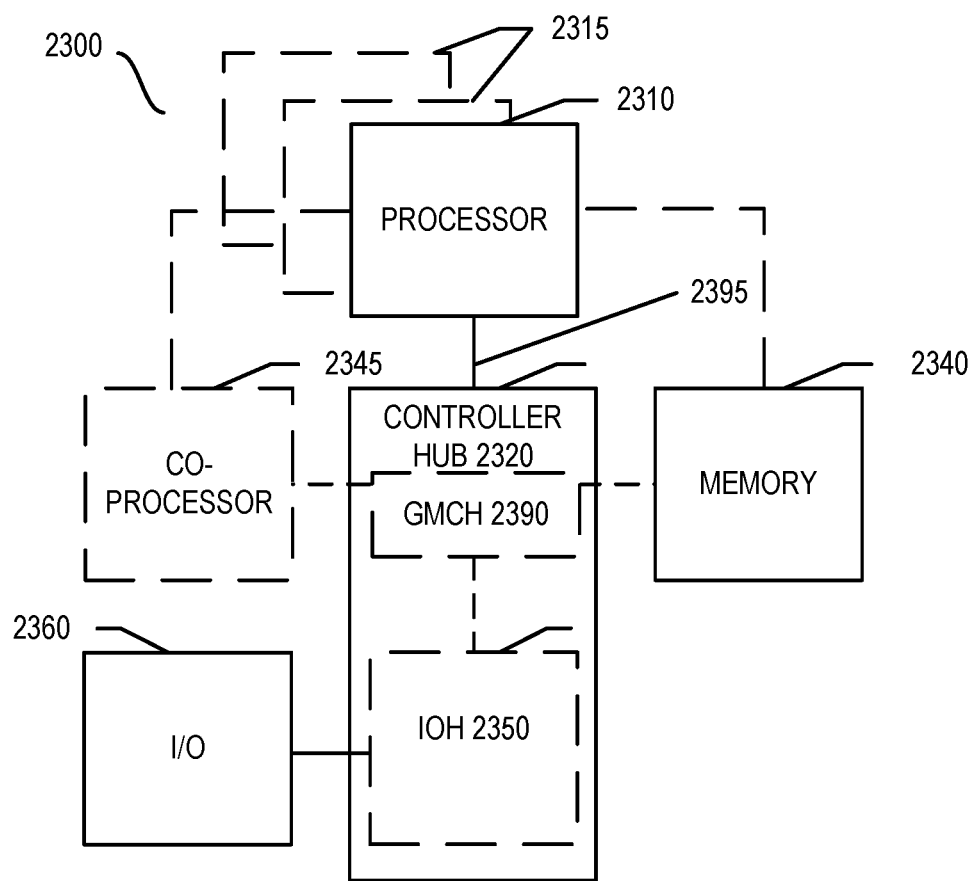
FIGS. 23-24 are block diagrams of exemplary computer architectures.
Figure 24:
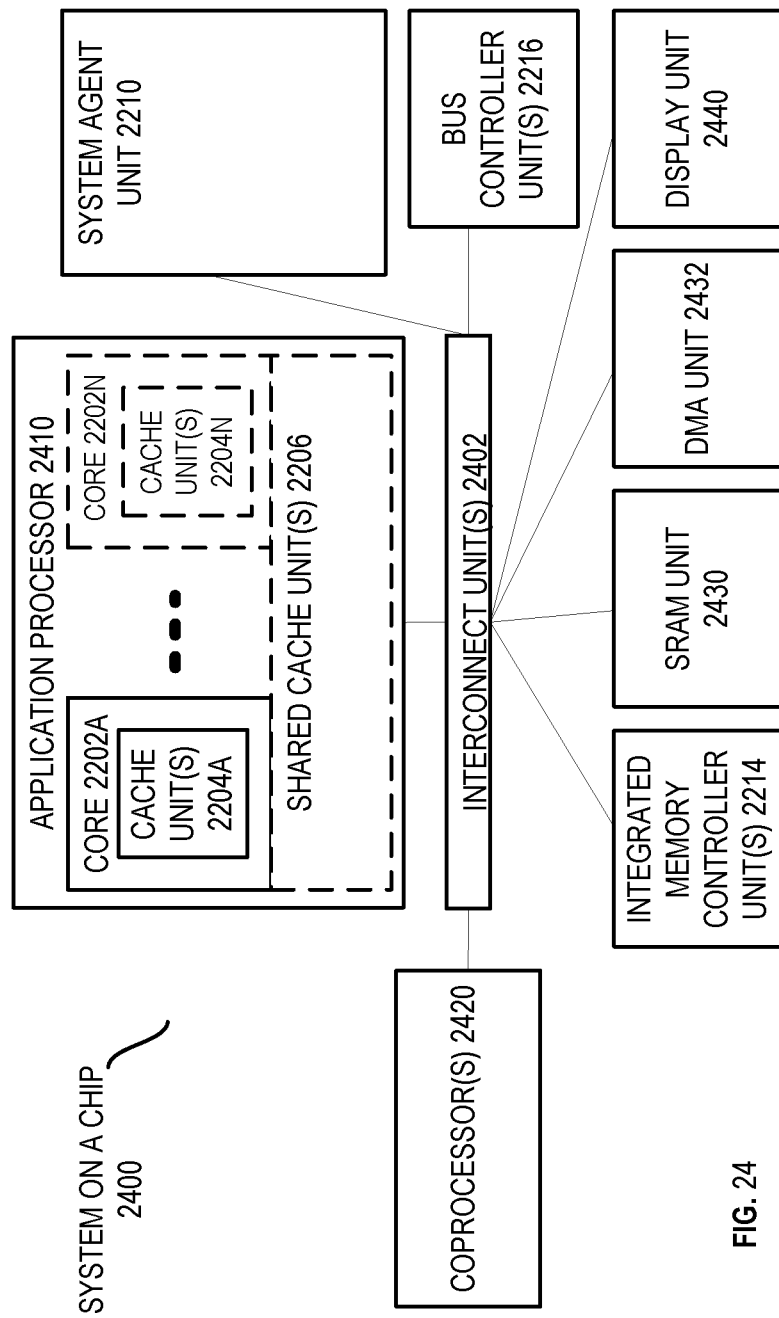

FIGS. 23-24 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Referring now to FIG. 23, shown is a block diagram of a system 2300 in accordance with one embodiment of the present invention. The system 2300 may include one or more processors 2310, 2315, which are coupled to a controller hub 2320. In one embodiment the controller hub 2320 includes a graphics memory controller hub (GMCH) 2390 and an Input/Output Hub (IOH) 2350 (which may be on separate chips); the GMCH 2390 includes memory and graphics controllers to which are coupled memory 2340 and a coprocessor 2345; the IOH 2350 is couples input/output (I/O) devices 2360 to the GMCH 2390. Alternatively, one or both of the memory and graphics controllers are integrated within the processor (as described herein), the memory 2340 and the coprocessor 2345 are coupled directly to the processor 2310, and the controller hub 2320 in a single chip with the IOH 2350.

The optional nature of additional processors 2315 is denoted in FIG. 23 with broken lines. Each processor 2310, 2315 may include one or more of the processing cores described herein and may be some version of the processor 2200.

The memory 2340 may be, for example, dynamic random access memory (DRAM), phase change memory (PCM), or a combination of the two. For at least one embodiment, the controller hub 2320 communicates with the processor(s) 2310, 2315 via a multi-drop bus, such as a frontside bus (FSB), point-to-point interface such as QuickPath Interconnect (QPI), or similar connection 2395.

In one embodiment, the coprocessor 2345 is a special-purpose processor, such as, for example, a high-throughput MIC processor, a network or communication processor, compression engine, graphics processor, GPGPU, embedded processor, or the like. In one embodiment, controller hub 2320 may include an integrated graphics accelerator.

There can be a variety of differences between the physical resources 2310, 2315 in terms of a spectrum of metrics of merit including architectural, microarchitectural, thermal, power consumption characteristics, and the like.

In one embodiment, the processor 2310 executes instructions that control data processing operations of a general type. Embedded within the instructions may be coprocessor instructions. The processor 2310 recognizes these coprocessor instructions as being of a type that should be executed by the attached coprocessor 2345. Accordingly, the processor 2310 issues these coprocessor instructions (or control signals representing coprocessor instructions) on a coprocessor bus or other interconnect, to coprocessor 2345. Coprocessor(s) 2345 accept and execute the received coprocessor instructions.

Referring now to FIG. 24, shown is a block diagram of a SoC 2400 in accordance with an embodiment of the present invention. Similar elements in FIG. 22 bear like reference numerals. Also, dashed lined boxes are optional features on more advanced SoCs. In FIG. 24, an interconnect unit(s) 2402 is coupled to: an application processor 2410 which includes a set of one or more cores 202A-N and shared cache unit(s) 2206; a system agent unit 2210; a bus controller unit(s) 2216; an integrated memory controller unit(s) 2214; a set or one or more coprocessors 2420 which may include integrated graphics logic, an image processor, an audio processor, and a video processor; an static random access memory (SRAM) unit 2430; a direct memory access (DMA) unit 2432; and a display unit 2440 for coupling to one or more external displays. In one embodiment, the coprocessor(s) 2420 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 25:
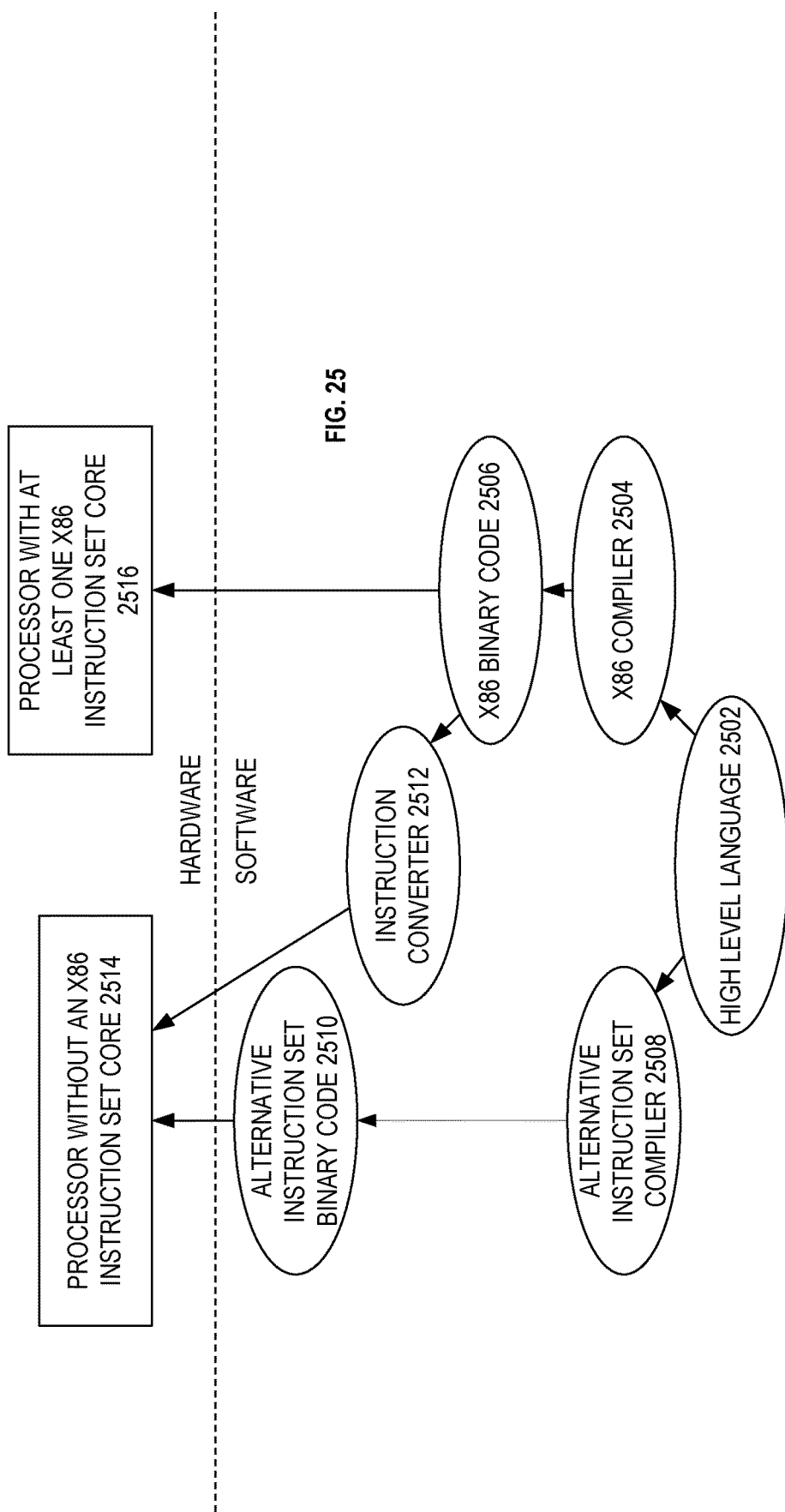
FIG. 25 is a block diagram contrasting the use of a software instruction converter to convert binary instructions in a source instruction set to binary instructions in a target instruction set according to embodiments of the invention.

FIG. 25 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 25 shows a program in a high level language 2502 may be compiled using an x86 compiler 2504 to generate x86 binary code 2506 that may be natively executed by a processor with at least one x86 instruction set core 2516. The processor with at least one x86 instruction set core 2516 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 2504 represents a compiler that is operable to generate x86 binary code 2506 (e.g., object code) that can, with or without additional linkage processing, be executed on the processor with at least one x86 instruction set core 2516. Similarly, FIG. 25 shows the program in the high level language 2502 may be compiled using an alternative instruction set compiler 2508 to generate alternative instruction set binary code 2510 that may be natively executed by a processor without at least one x86 instruction set core 2514 (e.g., a processor with cores that execute the MIPS instruction set of MIPS Technologies of Sunnyvale, Calif. and/or that execute the ARM instruction set of ARM Holdings of Sunnyvale, Calif.). The instruction converter 2512 is used to convert the x86 binary code 2506 into code that may be natively executed by the processor without an x86 instruction set core 2514. This converted code is not likely to be the same as the alternative instruction set binary code 2510 because an instruction converter capable of this is difficult to make; however, the converted code will accomplish the general operation and be made up of instructions from the alternative instruction set. Thus, the instruction converter 2512 represents software, firmware, hardware, or a combination thereof that, through emulation, simulation or any other process, allows a processor or other electronic device that does not have an x86 instruction set processor or core to execute the x86 binary code 2506.

Logic for Operating at Expanded Refresh Rates

Figure 26:
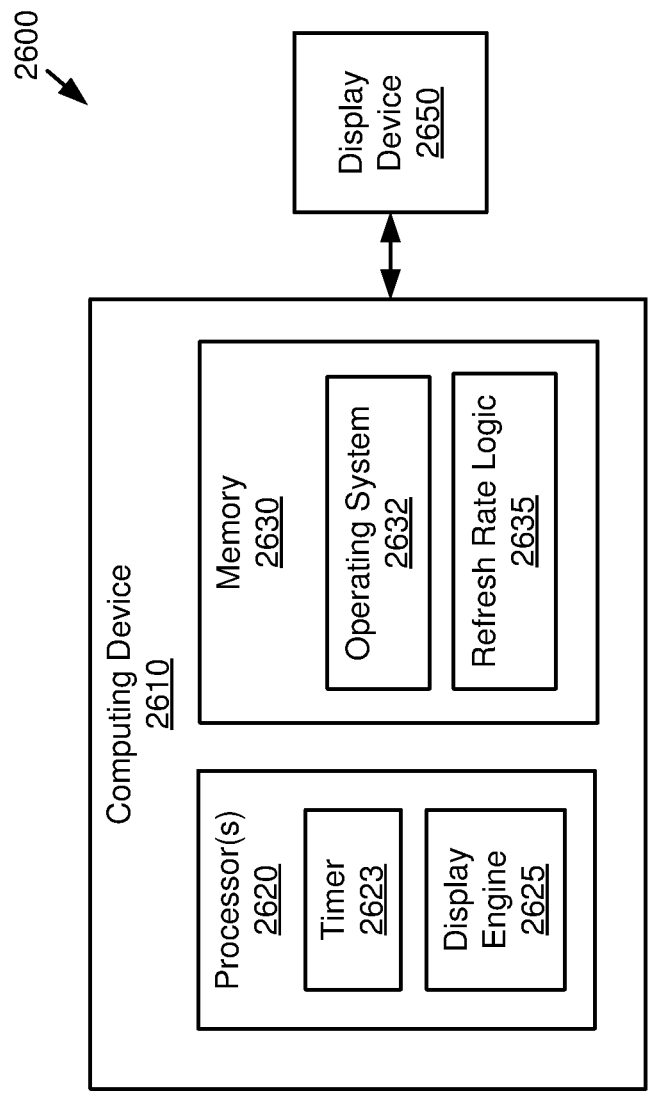
FIG. 26 is a diagram of an example system in accordance with one or more embodiments.

Referring now to FIG. 26, shown is a block diagram of a system 2600 in accordance with one or more embodiments. In some embodiments, the system 2600 may be all or a portion of an electronic device or component. For example, the system 2600 may be a cellular telephone, a computer, a server, a network device, a system on a chip (SoC), a controller, a wireless transceiver, a wearable device, etc. Furthermore, in some embodiments, the system 2600 may be part of a grouping of related or interconnected devices, such as a datacenter, a computing cluster, etc.

As shown in FIG. 26, the system 2600 may include a computing device 2610 coupled to a display device 2650. Further, although not shown in FIG. 26, the system 2600 may include other components. The display device 2650 may be a device that can present video and other image content (e.g., monitor, television, projector, and so forth). As shown, in some embodiments, the display device 2650 may be external to the computing device 2610. However, in other embodiments, the display device 2650 may be included in the computing device 2610.

In one or more embodiments, the computing device 2610 may include one or more processor(s) 2620 and memory 2630. The memory 2630 may be implemented with any type(s) of computer memory (e.g., dynamic random-access memory (DRAM), static random-access memory (SRAM), non-volatile memory (NVM), a combination of DRAM and NVM, etc.).

The processor 2620 may be a hardware processing device (e.g., a central processing unit (CPU), a System on a Chip (SoC), and so forth). As shown, the processor 2620 can include timer 2623 and a display engine 2625. In some embodiments, the timer 2623 and the display engine 2625 may implemented in hardware (e.g., electronic circuitry). For example, the timer 2623 may be an Advanced Programmable Interrupt Controller (APIC) timer of the processor 2620. The display engine 2625 may produce a video/image provided to the display device 2650. Further, although not shown in FIG. 26, the processor 2620 may include other components, such as processing engines (also referred to as "processing cores") to execute program instructions.

In one or more embodiments, the memory 2630 may include an operating system (OS) 2632 and refresh rate logic 2635. The operating system 2632 may control and/or supports the basic functions of the computing device 2610, such as executing applications, controlling peripherals, managing power settings, and so forth.

In one or more embodiments, the refresh rate logic 2635 may provide expanded refresh rates for the display device 2650. For example, the refresh rate logic 2635 may mask interrupts generated by the display device 2650 or the display engine 2625, and may cause emulated interrupts to be generated at an expanded refresh rate of the display device 2650. The functionality of the refresh rate logic 2635 is described further below with reference to FIGS. 27-31.

In some embodiments, the refresh rate logic 2635 may be implemented as software instructions (e.g., executable by the processor(s) 2620. For example, the refresh rate logic 2635 may be implemented in a graphics driver of the computing device 2610. However, embodiments are not limited in this regard. For example, in some embodiments, the refresh rate logic 2635 may be implemented in other software (e.g., in OS 2632), in hardware (e.g., in the computing device 2610, processor 2620, display engine 2625, display device 2650), and so forth.

Figure 27:
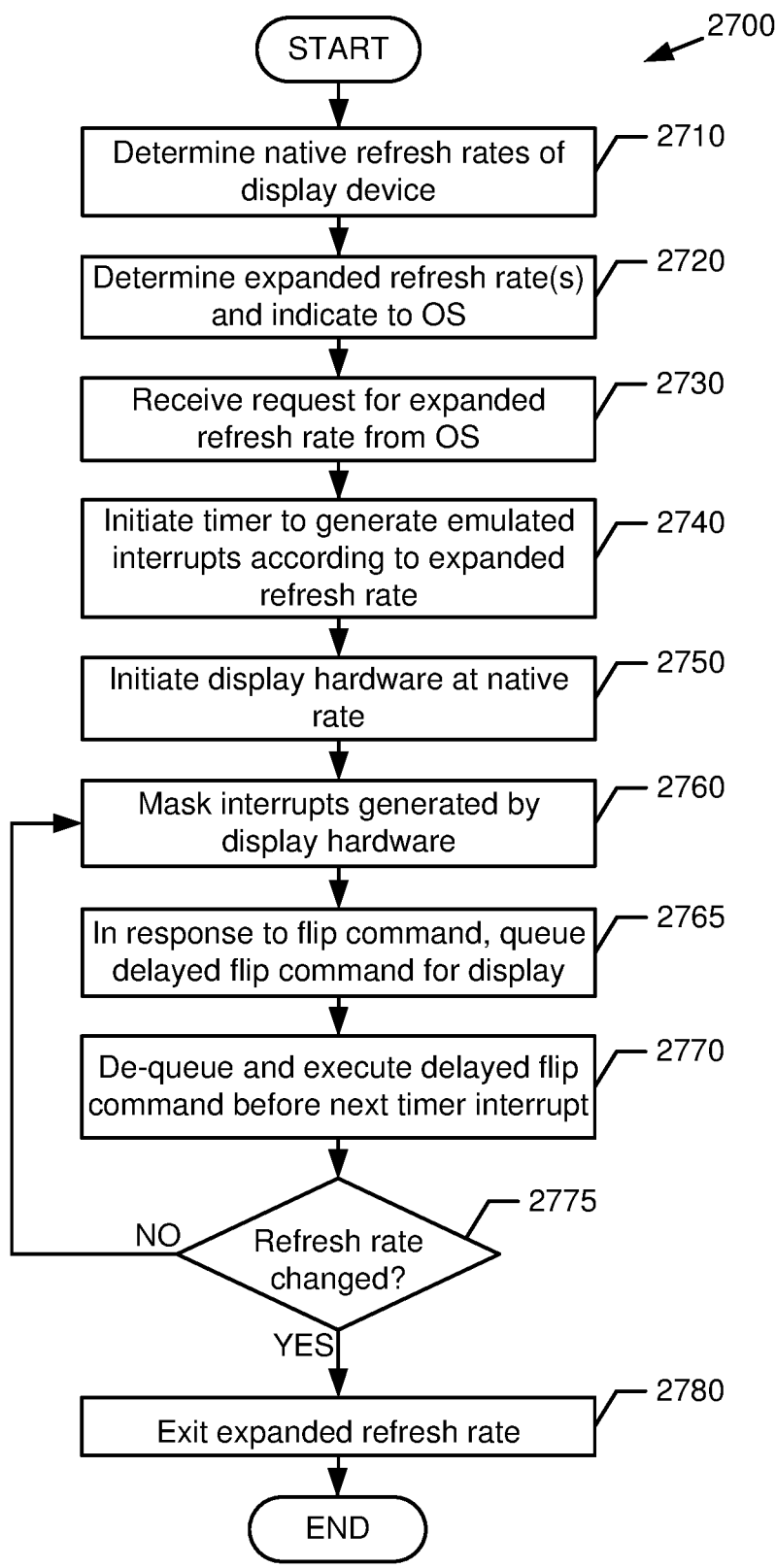
FIG. 27 is a flow diagram of an example method in accordance with one or more embodiments.

Referring now to FIG. 27, shown is a flow diagram of a method 2700 in accordance with one or more embodiments. In various embodiments, the method 2700 may be performed by processing logic that may include hardware (e.g., processing device, circuitry, dedicated logic, programmable logic, microcode, etc.), software (e.g., instructions run on a processing device), or a combination thereof. In some implementations, the method 2700 may be performed using one or more components shown in FIG. 26 (e.g., refresh rate logic 2635, processor(s) 2620, operating system 2632, and so forth). In firmware or software embodiments, the method 2700 may be implemented by computer executed instructions stored in a non-transitory machine readable medium, such as an optical, semiconductor, or magnetic storage device. For the sake of illustration, the actions involved in the method 2700 may be described below with reference to FIGS. 26 and 28, which show examples in accordance with one or more embodiments. However, the scope of the various embodiments discussed herein is not limited in this regard.

Block 2710 may include determining a set of native refresh rates of a display device. For example, referring to FIG. 26, the refresh rate logic 2635 may receive information (e.g., a signal, a bit, etc.) indicating the refresh rates that are natively supported by the display device 2650 (e.g., 48 Hz and 60 Hz). In one or more embodiments, the refresh rate logic 2635 may be a graphics driver of the computing device 2610.

Block 2720 may include determining one or more expanded refresh rates for the display device, and indicating the expanded refresh rates to an operating system (OS). For example, referring to FIG. 26, the refresh rate logic 2635 may determine a set of expanded refresh rates for the display device 2650. Accordingly, the display device 2650 will not natively support the set of expanded refresh rates. Further, the refresh rate logic 2635 may notify the operating system 2632 of the determined expanded refresh rates for the display device 2650.

In some embodiments, the expanded refresh rates are determined as submultiples of the native refresh rates of a display device (i.e., an expanded refresh rate can be divided into a native refresh rate by an integer value without a remainder). Thus, for each expanded refresh rate, at least one native refresh rate is evenly divisible by the expanded refresh rate (i.e., the native refresh rate is an integer multiple of the expanded refresh rate). For example, referring to FIG. 26, assume that the display device 2650 includes native refresh rates of 48 Hz and 60 Hz. In this example, the expanded refresh rates may include 24 Hz (48 Hz divided by two) and 30 Hz (60 Hz divided by two). In some embodiments, one or more expanded refresh rates may be limited to industry standard refresh rates that are used by various types of display devices.

Block 2730 may include receiving a request for an expanded refresh rate from the operating system. In some embodiments, the operating system may generate the request during a preparation process for displaying a video file that is associated with the expanded refresh rate (e.g., a video file specified to play at a frame rate corresponding to the expanded refresh rate). For example, referring to FIG. 26, the operating system 2632 may detect that a video file having metadata specifying a frame rate of 24 fps is to be displayed on the display device 2650. In response, the operating system 2632 may send a request for an expanded refresh rate of 24 Hz (corresponding to the frame rate of 24 fps) to the refresh rate logic 2635. Assume that this expanded refresh rate is not natively supported by the display device 2650, but the operating system 2632 previously received information indicating that the display device 2650 supports this expanded refresh rate (e.g., as discussed above with reference to block 2720). Accordingly, the operating system 2632 operates as if the expanded refresh rate of 24 Hz is supported by the display device 2650, and thus the operating system 2632 does not perform additional operations to present each frame of the video file multiple times (e.g., present each frame twice to conform to a lowest native refresh rate of 48 Hz).

Block 2740 may include initiating a timer to generate emulated interrupts according to the expanded refresh rate. For example, referring to FIG. 26, the refresh rate logic 2635 may program the timer 2623 in processor 2620 to generate or trigger emulated interrupts based on the requested expanded refresh rate (e.g., 24 Hz). An example of emulated interrupts is described further below with reference to FIG. 28.

Figure 28:
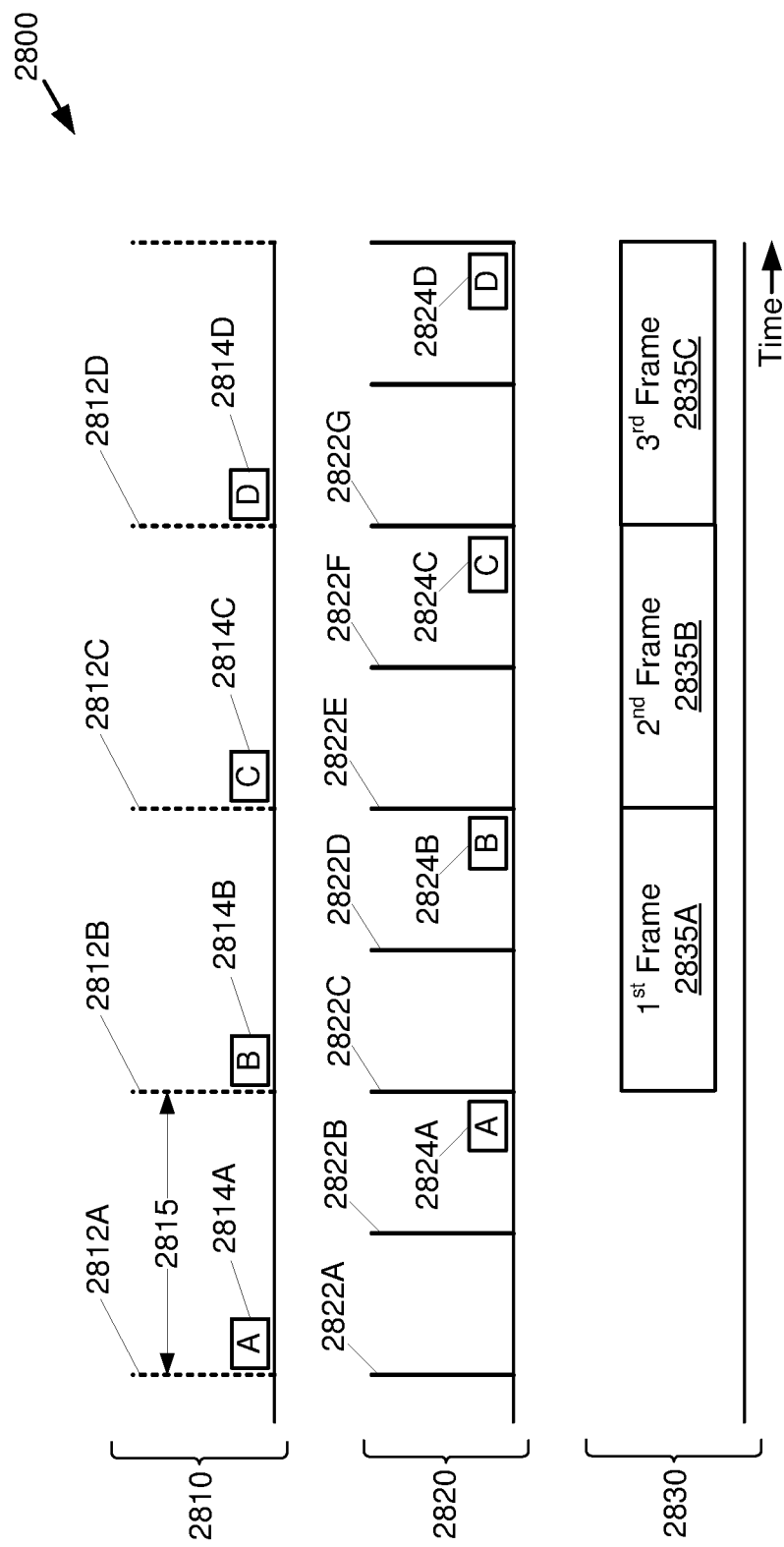
FIG. 28 is a diagram of example events in accordance with one or more embodiments.

Referring now to FIG. 28, shown is a diagram 2800 of system events in accordance with one or more embodiments. Specifically, the diagram 2800 includes a first timeline 2810 illustrating events associated with an operating system, a second timeline 2820 illustrating events associated with display hardware (i.e., display device and/or graphics processing hardware), and a third timeline 2830 illustrating the time periods that frames 2835A-2835C are presented on a display device. Assume that the events that are aligned vertically across the three timelines 2810-2830 occur at a same point in time. Assume further that the horizontal axis represents the passage of time (i.e., from left to right).

As shown, the first timeline 2810 includes emulated interrupts 2812A-2812D (also referred to as emulated interrupts 2812) and flip commands 2814A-2814D (also referred to as flip commands 2814). Assume that the spacing 2815 between the emulated interrupts 2812 corresponds to the expanded refresh rate (e.g., requested at block 2730 shown in FIG. 27). Further, the emulated interrupts 2812 are sent to the operating system to indicate a separation between frames of video content. For example, the emulated interrupts 2812 may emulate Vertical Blank Interval (VBI) interrupts. Accordingly, after each emulated interrupt 2812, the operating system may schedule a flip command 2814 to provide the next frame to be displayed from the start of the next interrupt interval.

Referring again to FIG. 27, block 2750 may include initiating display hardware (i.e., a display device and/or a display engine) at the native refresh rate. In one or more embodiments, the native refresh rate initiated at block 2750 may be associated with the expanded refresh rate (requested at block 2730). Further block 2760 may include masking interrupts from the display hardware. For example, referring to FIGS. 26 and 28, the refresh rate logic 2635 may control or otherwise cause the display device 2650 and/or the display engine 2625 to operate at a native refresh rate that is an integer multiple of the expanded refresh rate requested by the operating system 2632. In some embodiments, the refresh rate logic 2635 may also cause a GPU or other graphics hardware to operate at the native refresh rate.

As shown in FIG. 28, the second timeline 2820 includes display interrupts 2822A-2822D (also referred to as display interrupts 2822) and delayed flip commands 2824A-2824D (also referred to as delayed flip commands 2824). The display interrupts 2822 may be generated by display hardware (e.g., display engine 2625). In some embodiments, the refresh rate logic 2635 may mask the display interrupts 2822 before they can be provided to the operating system 2632.

Note that, in the example, of FIG. 28, for every two display interrupts 2822 that are masked and thus not received by the operating system 2632, the operating system 2632 instead receives a single emulated interrupt 2812. Accordingly, in some embodiments, the processor load associated with handling interrupts is reduced by half. Thus, in this manner, the power consumption associated with video processing may be reduced.

Referring again to FIG. 27, block 2765 may include, in response to a flip command, queuing a delayed flip command for the display hardware. Further, block 2770 may include de-queuing and executing the delayed flip command before next timer interrupt. For example, referring to FIGS. 26 and 28, the refresh rate logic 2635 may detect the flip command 2814A after the first emulated interrupt 2812A, and in response may queue the delayed flip command 2824A. Further, the refresh rate logic 2635 may de-queue the delayed flip command 2824A prior to the expected arrival time of the second emulated interrupt 2812B, thereby causing the first frame 2835A to be displayed on the display device for one interval period 2815. Thus, in this manner, the display of the frames 2835 is synchronized with the corresponding emulated interrupt 2812 and display interrupts 2822.

Referring again to FIG. 27, at diamond 2775, it is determined whether the refresh rate is to be changed. If it is determined that the refresh rate is not to be changed, the method 2700 returns to block 2760 to continue masking interrupts generated by the display hardware. However, if it is determined at diamond 2775 that the refresh rate is to be changed, then the method 2700 continues at block 2780, which includes exiting the expanded refresh rate. For example, referring to FIG. 26, the refresh rate logic 2635 may detect that the display device 2650 is to be switched to a native refresh rate (e.g., because the current video file is ending, the viewing mode has been modified, a new video file with a different refresh rate is to be played, and so forth). If so, the refresh rate logic 2635 may return to a normal operation (i.e., to no longer perform blocks 2710-2770). For example, the refresh rate logic 2635 may stop masking display interrupts, cause the timer 2623 to stop generating emulated interrupts, and so forth. After block 2780, the method 2700 is completed.

Figure 29:
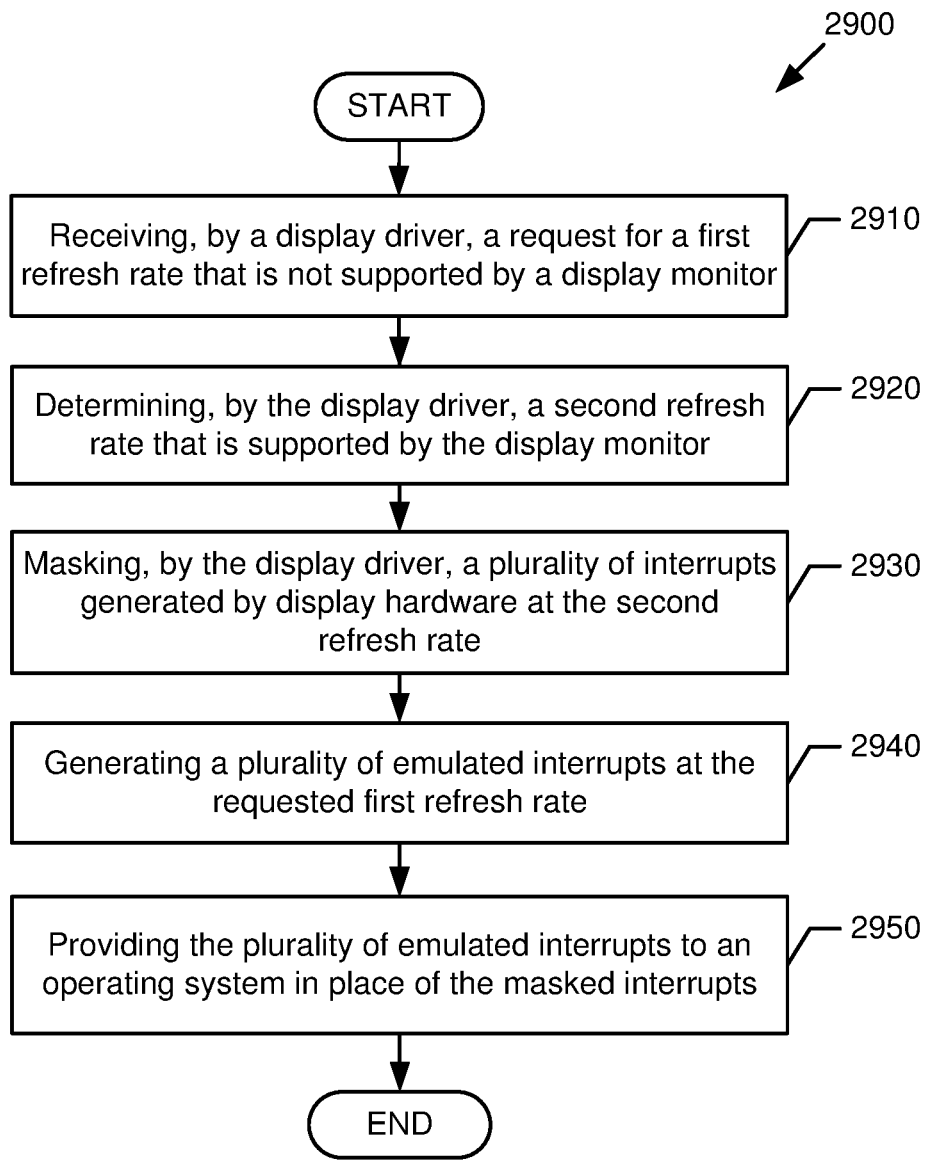
FIG. 29 is a flow diagram of an example method in accordance with one or more embodiments.

Referring now to FIG. 29, shown is a flow diagram of a method 2900 in accordance with one or more embodiments. In various embodiments, the method 2900 may be performed by processing logic that may include hardware (e.g., processing device, circuitry, dedicated logic, programmable logic, microcode, etc.), software (e.g., instructions run on a processing device), or a combination thereof. In some implementations, the method 2900 may be performed using one or more components shown in FIG. 26 (e.g., refresh rate logic 2635, processor(s) 2620, operating system 2632, and so forth). In firmware or software embodiments, the method 2900 may be implemented by computer executed instructions stored in a non-transitory machine readable medium, such as an optical, semiconductor, or magnetic storage device. For the sake of illustration, the actions involved in the method 2900 may be described below with reference to FIGS. 26 and 28, which show examples in accordance with one or more embodiments. However, the scope of the various embodiments discussed herein is not limited in this regard.

Block 2910 may include receiving, by a display driver, a request for a first refresh rate that is not supported by a display monitor. Block 2920 may include determining, by the display driver, a second refresh rate that is supported by the display monitor. For example, referring to FIG. 26, the refresh rate logic 2635 may receive a request for an expanded refresh rate (e.g., 24 Hz) that is not natively supported by the display device 2650. In response, the refresh rate logic 2635 may determine a native refresh rate (e.g., 48 Hz) that is natively supported by the display device 2650, and which is a multiple of the requested refresh rate. Stated differently, the native refresh rate may be equal to a product of the requested refresh rate multiplied by an integer value (e.g., 2).

Block 2930 may include masking, by the display driver, a plurality of interrupts generated by display hardware at the second refresh rate. Block 2940 may include generating a plurality of emulated interrupts at the requested first refresh rate. Block 2950 may include providing the plurality of emulated interrupts to an operating system in place of the masked interrupts. For example, referring to FIGS. 26 and 28, the refresh rate logic 2635 may mask the display interrupts 2822 before they can be provided to the operating system 2632. Further, the refresh rate logic 2635 may program the timer 2623 to generate the emulated interrupts 2812 based on the requested expanded refresh rate (e.g., 24 Hz). The operating system 2632 may then receive emulated interrupts 2812. In one or more embodiments, the power consumption associated with handling display interrupts by the operating system 2632 may be reduced. After block 2950, the method 2900 is completed.

Figure 30:
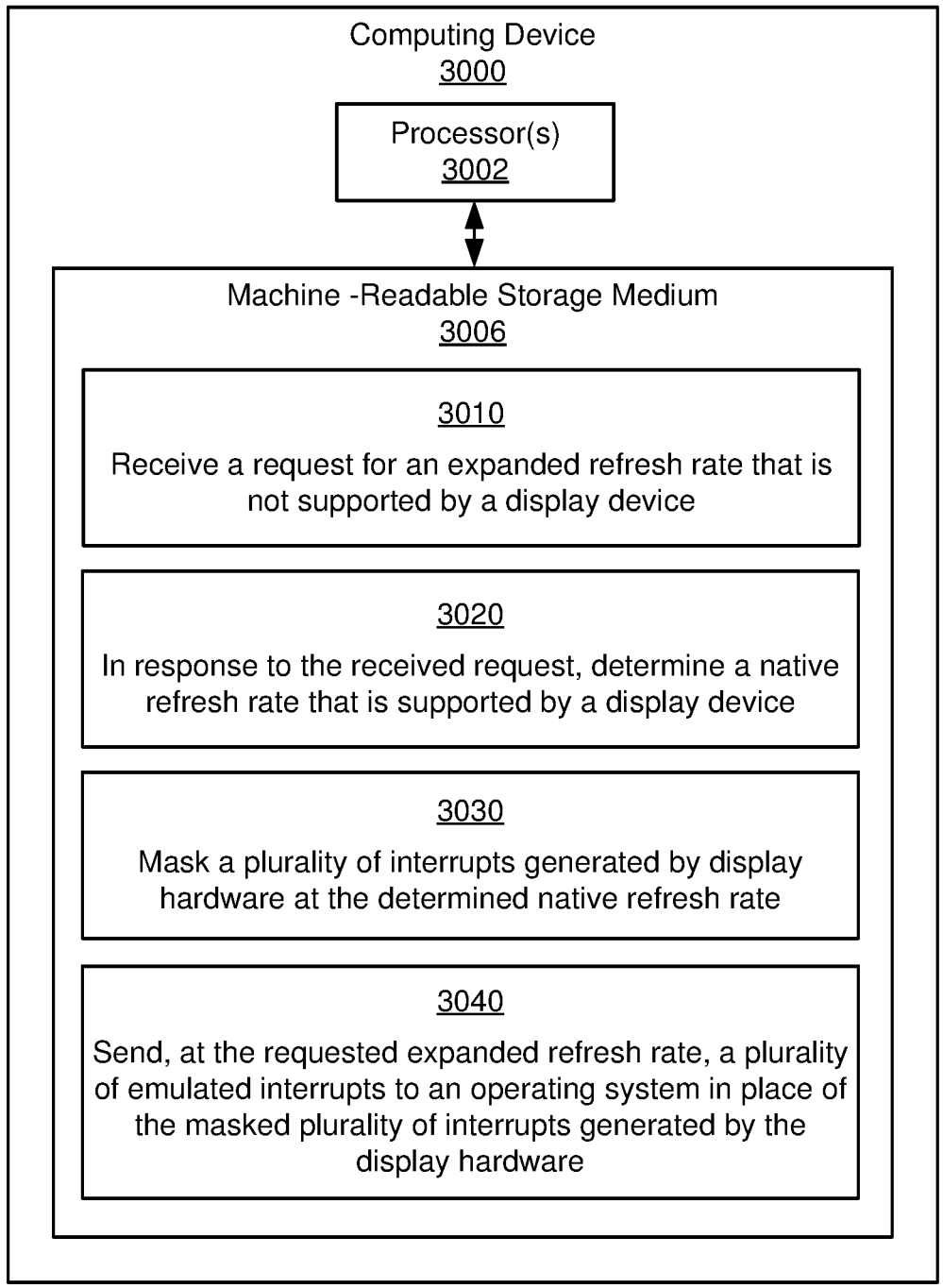
FIG. 30 is a diagram of an example computing device in accordance with one or more embodiments.

Referring now to FIG. 30, shown is a schematic diagram of an example computing device 3000. In some examples, the computing device 3000 may correspond generally to the computing device 2610 shown in FIG. 26. As shown, the computing device 3000 may include a hardware processor(s) 3002 and machine-readable storage medium 3006. The machine-readable storage medium 3006 may be a non-transitory medium, and may store instructions 3010-3040. The instructions 3010-3040 can be executed by the hardware processor(s) 3002.

Instruction 3010 may be executed to receive a request for an expanded refresh rate that is not supported by a display device. Instruction 3020 may be executed to, in response to the received request, determine a native refresh rate that is supported by display hardware. Instruction 3030 may be executed to mask a plurality of interrupts generated by the display device at the determined native refresh rate. Instruction 3040 may be executed to send, at the requested expanded refresh rate, a plurality of emulated interrupts to an operating system in place of the masked plurality of interrupts generated by the display hardware.

Figure 31:
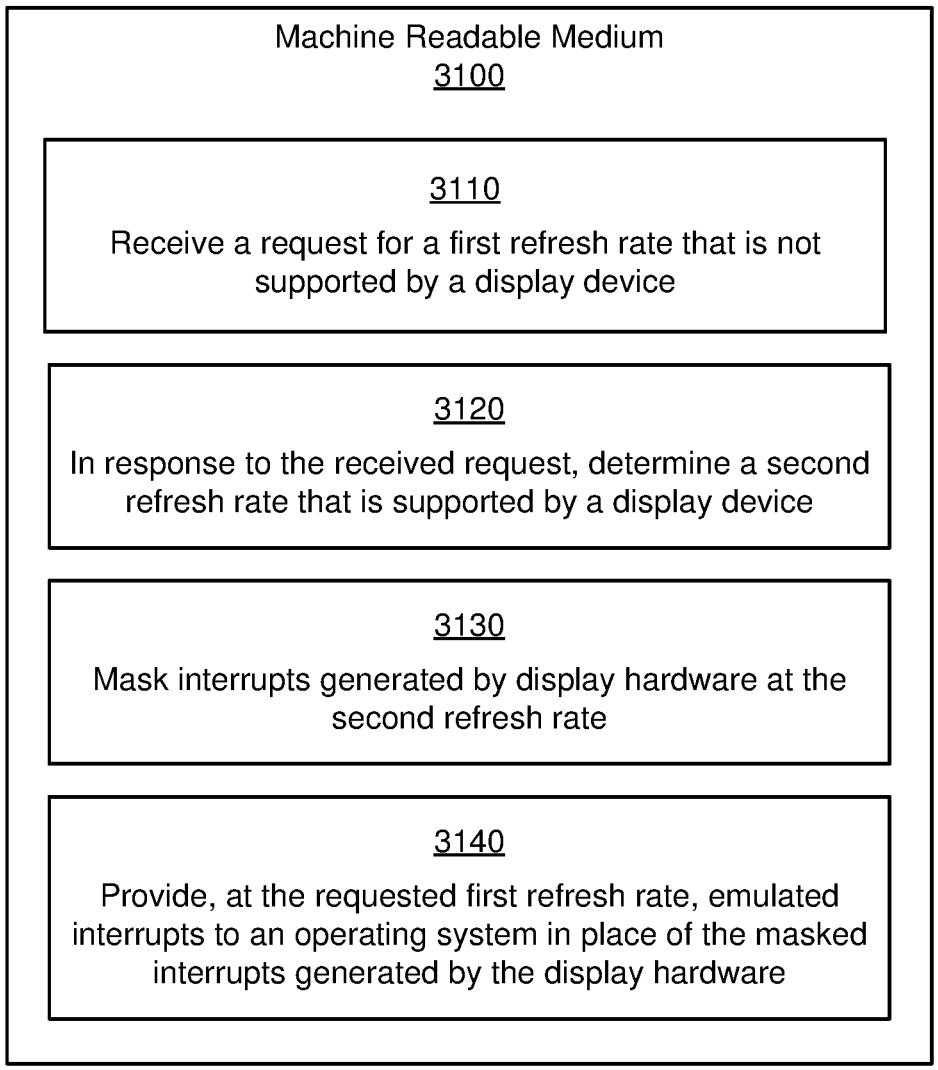
FIG. 31 is a diagram of an example machine-readable storage medium storing instructions in accordance with one or more embodiments.

Referring now to FIG. 31, shown is a machine-readable storage medium 3100 storing instructions 3110-3140, in accordance with some implementations. The instructions 3110-3140 can be executed by any number of processors (e.g., the processor(s) 2620 shown in FIG. 26). The machine-readable storage medium 3100 may be any non-transitory computer readable medium, such as an optical, semiconductor, or magnetic storage device.

Instruction 3110 may be executed to receive a request for a first refresh rate that is not supported by a display device. Instruction 3120 may be executed to, in response to the received request, determine a second refresh rate that is supported by a display device. Instruction 3130 may be executed to mask interrupts generated by display hardware at the second refresh rate. Instruction 3140 may be executed to provide, at the requested first refresh rate, emulated interrupts to an operating system in place of the masked interrupts generated by the display hardware.

The following clauses and/or examples pertain to further embodiments.

In Example 1, a computing device for using expanded refresh rates includes a processor and a machine-readable storage medium storing instructions. The instructions are executable by the hardware processor to: receive a request for an expanded refresh rate that is not supported by a display device; in response to the received request, determine a native refresh rate that is supported by a display device; mask a plurality of interrupts generated by display hardware at the determined native refresh rate; and send, at the requested expanded refresh rate, a plurality of emulated interrupts to an operating system in place of the masked plurality of interrupts generated by the display hardware.

In Example 2, the subject matter of Example 1 may optionally include that the request is generated by the operating system, and the request is received by a graphics driver.

In Example 3, the subject matter of Examples 1-2 may optionally include that the instructions are executable by the processor to: program a timer of the hardware processor to generate the plurality of emulated interrupts at the requested expanded refresh rate; and initiate the display device at the determined native refresh rate.

In Example 4, the subject matter of Examples 1-3 may optionally include that the request for the expanded refresh rate is associated with video content to be displayed on the display device.

In Example 5, the subject matter of Examples 1-4 may optionally include that the instructions are executable by the processor to, prior to a receipt of the request: determine a plurality of native refresh rates of the display device; determine a plurality of expanded refresh rates, wherein each expanded refresh can be divided into a native refresh rate by an integer value without a remainder; and indicate, to the operating system, that the plurality of expanded refresh rates is supported by the display device.

In Example 6, the subject matter of Examples 1-5 may optionally include that the instructions are executable by the processor to: in response to a flip command, queue a delayed flip command for the display hardware; and prior to a next emulated interrupt, de-queue and execute the delayed flip command.

In Example 7, the subject matter of Examples 1-6 may optionally include that each of the plurality of emulated interrupts is a Vertical Blanking Interval (VBI) interrupt.

In Example 8, the subject matter of Examples 1-7 may optionally include that the display hardware includes a display engine of the processor, where the display engine generates the plurality of interrupts.

In Example 9, a method for using expanded refresh rates includes: receiving, by a graphics driver, a request for a first refresh rate that is not supported by a display monitor; determining, by the graphics driver, a second refresh rate that is supported by the display monitor; masking, by the graphics driver, a plurality of interrupts generated by display hardware at the second refresh rate; generating a plurality of emulated interrupts at the requested first refresh rate; and providing the plurality of emulated interrupts to an operating system in place of the masked interrupts.

In Example 10, the subject matter of Example 9 may optionally include: programming a timer to generate the plurality of emulated interrupts at the requested first refresh rate; and initiating the display device at the determined second refresh rate.

In Example 11, the subject matter of Examples 9-10 may optionally include that the timer is an Advanced Programmable Interrupt Controller (APIC) timer included in the processor.

In Example 12, the subject matter of Examples 9-11 may optionally include, prior to a receipt of the request: determining a plurality of native refresh rates of the display monitor, where the second refresh rate is included in the plurality of native refresh rates; determining a plurality of expanded refresh rates that is not supported by the display monitor, where the first refresh rate is included in the plurality of expanded refresh rates, where each expanded refresh can be divided into a native refresh rate by an integer value without a remainder; and notifying the operating system that the plurality of expanded refresh rates is supported by the display monitor.

In Example 13, the subject matter of Examples 9-12 may optionally include: receiving a flip command; in response to a receipt of the flip command, queuing a delayed flip command for the display hardware; and prior to a next emulated interrupt, de-queuing and executing the delayed flip command.

In Example 14, the subject matter of Examples 9-13 may optionally include: detecting a video file to be displayed on the display monitor; determining, based on metadata of the video file, a frame rate associated with the video file; and generating the request for the first refresh rate based on the determined frame rate.

In Example 15, the subject matter of Examples 9-14 may optionally include that the plurality of interrupts is generated by a display engine of a processor executing the graphics driver.

In Example 16, a computing device for using expanded refresh rates includes one or more processors; and a memory having stored therein a plurality of instructions that when executed by the one or more processors, cause the computing device to perform the method of any of Examples 9-15.

In Example 17, at least one machine-readable medium having stored thereon data which, if used by at least one machine, causes the at least one machine to perform the method of any of Examples 9-15.

In Example 18, an electronic device comprising means for performing the method of any of Examples 9-15.

In Example 19, an article may include a non-transitory machine-readable storage medium storing instructions for using expanded refresh rates that upon execution cause a processor to: receive a request for a first refresh rate that is not supported by a display device; in response to the received request, determine a second refresh rate that is supported by the display device; mask interrupts generated by display hardware at the second refresh rate; and provide, at the requested first refresh rate, emulated interrupts to an operating system in place of the masked interrupts generated by the display hardware.

In Example 20, the subject matter of Example 19 may optionally include instructions executable by the processor to: program a timer of the processor to generate the emulated interrupts at the requested first refresh rate; and initiate the display device at the determined second refresh rate.

In Example 21, the subject matter of Examples 19-20 may optionally include instructions executable by the processor to: determine a plurality of native refresh rates of the display device, wherein the second refresh rate is included in the plurality of native refresh rates; determine a plurality of expanded refresh rates that is not supported by the display device, wherein the first refresh rate is included in the plurality of expanded refresh rates; and notify the operating system that the plurality of expanded refresh rates is supported by the display device.

In Example 22, the subject matter of Examples 19-21 may optionally include instructions executable by the processor to: in response to a receipt of a flip command, queue a delayed flip command for the display hardware; and prior to a next emulated interrupt, de-queue and execute the delayed flip command.

In Example 23, the subject matter of Examples 19-22 may optionally include that the interrupts generated by the display hardware are Vertical Blanking Interval (VBI) interrupts.

In Example 24, an apparatus for using expanded refresh rates includes: means for receiving a request for a first refresh rate that is not supported by a display monitor; means for determining a second refresh rate that is supported by the display monitor; means for masking a plurality of interrupts generated by display hardware at the second refresh rate; means for generating a plurality of emulated interrupts at the requested first refresh rate; and means for providing the plurality of emulated interrupts to an operating system in place of the masked interrupts.

In Example 25, the subject matter of Example 24 may optionally include: means for generating the plurality of emulated interrupts at the requested first refresh rate; and means for initiating the display device at the determined second refresh rate.

In Example 26, the subject matter of Examples 24-25 may optionally include means for, prior to a receipt of the request, determining a plurality of native refresh rates of the display monitor, wherein the second refresh rate is included in the plurality of native refresh rates; means for determining a plurality of expanded refresh rates that is not supported by the display monitor, wherein the first refresh rate is included in the plurality of expanded refresh rates, wherein each expanded refresh can be divided into a native refresh rate by an integer value without a remainder; and means for notifying the operating system that the plurality of expanded refresh rates is supported by the display monitor.

In Example 27, the subject matter of Examples 24-26 may optionally include: means for receiving a flip command; means for, in response to a receipt of the flip command, queuing a delayed flip command for the display hardware; and means for, prior to a next emulated interrupt, de-queuing and executing the delayed flip command.

In Example 28, the subject matter of Examples 24-27 may optionally include: means for detecting a video file to be displayed on the display monitor; means for determining, based on metadata of the video file, a frame rate associated with the video file; and means for generating the request for the first refresh rate based on the determined frame rate.

In Example 29, the subject matter of Examples 24-28 may optionally include that the plurality of interrupts is generated by a display engine of a processor.

In accordance with one or more embodiments, video content may be displayed using expanded refresh rates that are not natively supported by a display device. In some embodiments, interrupts generated by display hardware may be masked, and emulated interrupts may be generated at the expanded refresh rate. As such, an operating system does not need to perform operations to present additional frames to match a native refresh rate. Accordingly, some embodiments may provide reduced power consumption of the computing device.

Note that, while FIGS. 26-31 illustrate various example implementations, other variations are possible. For example, it is contemplated that one or more embodiments may be implemented using some or all of the example devices and systems described with reference to FIGS. 1-25. Note that the examples shown in FIGS. 1-31 are provided for the sake of illustration, and are not intended to limit any embodiments. Specifically, while embodiments may be shown in simplified form for the sake of clarity, embodiments may include any number and/or arrangement of processors, cores, and/or additional components (e.g., buses, storage media, connectors, power components, buffers, interfaces, etc.). For example, it is contemplated that some embodiments may include any number of components in addition to those shown, and that different arrangement of the components shown may occur in certain implementations. Furthermore, it is contemplated that specifics in the examples shown in FIGS. 1-31 may be used anywhere in one or more embodiments.

Understand that various combinations of the above examples are possible. Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A computing device comprising:
a processor; and
a machine-readable storage medium storing instructions, the instructions executable by the hardware processor to:
receive a request for an expanded refresh rate that is not supported by a display device;
in response to the received request, determine a native refresh rate that is supported by a display device;
mask a plurality of interrupts generated by display hardware at the determined native refresh rate; and
send, at the requested expanded refresh rate, a plurality of emulated interrupts to an operating system in place of the masked plurality of interrupts generated by the display hardware.

2. The computing device of claim 1, wherein the request is generated by the operating system, and the request is received by a graphics driver.

3. The computing device of claim 1, the instructions executable by the processor to:
program a timer of the hardware processor to generate the plurality of emulated interrupts at the requested expanded refresh rate; and
initiate the display device at the determined native refresh rate.

4. The computing device of claim 1, wherein the request for the expanded refresh rate is associated with video content to be displayed on the display device.

5. The computing device of claim 1, the instructions executable by the processor to, prior to a receipt of the request:
determine a plurality of native refresh rates of the display device;
determine a plurality of expanded refresh rates, wherein each expanded refresh can be divided into a native refresh rate by an integer value without a remainder; and
indicate, to the operating system, that the plurality of expanded refresh rates is supported by the display device.

6. The computing device of claim 1, the instructions executable by the processor to:
in response to a flip command, queue a delayed flip command for the display hardware; and
prior to a next emulated interrupt, de-queue and execute the delayed flip command.

7. The computing device of claim 1, wherein each of the plurality of emulated interrupts is a Vertical Blanking Interval (VBI) interrupt.

8. The computing device of claim 1, wherein the display hardware comprises a display engine of the processor, wherein the display engine generates the plurality of interrupts.

9. A method comprising:
receiving, by a graphics driver, a request for a first refresh rate that is not supported by a display monitor;
determining, by the graphics driver, a second refresh rate that is supported by the display monitor;
masking, by the graphics driver, a plurality of interrupts generated by display hardware at the second refresh rate;
generating a plurality of emulated interrupts at the requested first refresh rate; and
providing the plurality of emulated interrupts to an operating system in place of the masked interrupts.

10. The method of claim 9, comprising:
programming a timer to generate the plurality of emulated interrupts at the requested first refresh rate; and
initiating the display device at the determined second refresh rate.

11. The method of claim 10, wherein the timer is an Advanced Programmable Interrupt Controller (APIC) timer included in the processor.

12. The method of claim 9, comprising, prior to a receipt of the request:
determining a plurality of native refresh rates of the display monitor, wherein the second refresh rate is included in the plurality of native refresh rates;
determining a plurality of expanded refresh rates that is not supported by the display monitor, wherein the first refresh rate is included in the plurality of expanded refresh rates, wherein each expanded refresh can be divided into a native refresh rate by an integer value without a remainder; and
notifying the operating system that the plurality of expanded refresh rates is supported by the display monitor.

13. The method of claim 9, comprising:
receiving a flip command;
in response to a receipt of the flip command, queuing a delayed flip command for the display hardware; and
prior to a next emulated interrupt, de-queuing and executing the delayed flip command.

14. The method of claim 9, comprising:
detecting a video file to be displayed on the display monitor;
determining, based on metadata of the video file, a frame rate associated with the video file; and
generating the request for the first refresh rate based on the determined frame rate.

15. The method of claim 9, wherein the plurality of interrupts is generated by a display engine of a processor executing the graphics driver.

16. An article comprising a non-transitory machine-readable storage medium storing instructions that upon execution cause a processor to:
receive a request for a first refresh rate that is not supported by a display device;
in response to the received request, determine a second refresh rate that is supported by the display device;
mask interrupts generated by display hardware at the second refresh rate; and
provide, at the requested first refresh rate, emulated interrupts to an operating system in place of the masked interrupts generated by the display hardware.

17. The article of claim 16, the instructions executable by the processor to:
program a timer of the processor to generate the emulated interrupts at the requested first refresh rate; and
initiate the display device at the determined second refresh rate.

18. The article of claim 16, the instructions executable by the processor to:
determine a plurality of native refresh rates of the display device, wherein the second refresh rate is included in the plurality of native refresh rates;

determine a plurality of expanded refresh rates that is not supported by the display device, wherein the first refresh rate is included in the plurality of expanded refresh rates; and notify the operating system that the plurality of expanded refresh rates is supported by the display device.

19. The article of claim 16, the instructions executable by the processor to:

in response to a receipt of a flip command, queue a delayed flip command for the display hardware; and prior to a next emulated interrupt, de-queue and execute the delayed flip command.

20. The article of claim 16, wherein the interrupts generated by the display hardware are Vertical Blanking Interval (VBI) interrupts.

\* \* \* \* \*